United States Patent
Smith

(10) Patent No.: US 9,609,732 B2
(45) Date of Patent: *Mar. 28, 2017

(54) LASER-DRIVEN LIGHT SOURCE FOR GENERATING LIGHT FROM A PLASMA IN AN PRESSURIZED CHAMBER

(71) Applicant: Energetiq Technology, Inc., Woburn, MA (US)

(72) Inventor: Donald K. Smith, Newton, MA (US)

(73) Assignee: Energetiq Technology, Inc., Woburn, MA (US)

(\*) Notice: Subject to any disclaimer, the term of this patent is extended or adjusted under 35 U.S.C. 154(b) by 0 days.

This patent is subject to a terminal disclaimer.

(21) Appl. No.: 14/867,159

(22) Filed: Sep. 28, 2015

(65) Prior Publication Data
US 2016/0057845 A1     Feb. 25, 2016

Related U.S. Application Data

(63) Continuation of application No. 14/448,258, filed on Jul. 31, 2014, now Pat. No. 9,185,786, which is a
(Continued)

(51) Int. Cl.
*G02B 5/00*     (2006.01)
*H05G 2/00*     (2006.01)
(Continued)

(52) U.S. Cl.
CPC .............. *H05G 2/008* (2013.01); *B82Y 10/00* (2013.01); *G03F 7/70033* (2013.01); *G21K 5/00* (2013.01); *G21K 5/04* (2013.01); *H01J 61/16* (2013.01); *H01J 65/04* (2013.01); *H05B 41/382* (2013.01); *H05G 2/001* (2013.01); *H05G 2/003* (2013.01); *H05G 2/005* (2013.01); *Y02B 20/204* (2013.01); *Y10T 29/49002* (2015.01)

(58) Field of Classification Search
CPC ........... H05H 1/00; H05H 1/0025; H05H 1/24
USPC ....................................... 250/504 R
See application file for complete search history.

(56) References Cited

U.S. PATENT DOCUMENTS

| | | |
|---|---|---|
| 3,054,921 A | 9/1962 | Lye |
| 3,227,923 A | 1/1966 | Marrison |

(Continued)

FOREIGN PATENT DOCUMENTS

| | | |
|---|---|---|
| EP | 1083777 A9 | 3/2001 |
| EP | 2534672 | 6/2016 |

(Continued)

OTHER PUBLICATIONS

US 8,471,227, 06/2013, Kakizaki (withdrawn)
(Continued)

*Primary Examiner* — Jason McCormack
(74) *Attorney, Agent, or Firm* — Kurt Rauschenbach; Rauschenbach Patent Law Group, LLC

(57) ABSTRACT

An apparatus for producing light includes a chamber and an ignition source that ionizes a gas within the chamber. The apparatus also includes at least one laser that provides energy to the ionized gas within the chamber to produce a high brightness light. The laser can provide a substantially continuous amount of energy to the ionized gas to generate a substantially continuous high brightness light.

25 Claims, 39 Drawing Sheets

Related U.S. Application Data continuation of application No. 13/964,938, filed on Aug. 12, 2013, now Pat. No. 9,048,000, which is a continuation of application No. 13/024,027, filed on Feb. 9, 2011, now Pat. No. 8,525,138, which is a continuation of application No. 12/166,918, filed on Jul. 2, 2008, now Pat. No. 7,989,786, which is a continuation-in-part of application No. 11/695,348, filed on Apr. 2, 2007, now Pat. No. 7,786,455, which is a continuation-in-part of application No. 11/395,523, filed on Mar. 31, 2006, now Pat. No. 7,435,982.

(60) Provisional application No. 61/302,797, filed on Feb. 9, 2010.

(51) Int. Cl.
  *B82Y 10/00* (2011.01)
  *G03F 7/20* (2006.01)
  *H01J 61/16* (2006.01)
  *H01J 65/04* (2006.01)
  *H05B 41/38* (2006.01)
  *G21K 5/00* (2006.01)
  *G21K 5/04* (2006.01)

(56) References Cited

U.S. PATENT DOCUMENTS

| | | |
|---|---|---|
| 3,418,507 A | 12/1968 | Young |
| 3,427,564 A | 2/1969 | Okaya |
| 3,495,118 A | 2/1970 | Richter |
| 3,502,929 A | 3/1970 | Richter |
| 3,582,822 A | 6/1971 | Karney |
| 3,619,588 A | 11/1971 | Chambers |
| 3,636,395 A | 1/1972 | Banes, Jr. |
| 3,641,389 A | 2/1972 | Leidigh |
| 3,657,588 A | 4/1972 | McRae |
| 3,731,133 A | 5/1973 | McRae |
| 3,764,466 A | 10/1973 | Dawson |
| 3,808,496 A | 4/1974 | McRae |
| 3,826,996 A | 7/1974 | Jaegle et al. |
| 3,900,803 A | 8/1975 | Silfvast et al. |
| 3,911,318 A | 10/1975 | Spero |
| 3,949,258 A | 4/1976 | Soodak |
| 3,982,201 A | 9/1976 | Rosenkrantz et al. |
| 4,054,812 A | 10/1977 | Lessner |
| 4,063,803 A | 12/1977 | Wright |
| 4,088,966 A | 5/1978 | Samis |
| 4,152,625 A | 5/1979 | Conrad |
| 4,177,435 A | 12/1979 | Brown |
| 4,179,037 A | 12/1979 | Chan |
| 4,179,566 A | 12/1979 | Nadelson |
| 4,263,095 A | 4/1981 | Thode |
| 4,272,681 A | 6/1981 | Fill |
| 4,485,333 A | 11/1984 | Goldbert |
| 4,498,029 A | 2/1985 | Yoshizawa et al. |
| 4,536,640 A | 8/1985 | Vukanovic |
| 4,599,540 A | 7/1986 | Roberts |
| 4,633,128 A | 12/1986 | Roberts |
| 4,646,215 A | 2/1987 | Levin et al. |
| 4,702,716 A | 10/1987 | Roberts |
| 4,724,352 A | 2/1988 | Schuda |
| RE32,626 E | 3/1988 | Yoshizawa et al. |
| 4,780,608 A * | 10/1988 | Cross .............. G21B 1/23 250/281 |
| 4,785,216 A | 11/1988 | Roberts |
| 4,789,788 A | 12/1988 | Cox |
| 4,866,517 A | 9/1989 | Mohizuki |
| 4,868,458 A | 9/1989 | Davenport et al. |
| 4,872,189 A | 10/1989 | Frankel |
| 4,889,605 A | 12/1989 | Asmus |
| 4,901,330 A | 2/1990 | Wolfram et al. |
| 4,978,893 A | 12/1990 | Brannon |
| 5,052,780 A | 10/1991 | Klein |
| 5,153,673 A | 10/1992 | Amirav |
| 5,299,279 A | 3/1994 | Roberts |
| 5,317,618 A | 5/1994 | Nakahara |
| 5,334,913 A | 8/1994 | Ury et al. |
| 5,359,621 A | 10/1994 | Tsunoda |
| 5,418,420 A | 5/1995 | Roberts |
| 5,442,184 A | 8/1995 | Palmer et al. |
| 5,506,857 A | 4/1996 | Meinzer |
| 5,508,934 A | 4/1996 | Moslehi |
| 5,561,338 A | 10/1996 | Roberts |
| 5,672,931 A | 9/1997 | Kiss |
| 5,686,996 A | 11/1997 | Fidler et al. |
| 5,789,863 A | 8/1998 | Takahashi |
| 5,790,575 A | 8/1998 | Zamel |
| 5,801,495 A | 9/1998 | Smolka et al. |
| 5,903,088 A | 5/1999 | Sugitani |
| 5,905,268 A | 5/1999 | Garcia |
| 5,923,116 A | 7/1999 | Mercer |
| 5,940,182 A | 8/1999 | Lepper |
| 6,005,332 A | 12/1999 | Mercer |
| 6,025,916 A | 2/2000 | Quick |
| 6,061,379 A | 5/2000 | Schoen |
| 6,074,516 A | 6/2000 | Howald |
| 6,108,091 A | 8/2000 | Pecen |
| 6,129,807 A | 10/2000 | Grimbergen |
| 6,181,053 B1 | 1/2001 | Roberts |
| 6,184,517 B1 | 2/2001 | Sawada et al. |
| 6,200,005 B1 | 3/2001 | Roberts |
| 6,212,989 B1 | 4/2001 | Beyer |
| 6,236,147 B1 | 5/2001 | Capobianco |
| 6,265,813 B1 | 7/2001 | Knox |
| 6,274,970 B1 | 8/2001 | Capobianco |
| 6,275,565 B1 | 8/2001 | Tomie |
| 6,281,629 B1 | 8/2001 | Tanaka |
| 6,285,131 B1 | 9/2001 | Kiss |
| 6,288,780 B1 | 9/2001 | Fairley et al. |
| 6,316,867 B1 | 11/2001 | Roberts |
| 6,331,993 B1 | 12/2001 | Brown |
| 6,339,279 B1 | 1/2002 | Miyamoto |
| 6,339,280 B1 | 1/2002 | Miyamoto |
| 6,351,058 B1 | 2/2002 | Roberts |
| 6,374,012 B1 | 4/2002 | Bergmann et al. |
| 6,400,067 B1 | 6/2002 | Manning |
| 6,400,089 B1 | 6/2002 | Salvermoser |
| 6,414,436 B1 | 7/2002 | Eastlund |
| 6,417,625 B1 | 7/2002 | Brooks et al. |
| 6,445,134 B1 | 9/2002 | Asmus |
| 6,493,364 B1 | 12/2002 | Baumler et al. |
| 6,504,319 B2 | 1/2003 | Herter |
| 6,504,903 B1 | 1/2003 | Kondo |
| 6,532,100 B1 | 3/2003 | Partanen |
| 6,541,924 B1 | 4/2003 | Kane et al. |
| 6,597,087 B2 | 7/2003 | Roberts |
| 6,602,104 B1 | 8/2003 | Roberts |
| 6,670,758 B2 | 12/2003 | Beech |
| 6,737,809 B2 | 5/2004 | Espiau |
| 6,762,849 B1 | 7/2004 | Rulkens |
| 6,768,264 B2 | 7/2004 | Beech |
| 6,788,404 B2 | 9/2004 | Lange |
| 6,816,323 B2 | 11/2004 | Colin et al. |
| 6,821,377 B2 | 11/2004 | Saito |
| 6,834,984 B2 | 12/2004 | Tausch |
| 6,865,255 B2 | 3/2005 | Richardson |
| 6,867,419 B2 | 3/2005 | Tajima |
| 6,914,919 B2 | 7/2005 | Watson |
| 6,956,329 B2 | 10/2005 | Brooks et al. |
| 6,956,885 B2 | 10/2005 | Taylor |
| 6,970,492 B2 | 11/2005 | Govorkov |
| 6,972,421 B2 | 12/2005 | Melnychuk et al. |
| 7,050,149 B2 | 5/2006 | Owa et al. |
| 7,072,367 B2 | 7/2006 | Arisawa |
| 7,087,914 B2 | 8/2006 | Akins et al. |
| 7,158,221 B2 | 1/2007 | Davis |
| 7,164,144 B2 | 1/2007 | Partlo et al. |
| 7,176,633 B1 | 2/2007 | Roberts |
| 7,274,435 B2 | 9/2007 | Hiura |
| 7,307,375 B2 | 12/2007 | Smith et al. |
| 7,368,741 B2 | 5/2008 | Melnychuk et al. |
| 7,399,981 B2 | 7/2008 | Cheymol et al. |

(56) References Cited

U.S. PATENT DOCUMENTS

| | | |
|---|---|---|
| 7,427,167 B2 | 9/2008 | Holder et al. |
| 7,429,818 B2 | 9/2008 | Chang et al. |
| 7,435,982 B2 | 10/2008 | Smith |
| 7,439,497 B2 | 10/2008 | Dantus |
| 7,439,530 B2 | 10/2008 | Ershov |
| 7,456,417 B2 | 11/2008 | Murakami et al. |
| 7,567,607 B2 | 7/2009 | Knowles et al. |
| 7,598,509 B2 | 10/2009 | Ershov |
| 7,632,419 B1 | 12/2009 | Grimgergen |
| 7,652,430 B1 | 1/2010 | Delgado |
| 7,671,349 B2 | 3/2010 | Bykanov |
| 7,679,027 B2 | 3/2010 | Bogatu |
| 7,679,276 B2 | 3/2010 | Blondia |
| 7,680,158 B2 | 3/2010 | Endo |
| 7,705,331 B1 | 4/2010 | Kirk et al. |
| 7,773,656 B1 | 8/2010 | Mills |
| 7,786,455 B2 | 8/2010 | Smith |
| 7,795,816 B2 | 9/2010 | Jennings |
| 7,989,786 B2 | 8/2011 | Smith et al. |
| 8,148,900 B1 | 4/2012 | Kirk et al. |
| 8,242,671 B2 | 8/2012 | Blondia |
| 8,242,695 B2 | 8/2012 | Sumitomo |
| 8,253,926 B2 | 8/2012 | Sumitomo |
| 8,309,943 B2 | 11/2012 | Smith |
| 8,320,424 B2 | 11/2012 | Bolt |
| 8,427,067 B2 | 4/2013 | Espiau |
| 8,525,138 B2 | 9/2013 | Smith et al. |
| 8,873,593 B2 | 10/2014 | Fermann |
| 8,969,841 B2 | 3/2015 | Smith |
| 9,048,000 B2 * | 6/2015 | Smith .................... B82Y 10/00 |
| 9,185,786 B2 | 11/2015 | Smith |
| 2001/0035720 A1 | 11/2001 | Guthrie |
| 2002/0021508 A1 | 2/2002 | Ishihara |
| 2002/0036820 A1 | 3/2002 | Merriam |
| 2002/0044629 A1 | 4/2002 | Hertz et al. |
| 2002/0080834 A1 | 6/2002 | Kusunose |
| 2002/0172235 A1 | 11/2002 | Chang et al. |
| 2003/0006383 A1 | 1/2003 | Melnychuk |
| 2003/0034736 A1 | 2/2003 | Eastlund |
| 2003/0052609 A1 | 3/2003 | Eastlund et al. |
| 2003/0068012 A1 | 4/2003 | Ahmad et al. |
| 2003/0090902 A1 | 5/2003 | Kavanagh |
| 2003/0147499 A1 | 8/2003 | Kondo |
| 2003/0168982 A1 | 9/2003 | Kim |
| 2003/0193281 A1 | 10/2003 | Manning |
| 2003/0231496 A1 | 12/2003 | Sato et al. |
| 2004/0008433 A1 | 1/2004 | Margeson |
| 2004/0016894 A1 | 1/2004 | Wester et al. |
| 2004/0018647 A1 | 1/2004 | Jones |
| 2004/0026512 A1 | 2/2004 | Otsubo et al. |
| 2004/0084406 A1 | 5/2004 | Kamp |
| 2004/0108473 A1 | 6/2004 | Melnychuk |
| 2004/0129896 A1 | 7/2004 | Schmidt et al. |
| 2004/0134426 A1 | 7/2004 | Tomoyasu |
| 2004/0183031 A1 | 9/2004 | Silverman |
| 2004/0183038 A1 | 9/2004 | Hiramoto et al. |
| 2004/0238762 A1 | 12/2004 | Mizoguchi et al. |
| 2004/0239894 A1 | 12/2004 | Shimada |
| 2004/0264512 A1 | 12/2004 | Hartlove et al. |
| 2005/0057158 A1 | 3/2005 | Chang et al. |
| 2005/0167618 A1 | 8/2005 | Hoshino et al. |
| 2005/0168148 A1 | 8/2005 | Allen |
| 2005/0199829 A1 | 9/2005 | Partlo et al. |
| 2005/0205803 A1 | 9/2005 | Mizoguchi |
| 2005/0205811 A1 | 9/2005 | Partlo et al. |
| 2005/0207454 A1 | 9/2005 | Starodoumov |
| 2005/0225739 A1 | 10/2005 | Hiura |
| 2005/0243390 A1 | 11/2005 | Tejnil |
| 2006/0039435 A1 | 2/2006 | Cheymol et al. |
| 2006/0078017 A1 | 4/2006 | Endo et al. |
| 2006/0131515 A1 | 6/2006 | Partlo et al. |
| 2006/0152128 A1 * | 7/2006 | Manning ............... H01J 61/025 313/113 |
| 2006/0176925 A1 | 8/2006 | Nakano |
| 2006/0186356 A1 | 8/2006 | Imai et al. |
| 2006/0192152 A1 | 8/2006 | Ershov et al. |
| 2006/0202625 A1 | 9/2006 | Song |
| 2006/0215712 A1 | 9/2006 | Ziener |
| 2006/0219957 A1 | 10/2006 | Ershov et al. |
| 2006/0255298 A1 | 11/2006 | Bykanov |
| 2007/0001131 A1 | 1/2007 | Ershov |
| 2007/0228288 A1 | 10/2007 | Smith |
| 2007/0228300 A1 | 10/2007 | Smith |
| 2007/0285921 A1 | 12/2007 | Zulim et al. |
| 2008/0048133 A1 | 2/2008 | Bykanov |
| 2008/0055712 A1 | 3/2008 | Noelscher |
| 2008/0059096 A1 | 3/2008 | Stenstrom |
| 2009/0032740 A1 | 2/2009 | Smith et al. |
| 2009/0196801 A1 | 8/2009 | Mills |
| 2009/0267003 A1 | 10/2009 | Moriya |
| 2009/0314967 A1 | 12/2009 | Moriya |
| 2010/0164380 A1 | 7/2010 | Sumitomo |
| 2010/0181503 A1 | 7/2010 | Yanagida |
| 2010/0264820 A1 | 10/2010 | Sumitomo |
| 2011/0181191 A1 | 7/2011 | Smith |
| 2011/0204265 A1 | 8/2011 | Smith |
| 2011/0291566 A1 | 12/2011 | Bezel |
| 2014/0117258 A1 | 5/2014 | Smith |

FOREIGN PATENT DOCUMENTS

| | | |
|---|---|---|
| FR | 2554302 A1 | 5/1985 |
| GB | 2266406 A | 10/1993 |
| JP | 61 193358 | 8/1986 |
| JP | 1-296560 | 11/1989 |
| JP | 04-144053 | 5/1992 |
| JP | 05-82087 | 4/1993 |
| JP | 06243845 A | 9/1994 |
| JP | 08-299951 | 11/1996 |
| JP | 09-288995 | 11/1997 |
| JP | 2003-317675 | 11/2003 |
| JP | 2003317675 A | 11/2003 |
| JP | 2004134166 A | 4/2004 |
| JP | 2006-10675 | 1/2006 |
| JP | 2006010675 A | 1/2006 |
| JP | 2006-080255 | 3/2006 |
| JP | 2010087388 A | 4/2010 |
| JP | 2010171159 A | 8/2010 |
| KR | 20050003392 | 9/2006 |
| WO | 94/10729 A1 | 5/1994 |
| WO | 98/11388 A1 | 3/1998 |
| WO | 98/54611 A2 | 12/1998 |
| WO | 99/18594 A1 | 4/1999 |
| WO | 02/087291 A2 | 10/2002 |
| WO | 03/079391 A2 | 9/2003 |
| WO | 2004023061 A1 | 3/2004 |
| WO | 2004084592 A2 | 9/2004 |
| WO | 2004097520 | 11/2004 |
| WO | 2004097520 A2 | 11/2004 |
| WO | 2005004555 A1 | 1/2005 |
| WO | 2007002170 A2 | 1/2007 |
| WO | 2010/093903 | 8/2010 |
| WO | 2010093903 A2 | 8/2010 |

OTHER PUBLICATIONS

Petition for Inter Partes Review of U.S. Pat. No. 8,969,841 Claims 10, 13 and 14, Nov. 4, 2015, 66 pages and accompanying exhibits 1101-1128.

Mandatory Notices of Patent Owner Pursuant to 37 C.F.R. §42. 8(a)(2) for U.S. Pat. No. 8,969,841, Nov. 11, 2015, 6 pages.

Notice of filing Date Accorded to Petition and Time for Filing Patent Owner Preliminary Response for U.S. Pat. No. 8,969,841, Nov. 18, 2015, 3 pages.

Notice of filing Date Accorded to Petition and Time for Filing Patent Owner Preliminary Response for U.S. Pat. No. 8,309,943, Jun. 12, 2015, 3 pages.

Mandatory Notices of Patent Owner Pursuant to 37 C.F.R. §42. 8(a)(2) for U.S. Pat. No. 8,309,943, Jun. 17, 2015, 6 pages.

Errata for U.S. Pat. Nos. 8,309,943, 7,786,455 and 7,435,982, Jul. 8, 2015, 2 pages.

(56) References Cited

OTHER PUBLICATIONS

Energetiq Technology, Inc.'s Motion for Pro Hav Vice Admission of Safraz W. Ishmael, for U.S. Pat. No. 8,309,943, Jul. 9, 2015, 5 pages.
Order Granting Patent Owner's Motion for Admission Pro Hav Vice of Safraz W. Ishmael for U.S. Pat. Nos. 8,309,943, 7,786,455, 7,435,982, 8,969,841, 8,525,138, 9,048,000, Sep. 21, 2015, 4 pages.
Patent Owner's Updated Mandatory Notice Pursuant to 37 C.F.R. 42.8, for U.S. Pat. No. 8,309,943, Nov. 12, 2015, 4 pages.
Decision for U.S. Pat. No. 8,309,943, Nov. 30, 2015, 15 pages.
Scheduling Order for U.S. Pat. Nos. 8,309,943, 7,786,455, 7,435,982, 8,969,841, 8,525,138, 9,048,000, Nov. 30, 2015, 8 Pages.
Patent Owner's Objection to Evidence Pursuant to 37 C.F.R. §42.64(b)(1) for U.S. Pat. No. 8,309,943, Dec. 14, 2015, 6 pages.
Notice of filing Date Accorded to Petition and Time for Filing Patent Owner Preliminary Response for U.S. Pat. No. 8,969,841, Jun. 19, 2015, 3 pages.
Mandatory Notices of Patent Owner Pursuant to 37 C.F.R. §42.8(a)(2) for U.S. Pat. No. 8,969,841, Jun. 24, 2015, 6 pages.
Energetiq Technology, Inc.'s Motion for Pro Hav Vice Admission of Safraz W. Ishmael, for U.S. Pat. No. 8,969,841, Jul. 9, 2015, 5 pages.
Patent Owner's Preliminary Response Under 37 C.F.R. 42.107 for U.S. Pat. No. 8,969,841, Sep. 21, 2015, 63 pages.
Patent Owner's Updated Mandatory Notice Pursuant to 37 C.F.R. 42.8, for U.S. Pat. No. 8,969,841, Nov. 12, 2015, 4 pages.
Decision for U.S. Pat. No. 8,969,841, Nov. 30, 2015, 19 pages.
Patent Owner's Objection to Evidence Pursuant to 37 C.F.R. §42.64(b)(1) for U.S. Pat. No. 8,969,841, Dec. 14, 2015, 8 pages.
Petition for Inter Partes Review of U.S. Pat. No. 7,435,982 Claims 23 and 60, Jun. 12, 2015, 66 pages.
Notice of filing date Accorded to Petition and Time for Filing Patent Owner Preliminary Response for U.S. Pat. No. 7,435,892, Jun. 19, 2015, 3 pages.
Mandatory Notices of Patent Owner Pursuant to 37 C.F.R. §42.8(a)(2) for U.S. Pat. No. 7,435,982, Jun. 24, 2015, 6 pages.
Energetiq Technology, Inc.'s Motion for Pro Hav Vice Admission of Safraz W. Ishmael, for U.S. Pat. No. 7,435,982, Jul. 9, 2015, 5 pages.
Order Granting Patent Owner's for Admission Pro Hac Vice of Safraz W. Ishmael 37 C.F.R. §42.10, for U.S. Pat. No. 7,435,982, Sep. 21, 2015, 4 pages.
Patent Owner's Updated Mandatory Notice Pursuant to 37 C.F.R. 42.8, for U.S. Pat. No. 7,435,982 Nov. 12, 2015, 4 pages.
Decision for U.S. Pat. No. 7,435,982, Nov. 30, 2015, 12 pages.
Patent Owner's Objection to Evidence Pursuant to 37 C.F.R. §42.64(b)(1) for U.S. Pat. No. 7,435,982, Dec. 14, 2015, 9 pages.
Mandatory Notices of Patent Owner Pursuant to 37 C.F.R. §42.8(a)(2) for U.S. Pat. No. 8,525,138, Jun. 24, 2015, 6 pages.
Notice of filing Date Accorded to Petition and Time for Filing Patent Owner Preliminary Response for U.S. Pat. No. 8,525,138, Jul. 1, 2015, 3 pages.
Energetiq Technology, Inc.'s Motion for Pro Hav Vice Admission of Safraz W. Ishmael, for U.S. Pat. No. 8,525,138, Jul. 9, 2015, 5 pages.
Patent Owner's Updated Mandatory Notice Pursuant to 37 C.F.R. §42.8, for U.S. Pat. No. 8,525,138, Nov. 12, 2015, 4 pages.
Decision for U.S. Pat. No. 8,525,138, Nov. 30, 2015, 12 pages.
Patent Owner's Objection to Evidence Pursuant to 37 C.F.R. §42.64(b)(1) for U.S. Pat. No. 8,525,138, Dec. 14, 2015, 9 pages.
"Office Action" for Korean Patent Application No. 10-2015-7020571, Nov. 9, 2015, 5 pages, Korean Intellectual Property Office, South Korea.
"Office Action" for Korean Patent Application No. 10-2013-7030553, Dec. 24, 2015, 3 pages, Korean Intellectual Property Office, South Korea.
"Notice of Decision to Decline Amendment" for Korean Patent Application No. 10-2013-7030553, Dec. 24, 2015, 1 page, Korean Intellectual Property Office, South Korea.

"Office Action" for Geman Patent Application No. 11-2007-000-821.0, 9 pages, Jun. 8, 2015, German Patent and Trademark Office, Germany.
Notice of filing Date Accorded to Petition and Time for Filing Patent Owner Preliminary Response for U.S. Pat. No. 7,435,892, Jun. 12, 2015, 3 pages.
Mandatory Notices of Patent Owner Pursuant to 37 C.F.R. §42.8(a)(2) for U.S. Pat. No. 7,435,982, Jun. 17, 2015, 6 pages.
Decision for U.S. Pat. No. 7,435,982, Nov. 30, 2015, 19 pages.
Patent Owner's Objection to Evidence Pursuant to 37 C.F.R. §42.64(b)(1) for U.S. Pat. No. 7,435,982, Dec. 14, 2015, 7 pages.
I.M. Beterov et al., Resonance radiation plasma (photoresonance plasma), Sov. Phys. Usp. 31 (6), pp. 535-554 (1988).
IPR2015-01277, Petition for Inter Partes Review of U.S. Pat. No. 8,309,943 and accompanying Exhibits 1001-1016, filed on May 29, 2015, 446 pages (submitted in 3 parts, part 1 (170 pages), part 2 (251 pages), and part 3 (25 pages)).
IPR2015-01279, Petition for Inter Partes Review of U.S. Pat. No. 7,786,455 and accompanying Exhibits 1001-1015, filed on May 29, 2015, 393 pages (Submitted in 2 parts, part 1 (290 pages) and part 2 (103 pages)).
IPR2015-01300, Petition for Inter Partes Review of U.S. Pat. No. 7,435,982 and accompanying Exhibits 1101-1114, filed on May 29, 2015, 364 pages (submitted in 2 parts, part 1 (250 pages) and part 2 (114 pages)).
IPR2015-01303, Petition for Inter Partes Review of U.S. Pat. No. 7,435,982 and accompanying Exhibits 1001-1014, filed on May 29, 2015, 348 pages (submitted in 2 parts, part 1 (240 pages) and part 2 (108 pages)).
IPR2015-01362, Petition for Inter Partes Review of U.S. Pat. No. 8,969,841 and accompanying Exhibits 1001-1025, filed on Jun. 12, 2015, 743 pages (submitted in 6 parts, part 1 (325 pages), part 2 (111 pages), part 3 (71 pages), part 4 (101 pages), part 5 (71 pages), and part 6 (64 pages)).
IPR2015-01368, Petition for Inter Partes Review of U.S. Pat. No. 8,525,138 and accompanying Exhibits 1001-1025, filed on Jun. 12, 2015, 720 pages (submitted in 4 parts, part 1 (285 pages), part 2 (71 pages), part 3 (301 pages), and part 4 (63 pages)).
IPR2015-01375, Petition for Inter Partes Review of U.S. Pat. No. 9,048,000 and accompanying Exhibits 1001-1028, filed on Jun. 12, 2015, 691 pages (submitted in 4 parts, part 1 (390 pages), part 2 (61 pages), part 3 (121 pages), and part 4 (119 pages)).
IPR2015-01377, Petition for Inter Partes Review of U.S. Pat. No. 7,435,982 and accompanying Exhibits 1201-1218, filed on Jun. 12, 2015, 511 pages (submitted in 3 parts, part 1 (330 pages), part 2 (151 pages), and part 3 (30 pages)).
Beck, "Simple Pulse Generator for Pulsing Xenon Arcs with High Repetition Rate," *Rev. Sci. Instrum.*, vol. 45, No. 2, Feb. 1974, pp. 318-319.
Bussiahn, R., et. al., "Experimental and theoretical investigations of a low-pressure He—Xe discharge for lighting purpose," Journal of Applied Physics, vol. 95, No. 9, May 1, 2004, pp. 4627-4634.
Carlhoff et al., "Continuous Optical Discharges at Very High Pressure," *Physica* 103C, 1981, pp. 439-447.
Cremers et al., "Evaluation of the Continuous Optical Discharge for Spectrochemical Analysis," *Spectrochimica Acta*. vol. 40B, No. 4, 1985, pp. 665-679.
Fiedorowicz et al., "X-Ray Emission form Laser-Irradiated Gas Puff Targets," *Appl. Phys. Lett.* 62 (22), May 31, 1993, pp. 2778-2780.
Franzen, "CW Gas Breakdown in Argon Using 10.6-µm Laser Radiation," *Appl. Phys. Lett.*, vol. 21, No. 2, Jul. 15, 1972, pp. 62-64.
Generalov et al., "Continuous Optical Discharge," *ZhETF Pis*. Red. 11, No. 9, May 5, 1970, pp. 302-304.
Generalov et al., "Experimental Investigation of a Continuous Optical Discharge," *Soviet Physics JETP*. vol. 34, No. 4, Apr. 1972, pp. 763-769.
Hamamatsu Product Information, "Super-Quiet Xenon Lamp Super-Quiet Mercury—Xenon Lamp," Nov. 2005. pp. 1-16.
Hecht, "Refraction", *Optics (Third Edition)*, 1998, Chapter 4, pp. 100-101.
Jeng et al., "Theoretical Investigation of Laser-Sustained Argon Plasmas," *J. Appl. Phys.* 60 (7), Oct. 1, 1986, pp. 2272-2279.

(56) References Cited

OTHER PUBLICATIONS

Keefer et al., "Experimental Study of a Stationary Laser-Sustained Air Plasma," *Journal of Applied Physics*. vol. 46, No. 3, Mar. 1975, pp. 1080-1083.
Keefer, "Laser-Sustained Plasmas," *Laser-Induced Plasmas and Applications*, published by Marcel Dekker, edited by Radziemski et al., 1989, pp. 169-206.
Kozlov et al., "Radiative Losses by Argon Plasma and the Emissive Model of a Continuous Optical Discharge," *Sov. Phys. JETP*. vol. 39, No. 3, Sep. 1974, pp. 463-468.
Kozlov et al., "Sustained Optical Discharges in Molecular Gases," *Sov. Phys. Tech. Phys*. 49(11), Nov. 1979, pp. 1283-1287.
Moody, "Maintenance of a Gas Breakdown in Argon Using 10.6-μ cw Radiation," *Journal of Applied Physics*. vol. 46, No. 6, Jun. 1975, pp. 2475-2482.
Nakr, "Radiometric Characterization of Ultrahigh Radiance Xenon Short-acr Dichage Lamps", *Applied Optics*, vol. 47, No. 2, Jan. 9, 2008, pp. 224-229.
Raĭzer, "Optical Discharges," *Sov. Phys. Usp*. 23(11), Nov. 1980, pp. 789-806.
Wilbers et al., "The Continuum Emission of an Arc Plasma," *J. Quant. Spectrosc. Radiat. Transfer*. vol. 45, No. 1, 1991, pp. 1-10.
Wilbers et al., "The VUV Emissivity of a High-Pressure Cascade Argon Arc from 125 to 200 nm," *J. Quant. Spectrosc. Radiat. Transfer*. vol. 46, 1991, pp. 299-308.
Patent Owner's Updated Mandatory Notice Pursuant to 37 C.F.R. 42.8, for U.S. Pat. No. 7,435,982 Nov. 12, 2015, 1 pages.
Petition for Inter Partes Review of U.S. Pat. No. 9,048,000 Claims 7-10, Nov. 4, 2015, 67 pages and accompanying exhibits 1101-1129.
Mandatory Notices of Patent Owner Pursuant to 37 C.F.R. §42.8(a)(2) for U.S. Pat. No. 9,048,000, Nov. 11, 2015, 6 pages.
1otice of filing Date Accorded to Petition and Time for Filing Patent Owner Preliminary Response for U.S. Pat. No. 9,048,000, Nov. 18, 2015, 3 pages.
Notice of filing Date Accorded to Petition and Time for Filing Patent Owner Preliminary Response for U.S. Pat. No. 7,786,455, Jun. 12, 2015, 3 pages.
Mandatory Notices of Patent Owner Pursuant to 37 C.F.R. §42.8(a)(2) for U.S. Pat. No. 7,786,455, Jun. 17, 2015, 6 pages.
Energetiq Technology, Inc.'s Motion for Pro Hav Vice Admission of Safraz W. Ishmael, for U.S. Pat. No. 7,786,455, Jul. 9, 2015, 5 pages.
Patent Owner's Updated Mandatory Notice Pursuant to 37 C.F.R. 42.8, for U.S. Pat. No. 7,786,455 Nov. 12, 2015, 4 pages.
Decision for U.S. Pat. No. 7,786,455, Nov. 30, 2015, 13 pages.
Patent Owner's Objection to Evidence Pursuant to 37 C.F.R. §42.64(b)(1) for U.S. Pat. No. 7,786,455, Dec. 14, 2015, 6 pages.
Redacted Expert Declaration of Caroline Ross, Ph.D., 46 pages (with Appendix), filed Mar. 10, 2015 in Civil Action No. 1:15-cv-10240-LTS (D. Mass.).
Second Declaration of Donald K. Smith, Ph.D. in Support of Energetiq's Reply Brief in Support of its Motion for Preliminary Injunction, pp. 1-30, filed Mar. 17, 2015 as Document 68 in Civil Action No. 1:15-cv-10240-LTS (D. Mass).
Mandatory Notice of Patent Owner Pursuant to 37 C.F.R. §42.8(a)(2) for U.S. Pat. No. 9,048,000, Jun. 24, 2015, 6 pages.
Notice of filing Date Accorded to Petition and Time for Filing Patent Owner Preliminary Response for U.S. Pat. No. 9,048,000, Jun. 30, 2015, 3 pages.
Energetiq Technology, Inc.'s Motion for Pro Hav Vice Admission of Safraz W. Ishmael, for U.S. Pat. No. 9,048,000, Jul. 9, 2015, 5 pages.
Patent Owner's Preliminary Response Under 37 C.F.R. §42.107, for U.S. Pat. No. 9,048,000, Sep. 30, 2015, 65 pages.
Decision Motion to File a Request for a Certificate of Correction 37 C.F.R. §§42.20 and 1.322(a) for U.S. Pat. No. 9,048,000, Oct. 14, 2015, 4 pages.
Patent Owner's Updated Mandatory Notice Pursuant to 37 C.F.R. §42.8, for U.S. Pat. No. 9,048,000, Nov. 12, 2015, 4 pages.

Decision Institution of Inter Partes Review 37 C.F.R. §§42.108 for U.S. Pat. No. 9,048,000, Nov. 30, 2015, 22 pages.
Patent Owner's Objection to Evidence Pursuant to 37 C.F.R. §42.64(b)(1) for U.S. Pat. No. 9,048,000, Dec. 14, 2015, 8 pages.
High End Systems, Inc., User Manual: Cyberlight, Cyberlight Cx, Cyberlight Sv (Version 2.0), (1996).
Pankert et al., EUV Sources for the Alpha-Tools, pp. 1-9 (2006).
Keiser et al., Studies of High-Repetition-Rate Laser Plasma EUV Sources from Droplet Targets, pp. 217-221 (2003).
Azuma et al., Debris from Tape-Target Irradiated with Pulsed YAG Laser, pp. 224-228 (2002).
Yamanaka, Inertial Confinement Fusion Research at ILE Osaka, pp. 1343-1349 (1985).
Hansson et al., Liquid-Xenon-Jet Laser-Plasma Source for EUV Lithography, pp. 1-8 (2001).
Rietdorf et al., Special Optical Elements, pp. 43-58 (2006).
Borghese et al., Time-Resolved Spectral and Spatial Description of Laser-Induced Breakdown in Air as a Pulsed, Bright, and Broadband Ultraviolet—Visible Light Source, pp. 3977-3983 (1998).
Bridges et al., Investigation of a Laser-Produced Plasma VUV Light Source, pp. 2208-2214 (1986).
University of Delaware, Imaging: Lenses and Curved Mirrors, pp. 24-29 (last visited Dec. 19, 2015).
ILX Lightwave Corporation, Instruction Manual: LDC-3722 Laser Diode Controller, pp. 1-1-4-33 (1990).
Cu-Nguyen et al., Tunable Hyperchromatic Lens System for Confocal Hyperspectral Sensing, pp. 27611-27621 (2013).
Kondow, Temperature Dependence of Lasing Wavelength in a GaInNAs Laser Diode, pp. 777-779 (2000).
Rockstroh et al., Spectroscopic Studies of Plasma During CW Laser Materials Interaction, pp. 917-922 (1987).
Millan et al., Dynamic Compensation of Chromatic Aberration in a Programmable Diffractive Lens, pp. 9103-9112 (2006).
Horn et al., Evaluation and Design of a Solid-State 193 nm OPO-Nd:YAG Laser Ablation System, pp. 1837-1846 (2003).
Al-Muhanna et al., High-Power (>10 W) Continuous-Wave Operation from 100-μm-Aperture 0.97-μmEemitting Al-Free Diode Lasers, pp. 1182-1184 (1998).
Zimakov, Continuous Optical Discharges Sustained by Near-IR Laser Radiation, pp. 1 (2015).
Bolshov et al., Investigation of the Dynamic of an Expanding Laser Plume by a Shadowgraphic Technique, pp. 324-331 (2008).
Geisler et al., Spectrometer System Using a Modular Echelle Spectrograph and a Laser-Driven Continuum Source for Simultaneous Multi-Element Determination by Graphite Furnace Absorption Spectrometry, pp. 11-16 (2015).
De Jong et al., A Pulsed Arc-Glow Hollow Cathode Lamp, pp. 179-190 (1974).
Lowe et al., Developments in Light Sources and Detectors for Atomic Absorption Spectroscopy, pp. 2031-2039 (1999) 2031-2039.
Cann, Light Sources in the 0.15-20-μ Spectral Range, pp. 1645-1661 (1969).
Aitoumeziane et al., Theoretical and Numerical Study of the Interaction of a Nanosecond Laser Pulse with a Copper Target for Laser-Induced Breakdown Spectroscopy Applications, pp. 53-61 (2014).
Breton et al., Vacuum-UV Radiation of Laser-Produced Plasmas, pp. 1225-1232 (1973).
Yoshizawa et al., Disk-shaped Vacuum Ultraviolet Light Source Driven by Microwave Discharge for Photoexcited Processes, pp. 1678-1680 (1991).
Mosier-Boss et al., Detection of Lead Derived from Automotive Scrap Residue Using a Direct Push Fiber-Optic Laser-Induced Breakdown Spectroscopy Metal Sensor, pp. 1445-1456 (2005).
Laufer et al., Effect of Temperature on the Vacuum Ultraviolet Transmittance of Lithium Fluoride, Calcium Fluoride, Barium Fluoride, and Sapphire, pp. 64-66 (1965).
Lawrence-Snyder et al., Laser-Induced Breakdown Spectroscopy of High-Pressure Bulk Aqueous Solutions, pp. 186-790 (2006).
Michel et al., Laser-Induced Breakdown Spectroscopy of Bulk Aqueous Solutions at Oceanic Pressures: Evaluation of Key Measurement Parameters, pp. 2507-2515 (2007).

(56) References Cited

OTHER PUBLICATIONS

Xu et al., Wavelength- and Time-Resolved Investigation of Laser-Induced Plasmas as a Continuum Source, pp. 1134-1139 (1993).
Derra et al., UHP Lamp Systems for Projection Applications, pp. 2995-3010 (2005).
Arp et al., Argon Mini-Arc Meets its Match: Use of a Laser-Driven Plasma Source in Ultraviolet-Detector Calibrations, pp. 1089-1093 (2014).
Wilbers, The VUV Emissivity of a High-Pressure Cascade Argon Arc from 125 to 200 nm, pp. 299-308 (1991).
Tanaka et al., Production of Laser-Heated Plasma in High-Pressure Ar Gas and Emission Characteristics of Vacuum Ultraviolet Radiation from Ar(2) Excimers, pp. 323-326 (2002).
Szymanski et al., Nonstationary Laser-Sustained Plasma, pp. 3480-3484 (1990).
Takahashi et al., Numerical Analysis of Ar(2) Excimer Production in Laser-Produced Plasmas, pp. 390-393 (1998).
Smith, Gas-Breakdown Dependence on Beam Size and Pulse Duration with 10.6-μ Wavelength Radiation, pp. 405-408 (1971).
Lewis et al., Measurements of CW Photoionization for the Use in Stable High Pressure Tea Laser Discharge, pp. 14-45 (1975).
Emmett et al., Direct Measurement of Xenon Flashtube Opacity, pp. 2601-2604 (1964).
Daily et al., Two-Photon Photoionization of the Ca 4s3d(1)D(2) Level in an Optical Dipole Trap, pp. 043406-1-D43406-5 (2005).
Harilal et al., Influence of Ambient Gas on the Temperature and Density of Laser Produced Carbon Plasma, pp. 167-169 (1998).
Wagner et al., Self-Compression of Ultrashort Pulses through Ionization-Induced Spatiotemporal Reshaping, pp. 173902-1-173902-4 (2004).
Mills et al., Argon-Hydrogen-Strontium Discharge Light Source, pp. 639-652 (2002).
Saloman, Energy Levels and Observed Spectral Lines of Xenon, Xe(I) through Xe(LIV), pp. 765-921 (2004).
Kim et al., Development of an In Situ Raman Spectroscopic System for Surface Oxide Films on Metals and Alloys in High Temperature Water, pp. 1029-1040 (2005).
Cooper, Spectroscopic Identification of Water-Oxygen and Water-Hydroxyl Complexes and their Importance to Icy Outer Solar System Bodies, pp. 1-116 (2004).
Norimatsu et al., Cryostat to Provide a Solid Deuterium Layer in a Plastic Shell for the Gekko XII Glass Laser System, pp. 3378-3383 (1992).
Carlhoff et al., High Pressure Optical Discharges, pp. 757-758 (1979).
Patel et al., The Suitability of Sapphire for Laser Windows, pp. 146-151 (1999).
Eckstrom et al., Microwave Interactions With Plasmas, pp. 1-9 with appendixes (1992).
Gentile et al., Oxidative Decontamination of Tritiated Materials Employing Ozone Gas, pp. 1-9 (2002).
Harris, A Century of Sapphire Crystal Growth Proceedings, pp. 1-56 (2004).
Vampola, P78-2 Engineering Overview pp. 1-36 (1981).
Lackner et al., The Optical Spark Plug: Window-related Issues, pp. 1-6 (2005).
Kopecek et al., Laser Ignition of Methane-Air Mixtures at High Pressures and Diagnostics, pp. 213-219 (2005).
Tooman, The Sandia Laser Plasma Extreme Ultraviolet and Soft X-ray (XUV) Light Source, pp. 186-191 (1986).
Arp et al., Feasibility of Generating a Useful Laser-Induced Breakdown Spectroscopy Plasma on Rocks at High Pressure: Preliminary Study for a Venus Mission, pp. 987-999 (2004).
Mosier-Boss et al., Field Demonstrations of a Direct Push FO-LIBS Metal Sensor, pp. 3968-3976 (2002).
Cedolin, Laser-Induced Fluorescence Diagnostics Of Xenon Plasmas, pp. 1-96 (1997).
Plyler et al., Precise Measurement of Wavelengths in Infrared Spectra, pp. 279-284 (1955).
Angel, LIBS Using Dual-Laser Pulses, p. 14 (2002).
Laufer, Introduction To Optics And Lasers In Engineering, pp. 449-454 (1996).
Kozlov, Radiative Losses by Argon Plasma and the Emissive Model of a Continuous Optical Discharge, pp. 463-468 (1974).
Mora, Theoretical Model of Absorption of Laser Light by a Plasma, pp. 1051-1056 (1982).
Huffman et al., Absorption Coefficients of Xenon and Argon in the 600-1025 Angstrom Wavelength Regions, pp. 902-909 (1963).
Klein, Measurements of Spectral Emission and Absorption of a High Pressure Xenon Arc in the Stationary and the Flashed Modes, pp. 677-685 (1968).
Winter et al., Experimental and Theoretical Investigations of a Helium-Xenon Discharge in Spot Mode, pp. 1979-1982 (2007).
Generalov, Continuous Optical Discharge, pp. 302-304 (1970).
Lo et al., Resonance-Enhanced LIBS, pp. 15-17 (2002).
Bridges, Characteristics of an Opto-Galvanic Effect in Cesium and Other Gas Discharge Plasmas, pp. 352-360 (1978).
Kranzusch et al., Spatial Characterization of Extreme Ultraviolet Plasmas Generated by Laser Excitation of Xenon Gas Targets, pp. 969-974 (2003).
Kaku et al., Vacuum Ultraviolet Transmission Spectroscopic System using a Laser-Produced Plasma pp. 149-152.
Measures, Electron Density and Temperature Elevation of a Potassium Seeded Plasma by Laser Resonance Pumping, pp. 107-125 (1970).
Mahmoud et al., Ion Formation in Laser-Irradiated Cesium Vapor, pp. 241-250 (2006).
Keefer, Laser-Sustained Plasmas, pp. 169-206 (1989).
Cremers, Evaluation of the Continuous Optical Discharge for Spectrochemical Analysis, pp. 665-679 (1985).
Li et al., Density measurements of a high-density pulsed gas jet for laser-plasma interaction studies, pp. 1197-1201 (1994).
Kindel et al., Measurement of Excited States Density and the VUV-Radiation in the Pulsed Xenon Medium Pressure Discharge, pp. 711-721 (1996).
Jinno et al., Luminance and efficacy improvement of low-pressure xenon pulsed fluorescent lamps by using an auxiliary external electrode, pp. 3889-3895 (2007).
Cesar et al., High-power fibre lasers, pp. 861-867 (2013).
Kozlov, Sustained Optical Discharges in Molecular Gases, pp. 1283-1287 (1979).
Hecht, Refraction, pp. 100-101 (1998).
Nakr, Radiometric Characterization of Ultrahigh Radiance Xenon Short-acr Dichage Lamps, pp. 224-229 (2008).
Keefer, Experimental Study of a Laser-Sustained Air Plasma, pp. 1080-1083 (1975).
Durfee III et al., Development of a Plasma Waveguide for High-Intensity Laser Pulses, pp. 2368-2389 (1995).
Kubiak et al., Scale-up of a Cluster Jet Laser Plasma Source for Extreme Ultraviolet Lithography, pp. 669-678 (1999).
Koch et al., Sodium Plasmas Produced by Milliwatt cw Laser Irradiation, p. 627 (1980).
Digonnet, Rare-Earth-Doped Fiber Lasers and Amplifiers, pp. 144-170 (2001).
Wei, Transparent Ceramic Lamp Envelope Materials, pp. 3057-3065 (2005).
Yamakoshi et al., Extreme-Ultraviolet Laser Photo-Pumped by a Self-Healing Hg Target, pp. 227-231 (1994).
Hansson, Laser-Plasma Sources for Extreme-Ultraviolet Chaps. 5 & 6, pp. 1-58 (2003).
Tsuboi et al., Nanosecond Imaging Study on Laser Ablation of Liquid Benzene, pp. 2745-2747 (1994).
Jansson et al., Liquid-Tin-Jet Laser-Plasma Extreme Ultraviolet Generation, pp. 2256-2258 (2004).
Aragón et al., Determination of Carbon Content in Molten Steel Using Laser-Induced Breakdown Spectroscopy, pp. 506-608 (1993).
Düsterer et al., Optimization of EUVRradiation Yield from Laser-Produced Plasma, pp. 693-698 (2001).
Bortz et al., Optical Reflectivity Measurements Using a Laser Plasma Light Source, pp. 1955-1957 (1989).
Baer, Plasma Diagnostics With Semiconductor Lasers Using Fluorescence and Absorption Spectroscopy, pp. 1-194 (1993).

(56) References Cited

OTHER PUBLICATIONS

Richardson et al., High Conversion Efficiency Mass-Limited Sn-Based Laser Plasma Source for Extreme Ultraviolet Lithography, pp. 785-790 (2004).
Wieman et al., Using Diode Lasers for Atomic Physics, pp. 1-20 (1991).
Wroblewski et al., An Experimental Investigation of the Continuous Optical Discharge, pp. 733-734 (1979).
Shimada et al., Characterization of Extreme Ultraviolet Emission from Laser-Produced Spherical Tin Plasma Generated with Multiple Laser Beams, pp. 051501-1-051501-3 (2005).
Moody, Maintenance of a Gas Breakdown in Argon Using 10.6-µ cw Radiation, pp. 2475-2482 (1975).
Bogaerts et al., Gas Discharge Plasmas and their Applications, pp. 609-658 (2001).
Cross et al., High Kinetic Energy (1-10eV) Laser Sustained Neutral Atom Beam Source, pp. 658-662 (1986).
Raizer, Continuous Optical Discharge: Generation and Support of Dense Low-Temperature Plasma by Laser Irradiation, pp. 87-94 (1996).
Cu-Nguyen et al., Tunable Confocal Hyperspectral Imaging System, pp. 9-10 (2013).
Mazumder et al., Spectroscopic Studies of Plasma During CW Laser Gas Heating in Flowing Argon, pp. 4712-4718 (1987).
Diwakar et al., Role of Laser Pre-Pulse Wavelength and Inter-Pulse Delay on Signal Enhancement in Collinear Double-Pulse Laserlinduced Breakdown Spectroscopy, pp. 65-73 (2013).
Cedolin et al., Laser-Induced Fluorescence Measurements of Resonance Broadening in Xenon, pp. 335-342 (2006).
Legall et al., Spatial and Spectral Characterization of a Laser Produced Plasma Source for Extreme Ultraviolet Metrology, pp. 4981-4988 (2004).
Vukanovic et al., A New Type of D.C. Arc as Spectrochemical Light Source, pp. 33-36 (1974).
Frey et al., Excimer Excited by a Laser-Produced Plasma, pp. 1529-1535 (1989).
Feng et al., A stigmatic Ultraviolet-Visible Monochromator for Use with a High Brightness Laser Driven Plasma Light Source, pp. 1-6 (2013).
Sacchi, Laser-Induced Electric Breakdown in Water, pp. 337-345 (1991).
Su et al., Note: A Transient Absorption Spectrometer Using an Ultra Bright Laser-Driven Light Source, pp. 086106-1 -D86106-3 (2013).
Shaw et al., Preliminary Design of Laser-Induced Breakdown Spectroscopy for Proto-Material Plasma Exposure eXperiment, pp. 11D806-1-11D806-3 (2014).
Glangetas, New Design for a Microwave Discharge Lamp, pp. 390-391 (1980).
Johnson, Ultraviolet Emission Spectra of High-Pressure Rare Gases, pp. 1669-1674 (1970).
Bloch et al., Field Test of a Novel Microlaser-Based Probe for in Situ Fluorescence Sensing of Soil Contamination, pp. 1299-1304 (1998).
Jin et al., New Laser Plasma Source for Extreme-Ultraviolet, pp. 2256-2258 (1995).
Schohl et al., Absolute Detection of Metastable Rare Gas Atoms by a CW Laser Photoionization Method, pp. 25-39 (1991).
Pebler et al., Stabilizing the Radiant Flux of a Xenon Arc Lamp, pp. 4059-4061 (1981).
Wiehle et al., Dynamics of Strong-Field Above-Threshold Ionization of Argon: Comparison Between Experiment and Theory, pp. 063405-1-063405-7 (2003).
Barnes et al., Argon Arc Lamps, pp. 1947-1949 (1985).
Orth et al., High-Resolution Spectra of Laser Plasma Light Sources in the Normal Incidence XUV Region, pp. 2215-2217 (1986).
Malka et al., Channel Formation in Long Laser Pulse Interaction with a Helium Gas Jet, pp. 2979-2982 (1997).
Nikitin et al., Guiding of Intense Femtosecond Pulses in Preformed Plasma Channels, pp. 1787-1789 (1997).

Szymanski et al., Spectroscopic Study of a Supersonic Jet of Laser-Heated Argon Plasma, pp. 998-1006 (1997).
Krushelnick et al., Plasma Channel Formation and Guiding during High Intensity Short Pulse Laser Plasma Experiments, pp. 4047-4050 (1997).
Takahashi et al., Ar(2) Excimer Emission from a Laser-Heated Plasma in a High-Pressure Argon Gas, pp. 4115-4117 (2000).
Girard et al., Generating Conditions of a Laser-Sustained Argon Plasma Jet, pp. 1382-1393 (1993).
Franzen, Continuous Laser-Sustained Plasmas, pp. 1727-1732 (1973).
Babucke et al., On the Eenergy Balance in the Core of Electrode-Stabilized High-Pressure Mercury Discharges, pp. 1316-1321 (1991).
Franzen, CW Gas Breakdown in Argon Using 10.6-µm Laser Radiation, pp. 62-64 (1972).
Erskine et al., Measuring Opacity of Shock Generated Argon Plasmas, pp. 97-100 (1994).
Raizer, Laser-Induced Discharge Phenomena, pp. 1-366 (1977).
Cohn et al., Magnetic-Field-Dependent Breakdown of CO2-Laser-Produced Plasma, pp. 225-227 (1972).
Song et al., Mechanisms of Absorption in Pulsed Excimer Laser-Induced Plasma pp. 477-485 (1997).
Jaroszynski et al., Radiation Sources Based on Laser-Plasma Interactions, pp. 689-710 (2006).
Kom et al., Ultrashort 1-kHz Laser Plasma Hard X-ray Source, pp. 866-868 (2002).
Byer, Laser-Produced Plasmas: A Compact Soft X-Ray Source with High Peak Brightness, pp. 1-26 (1989).
Ball, Raman Spectroscopy, pp. 50-52 (2002).
Saraswat et al., Single Wafer Rapid Thermal Multiprocessing, pp. 3-13 (1989).
Joshi et al., Laser-Induced Breakdown Spectroscopy for In-Cylinder Equivalence Ratio Measurements in Laser-Ignited Natural Gas Engines, pp. 549-554 (2009).
Hawke et al., An Apparatus for High Pressure Raman Spectroscopy, pp. 1598-1601 (1974).
Jahier et al., Implementation of a Sapphire Cell with External Electrodes for Laser Excitation of a Forbidden Atomic Transition in a Pulsed E-Field, pp. 221-229 (2001).
Perry, Solar Thermal Propulsion: An Investigation of Solar Radiation Absorption in a Working Fluid, pp. 1-70 (1984).
Harris, Review Of Navy Program To Develop Optical Quality Diamond Windows And Domes, pp. 1-16 (2002).
Mills et al., Excessively Bright Hydrogen-Strontium Discharge Light Source Due to Energy Resonance of Strontium with Hydrogen, pp. 131-158 (2003).
Cooley et al., Fundamentals of Discharge Initiation in Gas-Fed Pulsed Plasma Thrusters, pp. 1-11 (2005).
Weinrotter et al., Laser Ignition of Engines, pp. 947-953 (2005).
Kopecek et al., Laser-Induced Ignition of Methane-Air Mixtures at Pressures up to 4 MPa, pp. 1365-1369 (2003).
Luo et al., Sapphire (0 0 0 1) Surface Modifications Induced by Long-Pulse 1054 nm Laser Irradiation, pp. 9457-9466 (2007).
Weinrotter et al., Application of Laser Ignition to Hydrogen-Air Mixtures at High Pressures, pp. 319-326 (2005).
Michel et al., Analysis of Laser-Induced Breakdown Spectroscopy Spectra: The Case for Extreme Value Statistics, pp. 1370-1378 (2007).
Theriault et al., A Real-Time Fiber-Optic LIBS Probe for the In Situ Delineation of Metals in Soils, pp. 117-125 (1998).
Ku et al., Decay of Krypton 1(s)(2) and 1(s)(3) Excited Species in the Late Afterglow, pp. 3123-3130 (1973).
Theriault et al., Field Deployment of a LIBS Probe for Rapid Delineation of Metals in Soils, pp. 83-88 (1996).
Tam, Quasiresonant Laser-Produced Plasma: An Efficient Mechanism for Localized Breakdown, pp. 4682-4687 (1980).
Demtröder, Laser Spectroscopy: Basic Concepts and Instrumentation, pp. 395-398 (1982).
Hu et aL, Laser Induced Stabilisation of the Welding Arc, pp. 76-81 (2005).

(56) References Cited

OTHER PUBLICATIONS

Stamm, Extreme Ultraviolet Light Sources for use in Semiconductor Lithography—State of the Art and Future Development, pp. 3244-3253 (2004).
Hughes, Plasmas And Laser Light, pp. 200-272 (1975).
Müller et al., Theoretical Model for a Continuous Optical Discharge, pp. 259-270 (1982).
Malik et al., Spectroscopic Measurements on Xenon Plasma in a Hollow Cathode, pp. 2037-2048 (2000).
Shigeyoshi et al., Near Infrared Absorptions of Neon, Argon, Krypton, and Xenon Excited Diatomic Molecules, pp. 4595-4603 (1978).
Rhemet, Xenon Lamps, pp. 190-195 (1980).
Bataller et al., Nanosecond High-Power Dense Microplasma Switch for Visible Light, pp. 1-5 (2014).
Bauder, Radiation from High-Pressure Plasmas, pp. 148-152 (1968).
Silfvast et al., Comparison of Radiation from Laser-Produced and DC-Heated Plasmas in Xenon pp. 274-277 (1974).
Ahmed et al., Laser Optogalvanic Spectroscopic Studies of Xenon, pp. 4017-4028 (1998).
I.M. Beterov et al., Resonance radiation plasma (photoresonance plasma), pp. 535-554 (1988).
Measures et al., TABLASER: Trace (Element) Analyzer Based on Laser Ablation and Selectively Excited Radiation, pp. 281-286 (1979).
Lui et al., Resonance-Enhanced Laser-Induced PlasmaSpectroscopy: Time-Resolved Studies and Ambient Gas Effects pp. 19-21 (2002).
Kaku et al., Vacuum Ultraviolet Spectroscopic System Using a Laser-Produced Plasma, pp. 3458-3462 (2003).
Oettinger et al., Plasma Ionization Enhancement by Laser Line Radiation, pp. 880-885 (1970).
Arzuov et al., Self-Maintenance of a Continuous Optical Discharge in Gases Near Solid Targets, pp. 523-525 (1975).
Arieli, Excitation of Gas Laser by Optical Pumping, p. 2b (2006).
May, Infrared Optogalvanic Effects in Xenon, pp. 36-40 (1987).
Keefer et al., Power Absorption Laser Sustained Argon Plasmas, pp. 1663-1669 (1986).
Bussiahn et al., Experimental and theoretical investigations of a low-pressure He-Xe discharge for lighting purpose, pp. 4627-4634 (2004).
Millard et al., Diode Laser Absorption Measurements of Metastable Helium in Glow Discharges, pp. 288-394 (1998).
Griem, Plasma Spectroscopy, pp. 172-176 (1964).
MacDowell et al., Reduction imaging with soft x rays for projection lithography, pp. 737-740 (1992).
Stulen et al., Developing A Soft X-Ray Projection Lithography Tool, pp. 37-48 (1991).
Fomenkov et al., Laser Produced Plasma Light Source for EUVL, pp. 1-6 (2011).
Gwyn, EVU Lithography Update: The timeline puts the screws to extreme ultraviolet lithography, but engineers rise to be challenge, pp. 1-4 (2002).
Mizoguchi et al., Development of Light Source for Lithography at Present and for the Future, pp. 1-7 (2013).
Tichenor et al., Soft-x-ray projection lithography experiments using Schwarzschild imaging optics, pp. 7068-7071 (1993).
Wu et al., Extreme Ultraviolet Lithography: Towards the Next Generation of Integrated Circuits, pp. 1-4 (2009).
Abe et al., KrF Laser Driven Xenon Plasma Light Source of a Small Field Exposure Tool, pp. 61513T-1-61513T-5 (2006).
Mizoguchi et al., Development of CO2 Laser Produced Xe Plasma EUV Light Source for Microlithography, pp. 61510S-1-61510S-10 (2006).
Uhlenbusch and W. Viöl, Hβ-Line Profile Measurements in Optical Discharges, pp. 47-56 (1990).
Eletskii et al., Formation kinetics and parameters of a photoresonant plasma, pp. 920-924 (1988).
Measures et al., Laser interaction based on resonance saturation (LIBORS): an alternative to inverse bremsstrahlung for coupling laser energy into a plasma, pp. 1824-1827 (1979).
Oxford Dictionary of Astronomy, definition of "bound-bound transition," p. 59 (2003).
Gentile et al., Tritium Decontamination of TFTR D-T Graphite Tiles Employing Ultra Violet Light and a Nd:YAG Laser, p. 321-322 (1999).
Nagano et al., Present Status of Laser-Produced Plasma EUV Light Source, pp. 76363C-1-76363C-9 (2010).
Ballman et al., Synthetic Quartz with High Ultraviolet Transmission, pp. 1387-1390 (1968).
Hou et al., "Fiber Laser Based EUV Sources", Panel discussion presentation at the SEMATECH EUV Source Workshop (2006).
Galvanauskas, "Fiber laser based EUV lithography sources", Panel discussion presentation at the SEMATECH EUV Source Workshop (2007).
Energetiq EQ-10M Soft X-Ray & EUV Source Data Sheet, pp. 1-2 (2005).
Tansu, Novel Quantum-Wells GaAs-Based Lasers for All Transmission Windows in Optical Communication, pp. i-291 (2003).
Sereda et al., High-power IR Lasers Operating on Xe I Transitions, pp. 459-480 (1993).
Hanselman, Laser-Light Thomson and Rayleigh Scattering in Atmospheric-Pressure Laboratory Plasmas, pp. ii-385 (1993).
Jauregui et al., High-power Fibre Lasers, pp. 861-867 (2013).
Ballard et al., High-Power, Laser-Produced-Plasma EUV Source, pp. 302-309 (2002).
Fujimoto et al., High Power InGaAs/AlGaAs laser Diodes with Decoupled Confinement Heterostructure, pp. 38-45 (1999).
Phillips et al., Characterization and Stabilization of Fiber-Coupled Laser Diode Arrays, pp. 2905-2909 (1999).
Yamada et al., Ionization Mechanism of Cesium Plasma Produced by Irradiation of Dye Laser, pp. 377-380 (1992).
Surzhikov, Numerical Simulation of Subsonic Gasdynamical Instabilities Near Heat Release Regions, pp. 1-11 (1996).
Southampton Photonics, Inc., World Record Powers Achieved in Single-Mode Fiber Lasers—Powers Scalable to 1kW and Beyond, pp. 1-2 (2003).
Sidawi, Fiber Lasers Gain Power, p. 26 (2003).
Skenderovic et al., Laser-ignited glow discharge in lithium vapor, pp. 052707-1-052707-7 (2000).
Coffey, Fiber Lasers Achieve World-Record Powers, pp. 13-14 (2003).
Phillip, Optical Properties of Non-Crystalline Si, SiO, SiOx and SiO2, pp. 1935-1945 (1971).
Pappas et al., Formation of a Cesium Plasma by Continuous-Wave Resonance Excitation, pp. 1245-1249 (2000).
Measures et al., Fast and Efficient Plasma Heating Through Superelastic Laser Energy Conversion, pp. 3622-3628 (1980).
Leonov et al., Mechanisms of Resonant Laser Ionization, pp. 703-715 (1997).
Kolb et al., Low Optical Loss Synthetic Quartz, pp. 397-406 (1972).
Liao et al., Generation of Hard X-rays Using an Ultrafast Fiber Laser System, pp. 13942-13948 (2007).
Mordovanakis et al., Demonstration of Fiber-laser-produced Plasma Source and Application to Efficient Extreme UV Light Generation, pp. 2517-2519 (2006).
Brauch et al., High-Power Diode Lasers for Direct Applications, pp. 303-368 (2000).
Yusim et al., 100 Watt, single-mode, CW, Linearly Polarized All-fiber Format 1.56um Laser with Suppression of Parasitic Lasing Effects, pp. 69-77 (2005).
Haysom, Quantum Well Intermixing of InGaAs(P)/InP Heterostructures, pp. ii-224 (2001).
Wang, Self-Assembled Indium Arsenide Quantum-Dash Lasers of Indium Phosphide Substrates, pp. vi-150 (2002).
Zhang et al., Designing a High Performance TEC Controller, pp. 177-183 (2002).
Apter, High-power Diode Lasers Offer Efficient Answer, pp. 1-3 (2005).
Mobarhan, Test and Characterization of Laser Diodes: Determination of Principal Parameters, pp. 1-7 (1999).

(56) References Cited

OTHER PUBLICATIONS

Business Wire, OSRAM Opto Semiconductors Announces New Solutions for Laser Applications; New Offerings Provide High Output and Enhanced Reliability, pp. 1-3 (2005).
Parker, McGraw-Hill Dictionary of Scientific and Technical Terms, p. 561 (1994).
Analog Devices Inc., Thermoelectric Cooler Controller: ADN8830, pp. 1-24 (2002).
Chen et al., High-temperature Operation of Periodic Index Separate Confinement Heterostructure Quantum Well Laser, pp. 2784-2786 (1991).
Hebner et al., Measured Pressure Broadening and Shift Rates of the 1.73 μm (5d[3/2]1-6p[5/2]2) Transition of Xenon, pp. 537-539 (1991).
Agrawal, Semiconductor Lasers, p. 547 (1993).
Vadla et al., Resonantly Laser Induced Plasmas in Gases: The Role of Energy Pooling and Exothermic Collisions in Plasma Breakdown and Heating, pp. 33-45 (2010).
Wood, Atomic Processes: Bound-bound transitions (Einstein coefficients), available at http://www-star.st-and.ac.uk/~kw25/teaching/nebulae/lecture06_einstein.pdf, pp. 1-10 (2014).
Tam, Dynamic Response of a cw Laser-produced Cs Plasma to Laser Modulations, pp. 683-685 (1979).
Roth et al., Directly Diode-laser-pumped Ti:sapphire laser, pp. 3334-3336 (2009).
Bachman, Goals and status of the German national research initiative BRIOLAS (brilliant diode lasers), 6456-07 (2007).
Phillip, Optical Transitions in Crystalline and Fused Quartz, pp. 73-75 (1966).
Hou et al., High Power Fiber Laser Driver for Efficient EUV Lithography Source with Tin-Doped Water Droplet Targets, pp. 965-974 (2008).
Maclean et al., Direct Diode Laser Pumping of a Ti:Sapphire Laser, pp. 1-3 (2009).
Chang et al., Fiber Laser Driven EUV Generation, pp. 2200-2202 (2005).
Petring et al., Applications, pp. 285-533 (2007).
Knyazev, Photoresonance Plasma Production by Excimer Lasers as a Technique for Anode-plasma Formation, pp. 525-532 (1998).
Liao et al., An efficient Ni Kα X-ray Source Driven by a High Energy Fiber CPA System, p. CP1-4-THU (2007).
George et al., 13.5 nm EUV Generation from Tin-doped Droplets Using a Fiber Laser, pp. 16348-16356 (2007).
Harrison et al., Low-threshold, cw, All-solid-state Ti:Al2O3 Laser, pp. 581-583 (1991).
Polijanczuk et al., Semiconductor Lasers for Microsoldering, pp. 6/1-6/4 (1991).
Neukum, Vom Halbleiterchip zum Laserwerkzeug, pp. 18-20 (2007).
Sobota et al., The Role of Metastables in the Formation of an Argon Discharge in a Two-Pin Geometry, pp. 2289-2299 (2010).
Yoshino et al., Absorption Spectrum of Xenon in the Vacuum-Ultraviolet Region, pp. 1268-1274 (1985).
Guardian Electric A490-367460-18 Spring Kit for Solenoids, Allied Electronics.
Cermax lamps, including models LX300F, LX1000CF, EX300-10F, EX500-13F, EX900C-10F, EX900C-13F, EX1000C-13F, LX125F, LX175F, LX500CF, EX125-10F, EX175-10F, EX500-10F, EX1000C-10F, EX900-10F; PerksinElmer optoelectronics.
Guardian Electric LT12X19-C-24D Continuous Tubular Solenoid; Allied Electronics.
Energetiq EQ-10M Soft X-Ray & EUV Source (2005) Energetiq.
Final Seal Ass'y 300W Lamp ILC Technology, Inc.
Topanga Advanced Plasma Lighting APL250-4000SF.
Topanga Advanced Plasma Lighting APL1000-5000SF.
Topanga Advanced Plasma Lighting APL400-5500SF.
Topanga Advanced Plasma Lighting APL400-4000BF.
Topanga Advanced Plasma Lighting APL1000-4000SF.
Topanga Advanced Plasma Lighting APL250-4000BF.
Topanga Advanced Plasma Lighting APL400-4000SF.
Topanga Advanced Plasma Lighting APL250-5500SF.
Topanga Advanced Plasma Lighting APL400-5500BF.
Model OS-9286A Mercury Vapor Light Source PASCO Scientific.
Edmund Optice, Lens UV-SCX 25MM DIA × 25MM FL Uncoated (Drawing).
Beam Samplers; UV Fused Silica Beam Samplers (AR Coating: 250-420 nm) (AR Coating: 350-700 nm) (AR Coating: 650-1050 nm) (AR Coating: 1050-1700 nm).
EQ-99FC.
OEM Compact Fiber Laser module 1090nm 10-20W CW/M With GTWave Technology SPI Lasers PLC.
DET25K-GaP Detector, 150-550 nm, 1 ns Rise Time, 4.8 mm2, 8-32 Taps Thorlabs.
LDLS Selection Guide Energetiq.
EQ-1510 Energetiq.
EQ-1500 Energetiq.
EQ-1000 Energetiq.
Ushio Super-High Pressure Mercury Lamps, including USH-102D, USH-102DH, USH-205DP, USH-205S, USH-206D/M4, USH-250D, USH-250BY, USH-350DS, USH-351DS, USH-350DP, USH-450GS, USH-450GL, USH-500BY, USH-500MB, USH-502MB, USH-500T, USH-505MC, USH-508S, USH-508SA, USH-509S, USH-1000DW, USH-1000MC, USH-1000KS, USH-1002DW, Ushio.
Kirk et al., "Methods and Systems for Providing Illumination of a Specimen for Inspection" U.S. Appl. No. 60/806,204, filed Jun. 29, 2006, 48 pages.
Kennedy et al., A Review of the Use of High Power Diode Lasers in Surface Hardening, pp. 1855-1860 (2004).
Coherent, Conduction-Cooled Bar Packages (CCPs), 965-985 nm, pp. 1-4 (2015).
Bachmann, Industrial Applications of High Power Diode Lasers in Materials Processing, pp. 125-136 (2003).
Tam et al., Plasma Production in a Cs Vapor by a Weak cw Laser Beam at 6010, pp. 403-407 (1977).
Xenakis et al., Laser-plasma X-ray Generation Using an Injection-mode-locked XeCI Excimer Laser, pp. 85-93 (1992).
Hou et al., High Intensity Fiber Lasers: Emerging New Applications and New Fiber Technologies, pp. 22-25 (2007).
Sundvold et al., Optical Firing System, pp. 587104-1-587104-10 (2005).
Belasri et al., Electrical Approach of Homogenous High Pressure Ne/Xe/CHI Dielectric Barrier Discharge for XeCI (308 nm) Lamp, pp. 787-798 (2011).
Motomura et al., Temporal VUV Emission Characteristics Related to Generations and Losses of Metastable Atoms in Xenon Pulsed Barrier Discharge, pp. 81-86 (2006).
Lange et al., Tunable Diode Laser Absorption Spectroscopy for Plasmas at Elevated Pressures, pp. 177-187 (2002).
Jinno et al., The Afterglow Characteristics of Xenon Pulsed Plasma for Mercury-Free Fluorescent Lamps, pp. 433-436 (2000).
Hecht, Fiber Lasers: Fiber Lasers: The state of the art, Laser Focus World, pp. 1-11 (2012).
Fiedorowicz, X-Ray Emission form Laser-Irradiated Gas Puff Targets, pp. 2778-2780 (1993).
Jeng, Theoretical Investigation of Laser-Sustained Argon Plasmas, pp. 2272-2279 (1986).
Wilbers, The Continuum Emission of an Arc Plasma, pp. 1-10 (1991).
Generalov, Experimental Investigation of a Continuous Optical Discharge, pp. 763-769 (1972).
Beck, Simple Pulse Generator for Pulsing Xenon Arcs with High Repetition Rate, pp. 318-319 (1974).
Carlhoff, Continuous Optical Discharges at Very High Pressure, pp. 439-447 (1981).
Raïzer, Optical Discharges, pp. 789-806 (1980).
Agrawal et al., Infrared and Visible Semiconductor Lasers, pp. xiii-616 (1993).
Mandel'shtam et al., Investigation of the Spark Discharge Produced in Air by Focusing Laser Radiation, pp. 91-96 (1966).
Treshchalov et al., Spectroscopic Diagnostics of Pulsed Discharge in High-Pressure Argon, pp. 234-240 (2010).

(56) References Cited

OTHER PUBLICATIONS

Sakamoto et al., 120W CW Output Power from Monolithic AlGaAs (800nm) Laser Diode Array Mounted on Diamond Heatsink, pp. 197-199 (1992).
Shen et al., Highly Efficient Er, Yb-Doped Fiber Laser with 188W Free-Running and >100W Tunable Output Power, pp. 4916-4921 (2005).
Webb et al., Handbook of Laser Technology and Applications, pp. 1587-1611 (2004).
Kuhn, Laser Engineering, pp. 303-343, 365-377, 384-440 (1998).
Davis, Lasers and Electro-Optics: Fundamentals and Engineering, pp. 1-35 (1996).
Н. А. Ратахин ЕЖЕГОДНЫЙ НАУЧНЫЙ ОТЧЕТ за 2009 год УЧРЕЖДЕНИЕ РОССИЙСКОЙ АКАДЕМИИ НАУК ИНСТИТУТ СИЛЬНОТОЧНОЙ ЭЛЕКТРОНИКИ СИБИРСКОГО ОТДЕЛЕНИЯ РАН (2010).
Silfvast, Laser Fundamentals 1-6, pp. 199-222 & 565-568 (2004).
Moulton, Tunable Solid-State Lasers, pp. 348-364 (1992).
Gullikson et al., A Soft X-Ray/EUV Reflectometer Based on a Laser Produced Plasma Source, pp. 283-299 (1992).
Waynant et al., Eds., Electro-Optics Handbook, pp. 1-1000 (2000).
Raizer, Gas Discharge Physics, pp. 1-449 (1991).
Notice of Deposition of Petitioner's Declarant for U.S. Pat. No. 8,309,943, Dec. 21, 2015, 4 pages.
Petitioners' Updated Mandatory Notices Under 37 C.F.R. 42.8(a)(3) for U.S. Pat. No. 8,309,943, Feb. 12, 2016, 3 pages.
Petitioners' Updated Mandatory Notices Under 37 C.F.R. §42.8(a)(3) for U.S. Pat. No. 8,309,943, Feb. 12, 2016, 3 pages.
Order Conduct of the Proceeding 37 C.F.R. 42.5, Feb. 16, 2016, 5 pages.
Updated Mandatory Notices of Patent Owner Pursuant to 37 C.F.R. §42.8(a)(3) for U.S. Pat. No. 8,309,943, Feb. 23, 2016, 4 pages.
Patent Owner's Response Under 37 C.F.R. §42.120 for U.S. Pat. No. 8,309,943, Mar. 1, 2016, 40 pages and accompanying exhibits 2001-2085.
Petitioners' Objections to Evidence, Mar. 8, 2016, 4 pages.
Patent Owner's Notice of Supplemental Evidence Under 37 C.F.R. §42.64 (b)(2) for U.S. Pat. No. 8,309,943, Mar. 22, 2016, 3 pages.
Petitioners' Updated Mandatory Notices Under 37 C.F.R. §42.8(a)(3), Apr. 5, 2016, 7 pages.
Notice of Deposition of Petitioner's Declarant for U.S. Pat. No. 7,786,455, Dec. 21, 2015, 4 pages.
Petitioners' Updated Mandatory Notices Under 37 C.F.R. 42.8(a)(3, for U.S. Pat. No. 7,786,455, Feb. 12, 2016, 3 pages.
Petitioners' Updated Mandatory Notices Under 37 C.F.R. §42.8(a)(3) for U.S. Pat. No. 7,786,455, Feb. 12, 2016, 3 pages.
Updated Mandatory Notices of Patent Owner Pursuant to 37 C.F.R. §42.8(a)(3) for U.S. Pat. No. 7,786,455, Feb. 23, 2016, 4 pages.
Patent Owner's Response Under 37 C.F.R. §42.120, for U.S. Pat. No. 7,786,455, Mar. 1, 2016, 34 pages and accompanying exhibits 2001-2087.
Patent Owner's Notice of Supplemental Evidence Under 37 C.F.R. §42.64 (b)(2) for U.S. Pat. No. 7,786,455, Mar. 22, 2016, 3 pages.
Notice of Deposition of Petitioner's Declarant for U.S. Pat. No. 7,435,982, Dec. 21, 2015, 4 pages.
Petitioners' Updated Mandatory Notices Under 37 C.F.R. 42.8(a)(3, for U.S. Pat. No. 7,435,982, Feb. 12, 2016, 3 pages.
Petitioners' Updated Mandatory Notices Under 37 C.F.R. §42.8(a)(3) for U.S. Pat. No. 7,435,982, Feb. 12, 2016, 3 pages.
Updated Mandatory Notices of Patent Owner Pursuant to 37 C.F.R. §42.8(a)(3) for U.S. Pat. No. 7,435,982, Feb. 23, 2016, 4 pages.
Patent Owner's Response Under 37 C.F.R. §42.120, for U.S. Pat. No. 7,435,982, Mar. 1, 2016, 36 pages and accompanying exhibits 2001-2087, 2101.
Patent Owner's Notice of Supplemental Evidence Under 37 C.F.R. §42.64 (b)(2) for U.S. Pat. No. 7,435,982, Mar. 22, 2016, 3 pages.
Petitioners' Updated Mandatory Notices Under 37 C.F.R. §42.8(a)(3), Apr. 5, 2016, 8 pages.

Notice of Deposition of Petitioner's Declarant for U.S. Pat. No. 8,969,841, Dec. 21, 2015, 4 pages.
Petitioners' Updated Mandatory Notices Under 37 C.F.R. 42.8(a)(3) for U.S. Pat. No. 8,969,841, Feb. 12, 2016, 3 pages.
Petitioners' Updated Mandatory Notices Under 37 C.F.R. §42.8(a)(3) for U.S. Pat. No. 8,969,841, Feb. 12, 2016, 3 pages.
Updated Mandatory Notices of Patent Owner Pursuant to 37 C.F.R. §42.8(a)(3) for U.S. Pat. No. 8,969,841, Feb. 23, 2016, 4 pages.
Petitioners' Updated Mandatory Notices Under 37 C.F.R. §42.8(a)(3), Mar. 1, 2016, 6 pages.
Motion for Entry of Default Protective Order and Motion to File Confidential Documents Under Seal Pursuant to 37 C.F.R. §§42.14 & 42.54, for U.S. Pat. No. 8,969,841, Mar. 1, 2016, 15 pages.
Patent Owner's Response Under 37 C.F.R. §42.120 for U.S. Pat. No. 8,969,841, Mar. 1, 2016, 71 pages and accompanying exhibits 2001-2074.
Default Standing Protective Order and Petitioners' Certificate of Agreement to Terms of Default Standing Protective Order, Mar. 1, 2016, 8 pages.
Patent Owner's Motion To Expunge and Replace Exhibit 2066, Mar. 4, 2016, 4 pages.
Petitioners' Objections to Evidence, Mar. 8, 2016, 10 pages.
Patent Owner's Notice of Supplemental Evidence Under 37 C.F.R. §42.64 (b)(2) for U.S. Pat. No. 8,969,841, Mar. 22, 2016, 3 pages.
Notice of Deposition of Petitioner's Declarant for U.S. Pat. No. 8,525,138, Dec. 21, 2015, 4 pages.
Petitioners' Updated Mandatory Notices Under 37 C.F.R. 42.8(a)(3) for U.S. Pat. No. 8,525,138, Feb. 12, 2016, 3 pages.
Petitioners' Updated Mandatory Notices Under 37 C.F.R. §42.8(a)(3) for U.S. Pat. No. 8,525,138, Feb. 12, 2016, 3 pages.
Updated Mandatory Notices of Patent Owner Pursuant to 37 C.F.R. §42.8(a)(3) for U.S. Pat. No. 8,525,138, Feb. 23, 2016, 4 pages.
Patent Owner's Response Under 37 C.F.R. §42.120 for U.S. Pat. No. 8,525,138, Mar. 1, 2016, 40 pages and accompanying exhibits 2001-2085.
Patent Owner's Notice of Supplemental Evidence Under 37 C.F.R. §42.64 (b)(2) for U.S. Pat. No. 8,525,138, Mar. 22, 2016, 3 pages.
Petitioners' Updated Mandatory Notices Under 37 C.F.R. 42.8(a)(3) for U.S. Pat. No. 7,435,982 Feb. 12, 2016, 3 pages.
Patent Owner's Response Under 37 C.F.R. §42.120 for U.S. Pat. No. 7,435,982, Mar. 1, 2016, 32 pages and accompanying exhibits 2001-2202.
Patent Owner's Notice of Supplemental Evidence Under 37 C.F.R. §42.64(b)(2); Mar. 22,2016, 3 pages.
Petitioner's Updated Mandatory Notices Under 37 C.F.R. 42.8(a)(3), Apr. 5, 2016, 7 pages.
Petitioner's Updated Mandatory Notices Under 37 C.F.R. 42.8(a)(3), Feb. 12, 2016, 3 pages.
Petitioners' Updated Mandatory Notices Under 37 C.F.R. 42.8(a)(3) for U.S. Pat. No. 9,048,000, Feb. 12, 2016, 3 pages.
Updated Mandatory Notices of Patent Owner Pursuant to 37 C.F.R. §42.8(a)(3) for U.S. Pat. No. 9,048,000, Feb. 23, 2016, 4 pages.
Decision Institution of Inter Partes Review 37 C.F.R. §42.108 for U.S. Pat. No. 9,048,000 B2, Apr. 28, 2016, 21 pages.
Scheduling Order, Apr. 28, 2016, 8 pages.
Petition For Inter Partes Review of U.S. Pat. No. 8,309,943, Claims 14, 15, 17 and 18, Feb. 5, 2016, 56 pages and Exhibits 1301-1316.
Petitioners' Updated Mandatory Notices Under 37 C.F.R. 42.8(a), Feb. 11, 2016, 3 pages.
Notice of Filing Date Accorded to Petition and Time for Filing Patent Owner Preliminary Response for U.S. Pat. No. 3,309,943 B2, Feb. 17, 2016, 4 pages.
Mandatory Notices of Patent Owner Pursuant to 37 C.F.R. §42.8(a)(2) for U.S. Pat. No. 8,309,943, Feb. 19, 2016, 7 pages.
Petition for Inter Partes Review of U.S. Pat. No. 8,309,943, Claims 2, 5, and 10, Feb. 5, 2016, 64 pages and Exhibits 1101-1117.
Petition for Inter Partes Review of U.S. Pat. No. 8,309,943, Claims 11, and 12, Feb. 5, 2016, 38 pages and Exhibits 1201-1216.
Petition For Inter Partes Review of U.S. Pat. No. 8,525,138 Claims 21, 25, and 27, Feb. 5, 2016, 64 pages and exhibits 1201-1228.
Petitioners' Updated Mandatory Notices Under 37 C.F.R. 42.8(a)(3), Feb. 11, 2016, 3 pages.

(56) References Cited

OTHER PUBLICATIONS

Mandatory Notices of Patent Owner Pursuant to 37 C.F.R. §42. 8(a)(2), for U.S. Pat. No. 8,525,138, Feb. 19, 2016, 7 pages.
Notice of Filing Date Accorded to Petition and Time for Filing Patent Owner Preliminary Response, Feb. 24, 2016, 4 pages.
Petition for Inter Partes Review of U.S. Pat. No. 7,786,455 Claims 1-9, 15, 16, Feb. 10, 2016, 66 pages and exhibits 1101-1119.
Mandatory Notices of Patent Owner Pursuant to 37 C.F.R. §42. 8(a)(2), for U.S. Pat. No. 7,786,455, Feb. 22, 2016, 6 pages.
Notice of Filing Date Accorded to Petition and Time for Filing Patent Owner Preliminary Response, Feb. 25, 2016, 4 pages.
Petition for Inter Partes Review of U.S. Pat. No. 7,786,455 Claims 12-14, Feb. 10, 2016, 60 pages and exhibits 1201-1216.
Mandatory Notices of Patent Owner Pursuant to 37 C.F.R. §42. 8(a)(2), for U.S. Pat. No. 7,786,455, Feb. 22, 2016, 5 pages.
Notice of Filing Date Accorded to Petition and Time for Filing Patent Owner Preliminary Response for U.S. Pat. No. 7,786,455 B2, Feb. 25, 2016, 4 pages.
Mandatory Notices of Patent Owner Pursuant to 37 C.F.R. §42.8 (a)(2), Feb. 22, 2016, 6 pages.
Petition for Inter Partes Review of U.S. Pat. No. 7,786,455 Claims 17, 18, Feb. 10, 2016, 59 pages and exhibits 1301-1316.
Decision Institution of Inter Partes Review 37 C.F.R. §42.108, Apr. 28, 2016, 18 pages.
Petition for Inter Partes Review of U.S. Pat. No. 8,525,138 Claims 6, 7, and 10, Feb. 5, 2016, 66 pages and exhibits 1101-1134.
Notice of Filing Date Accorded to Petition and Time for Filing Patent Owner Preliminary Response, Feb. 17, 2016, 4 pages.
Petition for Inter Partes Review of U.S. Pat. No. 7,786,455 Claims 20,21, 24 Feb. 10, 2016, 64 pages and exhibits 1401-1416.
Notice of Filing Date Accorded to Petition and Time for Filing Patent Owner Preliminary Response for U.S. Pat. No. 7,786,455, B2, Feb. 26, 2016, 4 pages.
Petition for Inter Partes Review of U.S. Pat. No. 7,786,455 Claims 28-34, Feb. 10, 2016, 64 pages and exhibits 1501-1516.
Notice of Filing Date Accorded to Petition and Time for Filing Patent Owner Preliminary Response for U.S. Pat. No. 7,786,455, B2, Mar. 1, 2016, 4 pages.
Petition for Inter Partes Review of U.S. Pat. No. 7,435,982 Claims 2, 5-9, 12-15, 20, 22, 28, 29, 35 and 36, Feb. 10, 2016, 67 pages and exhibits 1301-1318.
Mandatory Notices of Patent Owner Pursuant to 37 C.F.R. §42. 8(a)(2), for U.S. Pat. No. 7,435,982, Feb. 22, 2016, 6 pages.
Notice of Filing Date Accorded to Petition and Time for Filing Patent Owner Preliminary Response for U.S. Pat. No. 7,435,982 B2, Mar. 5, 2016, 4 pages.
Petition for Inter Partes Review of U.S. Pat. No. 7,435,982 Claims 38, 44-48, 51, 53, 54, 59, 65, 66 and 73, Feb. 10, 2016, 62 pages and exhibits 1401-1418.
Mandatory Notices of Patent Owner Pursuant to 37 C.F.R. §42. 8(a)(2), for U.S. Pat. No. 7,435,982, Feb. 22, 2016, 3 pages.
Notice of Filing Date Accorded to Petition and Time for Filing Patent Owner Preliminary Response for Patent 7,435,982 B2, Mar. 5, 2016, 4 pages.
Petition for Inter Partes Review of U.S. Pat. No. 8,969,841 Claims 4, 5, 6, 8 and 26, Apr. 1, 2016, 67 pages and exhibits 1201-1234.
Mandatory Notices of Patent Owner Pursuant to 37 C.F.R. §42. 8(a)(2), for U.S. Pat. No. 8,969,841, Apr. 12, 2016, 5 pages.
Notice of Filing Date Accorded to Petition and Time for Filing Patent Owner Preliminary Response for U.S. Pat. No. 8,969,841, Apr. 18, 2016, 5 pages.
Petition for Inter Partes Review of U.S. Pat. No. 8,969,841 Claims 11, 12 and 27-29, Apr. 1, 2016, 68 pages and exhibits 1301-1335.
Petition For Inter Partes Review of U.S. Pat. No. 9,185,786 Claims 1, 6, 8, and 13, Mar. 25, 2016, 67 pages and exhibits 1001-1038.
Notice of Filing Date Accorded To Petition and Time For Filing Patent Owner Preliminary Response for U.S. Pat. No. 9,185,786, Mar. 29, 2016, 5 pages.

Mandatory Notices of Patent Owner Pursuant to 37 C.F.R. §42. 8(a)(2), for U.S. Pat. No. 9,185,786, Mar. 29, 2016, 5 pages.
Petition for Inter Partes Review of U.S. Pat. No. 9,048,000 Claims 2-6, Mar. 31, 2016, 67 pages and exhibits 1201-1240.
Mandatory Notices of Patent Owner Pursuant to 37 C.F.R. §42. 8(a)(2), for U.S. Pat. No. 9,048,000, Apr. 12, 2016, 5 pages.
Notice of Filing Date Accorded to Petition and Time for Filing Patent Owner Preliminary Response for U.S. Pat. No. 9,048,000, Apr. 22, 2016, 5 pages.
Petition for Inter Partes Review of U.S. Pat. No. 9,048,000 Claims 16, 17, Mar. 31, 2016, 67 pages and exhibits 1301-1338.
Petition for Inter Partes Review of U.S. Pat. No. 9,185,786 Claims 15, 20, 21 and 25, Mar. 25, 2016, 67 pages and exhibits 1101-1138.
Kirk et al., Methods and Systems for Providing Illumination of a Specimen for Inspection, U.S. Appl. No. 60/806,204 filed Jun. 29, 2006, 48 pages.
Kirk et al., Methods and Systems for Providing Illumination of a Specimen for Inspection, U.S. Appl. No. 60/772,425 filed Feb. 9, 2006, 20 pages.
Kirk et al., Methods and Systems for Providing Illumination of a Specimen for Inspection, U.S. Appl. No. 60/759,846 filed Jan. 17, 2006, 18 pages.
"Office Action" for Korean Patent Application No. 10-2013-7030553, May 27, 2016, 2 pages, Korean Intellectual Property Office, South Korea.
"Respondents Notice of Prior Art" Mar. 30, 2016, 49 pages.
"Office Action" for Korean Patent Application No. 10-2012-7023501, Jul. 26 2016, 2 pages, Korean Intellectual Property Office, South Korea.
Hamamatsu Product Information, Super-Quiet Xenon Lamp Super-Quiet Mercury-Xenon Lamp, pp. 1-16 (2005).
Endo et al., Laser Produced EUV Light Source Development for HVM, pp. 1-25 (2007).
Heraeus Noblelight America LLC, F300S/F300SQ UV Lamp System Parts Listing, pp. 1-26 (2015).
Heraeus Noblelight America LLC, LightHammer 10 Mark II UV Lamp System, pp. 1-20 (2015).
Heraeus Noblelight America LLC, C10T/C6 Lightshield System, pp. 1-8 (2015).
Heraeus Noblelight America LLC, LightHammer 6 UV Lamp System Parts Listing, pp. 1-22 (2015).
Heraeus Noblelight America LLC, F10T/F10T2 and F6 Lightshield Systems Parts Listing, pp. 1-12 (2015).
Topanga USA, Topanga's Advanced Plasma Lighting System, pp. 1-5 (2016).
Zajac et al., 10 W cw Nd-Doped Double-clad Fiber Laser Operating at 1.06 μm, pp. 135-138 (2003).
Shirakawa et al., CW 7-W, 900-nm-wide Supercontinuum Source by Phosphosilicate Fiber Raman Laser and High-nonlinear Fiber, pp. 199-205 (2005).
Li, The Advances and Characteristics of High-Power Diode Laser Materials Processing, pp. 231-253 (2000).
Kurkov et al., CW Medium-Power Fiber Lasers for Near IR Range, pp. 62-69 (2004).
Klocke et al., Investigation into the Use of High Power Diode Lasers for Hardening and Thermal Conduction Welding of Metals, pp. 592-598 (1997).
Dorsch et al., Performance and Lifetime of High-Power Diode Lasers and Diode Laser Systems, pp. 56-63 (1999).
Barnes et al., High Power Diode Laser Cladding, pp. 411-416 (2003).
Swiderski et al., Q-Switched ND-doped Double-Clad Fiber Laser, pp. 187-191 (2005).
Rofin-Sinar Technologies, Inc., High Power Diode Laser, pp. 1-26 (2000).
Prabhu et al., High-Power CW Raman Fiber Laser Using Phosphosilicate Fiber Pumped by Yb-doped Double-clad Fiber Laser, pp. 482-485 (2001).
Dorsch et al., 2 kW cw Fiber-coupled Diode Laser System, pp. 45-53 (2000).

* cited by examiner

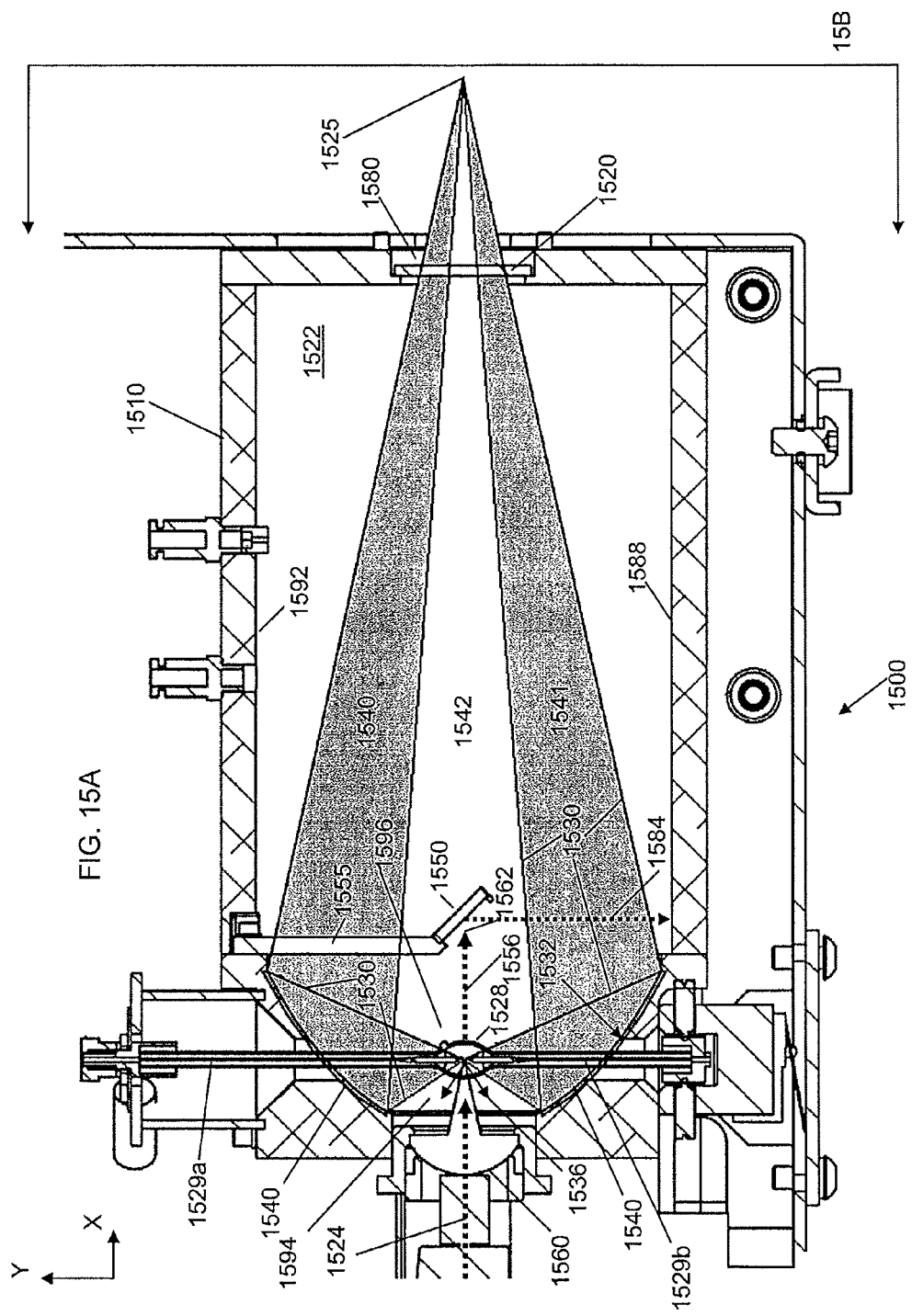

LASER-DRIVEN LIGHT SOURCE FOR GENERATING LIGHT FROM A PLASMA IN A PRESSURIZED CHAMBER

RELATED APPLICATIONS

This application is a continuation of U.S. Ser. No. 14/448,258, filed on Jul. 31, 2014, which is a continuation of U.S. Ser. No. 13/964,938, filed on Aug. 12, 2013, now U.S. Pat. No. 9,048,000, which is a continuation of U.S. Ser. No. 13/024,027, filed on Feb. 9, 2011, now U.S. Pat. No. 8,525,138, which claims the benefit of, and priority to U.S. Provisional Patent Application No. 61/302,797, filed on Feb. 9, 2010, the entire disclosure of which is incorporated by reference herein, Ser. No. 13/024,027 is also a continuation-in-part of U.S. Ser. No. 12/166,918, filed on Jul. 2, 2008, now U.S. Pat. No. 7,989,786, which is a continuation-in-part of U.S. Ser. No. 11/695,348, filed on Apr. 2, 2007, now U.S. Pat. No. 7,786,455, which is a continuation-in-part of U.S. Ser. No. 11/395,523, filed on Mar. 31, 2006, now U.S. Pat. No. 7,435,982, the entire disclosures of each of which are hereby incorporated by reference herein.

FIELD OF THE INVENTION

The invention relates to methods and apparatus for providing a laser-driven light source.

BACKGROUND OF THE INVENTION

High brightness light sources can be used in a variety of applications. For example, a high brightness light source can be used for inspection, testing or measuring properties associated with semiconductor wafers or materials used in the fabrication of wafers (e.g., reticles and photomasks). The electromagnetic energy produced by high brightness light sources can, alternatively, be used as a source of illumination in a lithography system used in the fabrication of wafers, a microscopy system, or a photoresist curing system. The parameters (e.g., wavelength, power level and brightness) of the light vary depending upon the application.

The state of the art in, for example, wafer inspection systems involves the use of xenon or mercury arc lamps to produce light. The arc lamps include an anode and cathode that are used to excite xenon or mercury gas located in a chamber of the lamp. An electrical discharge is generated between the anode and cathode to provide power to the excited (e.g., ionized) gas to sustain the light emitted by the ionized gas during operation of the light source. During operation, the anode and cathode become very hot due to electrical discharge delivered to the ionized gas located between the anode and cathode. As a result, the anode and/or cathode are prone to wear and may emit particles that can contaminate the light source or result in failure of the light source. Also, these arc lamps do not provide sufficient brightness for some applications, especially in the ultraviolet spectrum. Further, the position of the arc can be unstable in these lamps.

Accordingly, a need therefore exists for improved high brightness light sources. A need also exists for improved high brightness light sources that do not rely on an electrical discharge to maintain a plasma that generates a high brightness light.

The properties of light produced by many light sources (e.g., arc lamps, microwave lamps) are affected when the light passes through a wall of, for example, a chamber that includes the location from which the light is emitted.

Accordingly, a need therefore exists for an improved light source whose emitted light is not significantly affected when the light passes through a wall of a chamber that includes the location from which the light is emitted.

SUMMARY OF THE INVENTION

The present invention features a light source for generating a high brightness light.

The invention, in one aspect, features a light source having a chamber. The light source also includes an ignition source for ionizing a gas within the chamber. The light source also includes at least one laser for providing energy to the ionized gas within the chamber to produce a high brightness light.

In some embodiments, the at least one laser is a plurality of lasers directed at a region from which the high brightness light originates. In some embodiments, the light source also includes at least one optical element for modifying a property of the laser energy provided to the ionized gas. The optical element can be, for example, a lens (e.g., an aplanatic lens, an achromatic lens, a single element lens, and a Fresnel lens) or mirror (e.g., a coated mirror, a dielectric coated mirror, a narrow band mirror, and an ultraviolet transparent infrared reflecting mirror). In some embodiments, the optical element is one or more fiber optic elements for directing the laser energy to the gas.

The chamber can include an ultraviolet transparent region. The chamber or a window in the chamber can include a material selected from the group consisting of quartz, Suprasil® quartz (Heraeus Quartz America, LLC, Buford, Ga.), sapphire, $MgF_2$, diamond, and $CaF_2$. In some embodiments, the chamber is a sealed chamber. In some embodiments, the chamber is capable of being actively pumped. In some embodiments, the chamber includes a dielectric material (e.g., quartz). The chamber can be, for example, a glass bulb. In some embodiments, the chamber is an ultraviolet transparent dielectric chamber.

The gas can be one or more of a noble gas, Xe, Ar, Ne, Kr, He, $D_2$, $H_2$, $O_2$, $F_2$, a metal halide, a halogen, Hg, Cd, Zn, Sn, Ga, Fe, Li, Na, an excimer forming gas, air, a vapor, a metal oxide, an aerosol, a flowing media, or a recycled media. The gas can be produced by a pulsed laser beam that impacts a target (e.g., a solid or liquid) in the chamber. The target can be a pool or film of metal. In some embodiments, the target is capable of moving. For example, the target may be a liquid that is directed to a region from which the high brightness light originates.

In some embodiments, the at least one laser is multiple diode lasers coupled into a fiber optic element. In some embodiments, the at least one laser includes a pulse or continuous wave laser. In some embodiments, the at least one laser is an IR laser, a diode laser, a fiber laser, an ytterbium laser, a $CO_2$ laser, a YAG laser, or a gas discharge laser. In some embodiments, the at least one laser emits at least one wavelength of electromagnetic energy that is strongly absorbed by the ionized medium.

The ignition source can be or can include electrodes, an ultraviolet ignition source, a capacitive ignition source, an inductive ignition source, an RF ignition source, a microwave ignition source, a flash lamp, a pulsed laser, or a pulsed lamp. The ignition source can be a continuous wave (CW) or pulsed laser impinging on a solid or liquid target in the chamber. The ignition source can be external or internal to the chamber.

The light source can include at least one optical element for modifying a property of electromagnetic radiation emitted by the ionized gas. The optical element can be, for example, one or more mirrors or lenses. In some embodiments, the optical element is configured to deliver the electromagnetic radiation emitted by the ionized gas to a tool (e.g., a wafer inspection tool, a microscope, a metrology tool, a lithography tool, or an endoscopic tool).

The invention, in another aspect, relates to a method for producing light. The method involves ionizing with an ignition source a gas within a chamber. The method also involves providing laser energy to the ionized gas in the chamber to produce a high brightness light.

In some embodiments, the method also involves directing the laser energy through at least one optical element for modifying a property of the laser energy provided to the ionized gas. In some embodiments, the method also involves actively pumping the chamber. The ionizable medium can be a moving target. In some embodiments, the method also involves directing the high brightness light through at least one optical element to modify a property of the light. In some embodiments, the method also involves delivering the high brightness light emitted by the ionized medium to a tool (e.g., a wafer inspection tool, a microscope, a metrology tool, a lithography tool, or an endoscopic tool).

In another aspect, the invention features a light source. The lights source includes a chamber and an ignition source for ionizing an ionizable medium within the chamber. The light source also includes at least one laser for providing substantially continuous energy to the ionized medium within the chamber to produce a high brightness light.

In some embodiments, the at least one laser is a continuous wave laser or a high pulse rate laser. In some embodiments, the at least one laser is a high pulse rate laser that provides pulses of energy to the ionized medium so the high brightness light is substantially continuous. In some embodiments, the magnitude of the high brightness light does not vary by more than about 90% during operation. In some embodiments, the at least one laser provides energy substantially continuously to minimize cooling of the ionized medium when energy is not provided to the ionized medium.

In some embodiments, the light source can include at least one optical element (e.g., a lens or mirror) for modifying a property of the laser energy provided to the ionized medium. The optical element can be, for example, an aplanatic lens, an achromatic lens, a single element lens, a Fresnel lens, a coated mirror, a dielectric coated mirror, a narrow band mirror, or an ultraviolet transparent infrared reflecting mirror. In some embodiments, the optical element is one or more fiber optic elements for directing the laser energy to the ionizable medium.

In some embodiments, the chamber includes an ultraviolet transparent region. In some embodiments, the chamber or a window in the chamber includes a quartz material, suprasil quartz material, sapphire material, $MgF_2$ material, diamond material, or $CaF_2$ material. In some embodiments, the chamber is a sealed chamber. The chamber can be capable of being actively pumped. In some embodiments, the chamber includes a dielectric material (e.g., quartz). In some embodiments, the chamber is a glass bulb. In some embodiments, the chamber is an ultraviolet transparent dielectric chamber.

The ionizable medium can be a solid, liquid or gas. The ionizable medium can include one or more of a noble gas, Xe, Ar, Ne, Kr, He, $D_2$, $H_2$, $O_2$, $F_2$, a metal halide, a halogen, Hg, Cd, Zn, Sn, Ga, Fe, Li, Na, an excimer forming gas, air, a vapor, a metal oxide, an aerosol, a flowing media, a recycled media, or an evaporating target. In some embodiments, the ionizable medium is a target in the chamber and the ignition source is a pulsed laser that provides a pulsed laser beam that strikes the target. The target can be a pool or film of metal. In some embodiments, the target is capable of moving.

In some embodiments, the at least one laser is multiple diode lasers coupled into a fiber optic element. The at least one laser can emit at least one wavelength of electromagnetic energy that is strongly absorbed by the ionized medium.

The ignition source can be or can include electrodes, an ultraviolet ignition source, a capacitive ignition source, an inductive ignition source, an RF ignition source, a microwave ignition source, a flash lamp, a pulsed laser, or a pulsed lamp. The ignition source can be external or internal to the chamber.

In some embodiments, the light source includes at least one optical element (e.g., a mirror or lens) for modifying a property of electromagnetic radiation emitted by the ionized medium. The optical element can be configured to deliver the electromagnetic radiation emitted by the ionized medium to a tool (e.g., a wafer inspection tool, a microscope, a metrology tool, a lithography tool, or an endoscopic tool).

The invention, in another aspect relates to a method for producing light. The method involves ionizing with an ignition source an ionizable medium within a chamber. The method also involves providing substantially continuous laser energy to the ionized medium in the chamber to produce a high brightness light.

In some embodiments, the method also involves directing the laser energy through at least one optical element for modifying a property of the laser energy provided to the ionizable medium. The method also can involve actively pumping the chamber. In some embodiments, the ionizable medium is a moving target. The ionizable medium can include a solid, liquid or gas. In some embodiments, the method also involves directing the high brightness light through at least one optical element to modify a property of the light. In some embodiments, the method also involves delivering the high brightness light emitted by the ionized medium to a tool.

The invention, in another aspect, features a light source having a chamber. The light source includes a first ignition means for ionizing an ionizable medium within the chamber. The light source also includes a means for providing substantially continuous laser energy to the ionized medium within the chamber.

The invention, in another aspect, features a light source having a chamber that includes a reflective surface. The light source also includes an ignition source for ionizing a gas within the chamber. The light source also includes a reflector that at least substantially reflects a first set of predefined wavelengths of electromagnetic energy directed toward the reflector and at least substantially allows a second set of predefined wavelengths of electromagnetic energy to pass through the reflector. The light source also includes at least one laser (e.g., a continuous-wave fiber laser) external to the chamber for providing electromagnetic energy to the ionized gas within the chamber to produce a plasma that generates a high brightness light. A continuous-wave laser emits radiation continuously or substantially continuously rather than in short bursts, as in a pulsed laser.

In some embodiments, at least one laser directs a first set of wavelengths of electromagnetic energy through the reflector toward the reflective surface (e.g., inner surface) of the chamber and the reflective surface directs at least a portion of the first set of wavelengths of electromagnetic energy toward the plasma. In some embodiments, at least a portion of the high brightness light is directed toward the reflective surface of the chamber, is reflected toward the reflector, and is reflected by the reflector toward a tool. In some embodiments, at least one laser directs a first set of wavelengths of electromagnetic energy toward the reflector, the reflector reflects at least a portion of the first wavelengths of electromagnetic energy towards the reflective surface of the chamber, and the reflective surface directs a portion of the first set of wavelengths of electromagnetic energy toward the plasma.

In some embodiments, at least a portion of the high brightness light is directed toward the reflective surface of the chamber, is reflected toward the reflector, and passes through the reflector toward an output of the light source. In some embodiments, the light source comprises a microscope, ultraviolet microscope, wafer inspection system, reticle inspection system or lithography system spaced relative to the output of the light source to receive the high brightness light. In some embodiments, a portion of the high brightness light is directed toward the reflective surface of the chamber, is reflected toward the reflector, and electromagnetic energy comprising the second set of predefined wavelengths of electromagnetic energy passes through the reflector.

The chamber of the light source can include a window. In some embodiments, the chamber is a sealed chamber. In some embodiments, the reflective surface of the chamber comprises a curved shape, parabolic shape, elliptical shape, spherical shape or aspherical shape. In some embodiments, the chamber has a reflective inner surface. In some embodiments, a coating or film is located on the outside of the chamber to produce the reflective surface. In some embodiments, a coating or film is located on the inside of the chamber to produce the reflective surface. In some embodiments, the reflective surface is a structure or optical element that is distinct from the inner surface of the chamber.

The light source can include an optical element disposed along a path the electromagnetic energy from the laser travels. In some embodiments, the optical element is adapted to provide electromagnetic energy from the laser to the plasma over a large solid angle. In some embodiments, the reflective surface of the chamber is adapted to provide electromagnetic energy from the laser to the plasma over a large solid angle. In some embodiments, the reflective surface of the chamber is adapted to collect the high brightness light generated by the plasma over a large solid angle. In some embodiments, one or more of the reflective surface, reflector and the window include (e.g., are coated or include) a material to filter predefined wavelengths (e g, infrared wavelengths of electromagnetic energy) of electromagnetic energy.

The invention, in another aspect, features a light source that includes a chamber that has a reflective surface. The light source also includes an ignition source for ionizing a gas within the chamber. The light source also includes at least one laser external to the chamber for providing electromagnetic energy to the ionized gas within the chamber to produce a plasma that generates a high brightness light. The light source also includes a reflector positioned along a path that the electromagnetic energy travels from the at least one laser to the reflective surface of the chamber.

In some embodiments, the reflector is adapted to at least substantially reflect a first set of predefined wavelengths of electromagnetic energy directed toward the reflector and at least substantially allow a second set of predefined wavelengths of electromagnetic energy to pass through the reflector.

The invention, in another aspect, relates to a method for producing light. The method involves ionizing with an ignition source a gas within a chamber that has a reflective surface. The method also involves providing laser energy to the ionized gas in the chamber to produce a plasma that generates a high brightness light.

In some embodiments, the method involves directing the laser energy comprising a first set of wavelengths of electromagnetic energy through a reflector toward the reflective surface of the chamber, the reflective surface reflecting at least a portion of the first set of wavelengths of electromagnetic energy toward the plasma. In some embodiments, the method involves directing at least a portion of the high brightness light toward the reflective surface of the chamber which is reflected toward the reflector and is reflected by the reflector toward a tool.

In some embodiments, the method involves directing the laser energy comprising a first set of wavelengths of electromagnetic energy toward the reflector, the reflector reflects at least a portion of the first wavelengths of electromagnetic energy toward the reflective surface of the chamber, the reflective surface directs a portion of the first set of wavelengths of electromagnetic energy toward the plasma. In some embodiments, the method involves directing a portion of the high brightness light toward the reflective surface of the chamber which is reflected toward the reflector and, electromagnetic energy comprising the second set of predefined wavelengths of electromagnetic energy passes through the reflector.

The method can involve directing the laser energy through an optical element that modifies a property of the laser energy to direct the laser energy toward the plasma over a large solid angle. In some embodiments, the method involves directing the laser energy through an optical element that modifies a property of the laser energy to direct the laser energy toward the plasma over a solid angle of approximately 0.012 steradians. In some embodiments, the method involves directing the laser energy through an optical element that modifies a property of the laser energy to direct the laser energy toward the plasma over a solid angle of approximately 0.048 steradians. In some embodiments, the method involves directing the laser energy through an optical element that modifies a property of the laser energy to direct the laser energy toward the plasma over a solid angle of greater than about $2\pi$ (about 6.28) steradians. In some embodiments, the reflective surface of the chamber is adapted to provide the laser energy to the plasma over a large solid angle. In some embodiments, the reflective surface of the chamber is adapted to collect the high brightness light generated by the plasma over a large solid angle.

The invention, in another aspect, relates to a method for producing light. The method involves ionizing with an ignition source a gas within a chamber that has a reflective surface. The method also involves directing electromagnetic energy from a laser toward a reflector that at least substantially reflects a first set of wavelengths of electromagnetic energy toward the ionized gas in the chamber to produce a plasma that generates a high brightness light.

In some embodiments, the electromagnetic energy from the laser first is reflected by the reflector toward the reflective surface of the chamber. In some embodiments, the electromagnetic energy directed toward the reflective surface of the chamber is reflected toward the plasma. In some embodiments, a portion of the high brightness light is directed toward the reflective surface of the chamber, reflected toward the reflector and passes through the reflector.

In some embodiments, the electromagnetic energy from the laser first passes through the reflector and travels toward the reflective surface of the chamber. In some embodiments, the electromagnetic energy directed toward the reflective surface of the chamber is reflected toward the plasma. In some embodiments, a portion of the high brightness light is directed toward the reflective surface of the chamber, reflected toward the reflector and reflected by the reflector.

The invention, in another aspect, features a light source that includes a chamber having a reflective surface. The light source also includes a means for ionizing a gas within the chamber. The light source also includes a means for at least substantially reflecting a first set of predefined wavelengths of electromagnetic energy directed toward the reflector and at least substantially allowing a second set of predefined wavelengths of electromagnetic energy to pass through the reflector. The light source also includes a means for providing electromagnetic energy to the ionized gas within the chamber to produce a plasma that generates a high brightness light.

The invention, in another aspect, features a light source that includes a sealed chamber. The light source also includes an ignition source for ionizing a gas within the chamber. The light source also includes at least one laser external to the sealed chamber for providing electromagnetic energy to the ionized gas within the chamber to produce a plasma that generates a high brightness light. The light source also includes a curved reflective surface disposed external to the sealed chamber to receive at least a portion of the high brightness light emitted by the sealed chamber and reflect the high brightness light toward an output of the light source.

In some embodiments, the light source includes an optical element disposed along a path the electromagnetic energy from the laser travels. In some embodiments, the sealed chamber includes a support element that locates the sealed chamber relative to the curved reflective surface. In some embodiments, the sealed chamber is a quartz bulb. In some embodiments, the light source includes a second curved reflective surface disposed internal or external to the sealed chamber to receive at least a portion of the laser electromagnetic energy and focus the electromagnetic energy on the plasma that generates the high brightness light.

The invention, in another aspect, features a light source that includes a sealed chamber and an ignition source for ionizing a gas within the chamber. The light source also includes at least one laser external to the sealed chamber for providing electromagnetic energy. The light source also includes a curved reflective surface to receive and reflect at least a portion of the electromagnetic energy toward the ionized gas within the chamber to produce a plasma that generates a high brightness light, the curved reflective surface also receives at least a portion of the high brightness light emitted by the plasma and reflects the high brightness light toward an output of the light source.

In some embodiments, the curved reflective surface focuses the electromagnetic energy on a region in the chamber where the plasma is located. In some embodiments, the curved reflective surface is located within the chamber. In some embodiments, the curved reflective surface is located external to the chamber. In some embodiments, the high brightness light is ultraviolet light, includes ultraviolet light or is substantially ultraviolet light.

The invention, in another aspect, features a light source that includes a chamber. The light source also includes an energy source for providing energy to a gas within the chamber to produce a plasma that generates a light emitted through the walls of the chamber. The light source also includes a reflector that reflects the light emitted through the walls of the chamber. The reflector includes a reflective surface with a shape configured to compensate for the refractive index of the walls of the chamber. The shape can include a modified parabolic, elliptical, spherical, or aspherical shape.

In some embodiments, the energy source is at least one laser external to the chamber. In some embodiments, the energy source is also an ignition source within the chamber. The energy source can be a microwave energy source, an AC arc source, a DC arc source, a laser, or an RF energy source. The energy source can be a pulse laser, a continuous-wave fiber laser, or a diode laser.

In some embodiments, the chamber is a sealed chamber. The chamber can include a cylindrical tube. In some embodiments, the cylindrical tube is tapered. The chamber can include one or more seals at one or both ends of the cylindrical tube. The chamber can include sapphire, quartz, fused quartz, Suprasil quartz, fused silica, Suprasil fused silica, $MgF_2$, diamond, single crystal quartz, or $CaF_2$. The chamber can include a dielectric material. The chamber can include an ultraviolet transparent dielectric material. The chamber can protrude through an opening in the reflector.

In some embodiments, the light source also includes an ignition source for ionizing the gas within the chamber. The ignition source can include electrodes, an ultraviolet ignition source, a capacitive ignition source, an inductive ignition source, a flash lamp, a pulsed laser, or a pulsed lamp. The ignition source can include electrodes located on opposite sides of the plasma.

In some embodiments, the light source also includes a support element that locates the chamber relative to the reflector. The support element can include a fitting to allow at least one of pressure control or filling of the chamber.

In some embodiments, the light source includes at least one optical element. The optical element can modify a property of the light emitted through the walls of the chamber and reflected by the reflector. The optical element can be a mirror or a lens. The optical element can be configured to deliver the light emitted through the walls of the chamber and reflected by the reflector to a tool (e.g. a wafer inspection tool, a microscope, an ultraviolet microscope, a reticle inspection system, a metrology tool, a lithography tool, or an endoscopic tool).

The invention, in another aspect, features a method for producing light. The method involves emitting a light through the walls of a chamber. The method also involves using a reflective surface of a reflector to reflect the light, wherein the reflective surface has a shape configured to compensate for the refractive index of the walls of the chamber.

In some embodiments, the method also involves flowing gas into the chamber. In some embodiments, the method also involves igniting the gas in the chamber to produce an ionized gas. In some embodiments, the method also involves directing energy to the ionized gas to produce a plasma that generates a light (e.g. a high brightness light). In some embodiments, the method also involves directing laser energy into the chamber from at least one laser external to the chamber. In some embodiments, the method also involves directing the laser energy through an optical element that modifies a property of the laser energy. In some embodiments, the method also involves directing the reflected light through an optical element to modify a property of the reflected light. In some embodiments, the method also involves directing the reflected light to a tool. In some embodiments, the method also involves controlling the pressure of the chamber.

In some embodiments, the method also involves expressing the shape as a mathematical equation. In some embodiments, the method also involves selecting parameters of the equation to reduce error due to the refractive index of the walls of the chamber below a specified value. In some embodiments, the method also involves configuring the shape to compensate for the refractive index of the walls of the chamber. In some embodiments, the method also involves producing a collimated or focused beam of reflected light with the reflective surface. In some embodiments, the method also involves modifying a parabolic, elliptical, spherical, or aspherical shape to compensate for the refractive index of the walls of the chamber to produce a focused, reflected high brightness light.

The invention, in another aspect, features a light source including a chamber. The light source also includes a laser source for providing electromagnetic energy to a gas within the chamber to produce a plasma that generates a light emitted through the walls of the chamber. The light source also includes a reflector that reflects the electromagnetic energy through the walls of the chamber and the light emitted through the walls of the chamber, the reflector includes a reflective surface with a shape configured to compensate for the refractive index of the walls of the chamber.

The invention, in another aspect, features a light source having a chamber. The light source also includes means for providing energy to a gas within the chamber to produce a plasma that generates a light emitted through the walls of the chamber. The light source also includes means for reflecting the light emitted through the walls of the chamber, the reflecting means including a reflective surface with a shape configured to compensate for the refractive index of the walls of the chamber.

The invention, in another aspect, features a light source having a chamber. The light source also includes an ignition source for ionizing a medium (e.g., a gas) within the chamber. The light source also includes a laser for providing energy to the ionized medium within the chamber to produce a light. The light source also includes a blocker suspended along a path the energy travels to block at least a portion of the energy.

In some embodiments, the blocker deflects energy provided to the ionized medium that is not absorbed by the ionized medium away from an output of the light source. In some embodiments, the blocker is a mirror.

In some embodiments, the blocker absorbs the energy provided to the ionized medium that is not absorbed by the ionized medium. The blocker can include graphite.

In some embodiments, the blocker reflects energy provided to the ionized medium that is not absorbed by the ionized medium. In some embodiments, the reflected energy is reflected toward the ionized medium in the chamber. In some embodiments, the blocker is a coating on a portion of the chamber.

In some embodiments, the light source includes a coolant channel disposed in the blocker. In some embodiments, the light source includes a coolant supply (e.g., for supplying coolant, for example, water) coupled to the coolant channel. In some embodiments, light source includes a gas source that blows a gas (e.g., nitrogen or air) on the blocker to cool the blocker.

In some embodiments, the light source includes an arm connecting the blocker to a housing of the light source.

In some embodiments, the energy provided by the laser enters the chamber on a first side of the chamber and the blocker is suspended on a second side of the chamber opposite the first side.

The invention, in another aspect, relates to a method for producing light. The method involves ionizing with an ignition source a medium within a chamber. The method also involves providing laser energy to the ionized medium in the chamber to produce a light. The method also involves blocking energy provided to the ionized medium that is not absorbed by the ionized medium with a blocker suspended along a path the energy travels.

In some embodiments, blocking the energy involves deflecting the energy away from an output of the light source. In some embodiments, the blocker includes a mirror. In some embodiments, blocking the energy includes absorbing the energy. In some embodiments, blocking the energy includes reflecting the energy. In some embodiments, reflecting the energy includes reflecting the energy towards the ionized medium in the chamber.

In some embodiments, the method also involves cooling the blocker. In some embodiments, cooling the blocker includes flowing a coolant through a channel in or coupled to the blocker. In some embodiments, the method involves blowing a gas on the blocker to cooler the blocker.

The invention, in another aspect, relates to a method for producing light. The method involves ionizing with an ignition source a gas within a chamber. The method also involves providing laser energy to the ionized gas in the chamber at a pressure of greater than 10 atmospheres to produce a high brightness light.

In some embodiments, the gas within the chamber is at a pressure of greater than 30 atmospheres. In some embodiments, the gas within the chamber is at a pressure of greater than 50 atmospheres. In some embodiments, the high brightness light is emitted from a plasma having a volume of about 0.01 mm$^3$.

The invention, in another aspect, relates to a light source having a chamber with a gas disposed therein, and ignition source and at least one laser. The ignition source excites the gas. The excited gas has at least one strong absorption line at an infrared wavelength. The at least one laser provides energy to the excited gas at a wavelength near a strong absorption line of the excited gas within the chamber to produce a high brightness light.

In some embodiments, the gas comprises a noble gas. The gas can comprise xenon. In some embodiments, the excited gas comprises atoms at a lowest excited state. The gas can be absorptive near the wavelength of the at least one laser. The strong absorption line of the excited gas can be about 980 nm or about 882 nm. In some embodiments, the excited gas is in a metastable state.

The invention, in another aspect, relates to a method for producing light. An ignition source excites a gas within a chamber. A laser is tuned to a first wavelength to provide energy to the excited gas in the chamber to produce a high brightness light. The excited gas absorbs energy near the first wavelength. The laser is tuned to a second wavelength to provide energy to the excited gas in the chamber to maintain the high brightness light. The excited gas absorbs energy near the second wavelength.

In some embodiments, the laser is tuned to the first and second wavelengths by adjusting the operating temperature of the laser. In some embodiments, the laser is a diode laser and the laser is tuned approximately 0.4 nm per degree Celsius of temperature adjustment. The operating temperature of the laser can be adjusted by varying a current of a thermoelectric cooling device.

The gas within the chamber can have atoms with electrons in at least one excited atomic state. The gas within chamber can be a noble gas, and in some embodiments, the gas within the chamber is xenon.

In some embodiments, the first wavelength is approximately 980 nm. The second wavelength can be approximately 975 nm. The second wavelength can be approximately 1 nm to approximately 10 nm displaced from the first wavelength. The invention, in another aspect, relates to a light source. The light source includes a chamber having one or more walls and a gas disposed within the chamber. The light source also includes at least one laser for providing a converging beam of energy focused on the gas within the chamber to produce a plasma that generates a light emitted through the walls of the chamber, such that a numerical aperture of the converging beam of energy is between about 0.1 to about 0.8. In some embodiments, the numerical aperture is about 0.4 to about 0.6. The numeral aperture can be about 0.5.

The light source can also include an optical element within a path of the beam. The optical element can be capable of increasing the numerical aperture of the beam. In some embodiments, the optical element is a lens or a mirror. The lens can be an aspheric lens. In some embodiments, a spectral radiance of the plasma increases with an increase in numerical aperture of the beam.

The invention, in another aspect, relates to a method of pre-aligning a bulb for a light source. The bulb, having two electrodes, is coupled to a mounting base. The bulb and mounting base structure are inserting into a camera assembly. The camera assembly includes at least one camera and a display screen. At least one image of the bulb from the at least one camera is displays on the display screen. A position of the bulb within the mounted base is adjusted such that a region of the bulb between the two electrodes aligns with a positioning grid on the display screen.

In some embodiments, a lamp for a light source is pre-aligned using the method described herein.

In some embodiments, the method also includes toggling between the at least two cameras to align the bulb. The camera assembly can include two cameras. Images from the two cameras can be displayed in different colors. In some embodiments, the two cameras are positioned to capture images of the bulb from two orthogonal directions.

The position of the bulb can be adjusted vertically and horizontally. The position of the bulb can be adjusted by a manipulator. The manipulator can be positioned above the bulb and can be capable of moving the bulb vertically and horizontally.

The method can also include securing the bulb to a base after the region of the bulb between the two electrodes aligns with the positioning grid on the display screen. In some embodiments, the positioning grid is pre-determined such that when the center area of the bulb between the two electrodes aligns with the positioning grid on the display screen, the region is aligned relative to a focal point of a laser when the bulb and mounting base are inserted into a light source.

The invention, in another aspect, relates to a method for decreasing noise within a light source. The light source includes a laser. A sample of light emitted from the light source is collected. The sample of light is converted to an electrical signal. The electrical is compared to a reference signal to obtain an error signal. The error signal is processed to obtain a control signal. A magnitude of a laser of the light source is set based on the control signal to decrease noise within the light source. These steps can be repeated until a desired amount of noise is reached.

In some embodiments, the sample of light emitted from the light source is collected from a beam splitter. The beam splitter can be a glass beam splitter or a bifurcated fiber bundle.

In some embodiments, the error signal is the difference between the reference sample and the converted sample. The error signal can be processed by a control amplifier. The control amplifier is capable of outputting a control signal proportional to at least one of a time integral, a time derivative, or a magnitude of the error signal.

The sample can be collected using a photodiode. In some embodiments, the sample is collected using a photodiode within a casing of the light source. In some embodiments, the sample is collected using a photodiode external to a casing of the light source. In some embodiments, two samples are collected. One sample can be collected using a first photodiode within a casing of the light source and another sample can be collected using a second photodiode external to the casing of the light source.

The invention, in another aspect, relates to a light source. The light source includes a chamber having one or more walls and a gas disposed within the chamber. The light source also includes at least one laser for providing energy to the gas within the chamber to produce a plasma that generates a light emitted through the walls of the chamber. A dichroic mirror is positioned within a path of the at least one laser such that the laser energy is directed toward the plasma. The dichroic mirror selectively reflects at least one wavelength of light such that the light generated by the plasma is not substantially reflected toward the at least one laser.

The invention, in another aspect, relates to a light source. The light source has a chamber with a gas disposed therein and an ignition source for exciting the gas. The light source also has at least one laser for providing energy to the excited gas within the chamber to produce a high brightness light having a first spectrum. An optical element is disposed within the path of the high brightness light to modify the first spectrum of the high brightness light to a second spectrum.

The optical element can be a prism, a weak lens, a strong lens, or a dichroic filter. In some embodiments, the second spectrum has a greater proportion of intensity of light in the ultraviolet range than the first spectrum. In some embodiments, the first spectrum has a greater proportion of intensity of light in the visible range than the second spectrum.

The invention, in another aspect, relates to a method for decreasing noise of a light source within a predetermined frequency band. The light source includes a laser diode. A current of the laser diode is modulated at a frequency greater than the predetermined frequency band causing the laser to rapidly switch between different sets of modes to decrease noise of the light source within the predetermined frequency band.

The foregoing and other objects, aspects, features, and advantages of the invention will become more apparent from the following description and from the claims.

BRIEF DESCRIPTION OF THE DRAWINGS

The foregoing and other objects, feature and advantages of the invention, as well as the invention itself, will be more fully understood from the following illustrative description, when read together with the accompanying drawings which are not necessarily to scale.

FIG. 15A is a cross-sectional view of a light source, according to an illustrative embodiment of the invention.

DETAILED DESCRIPTION OF ILLUSTRATIVE EMBODIMENTS

Figure 1:
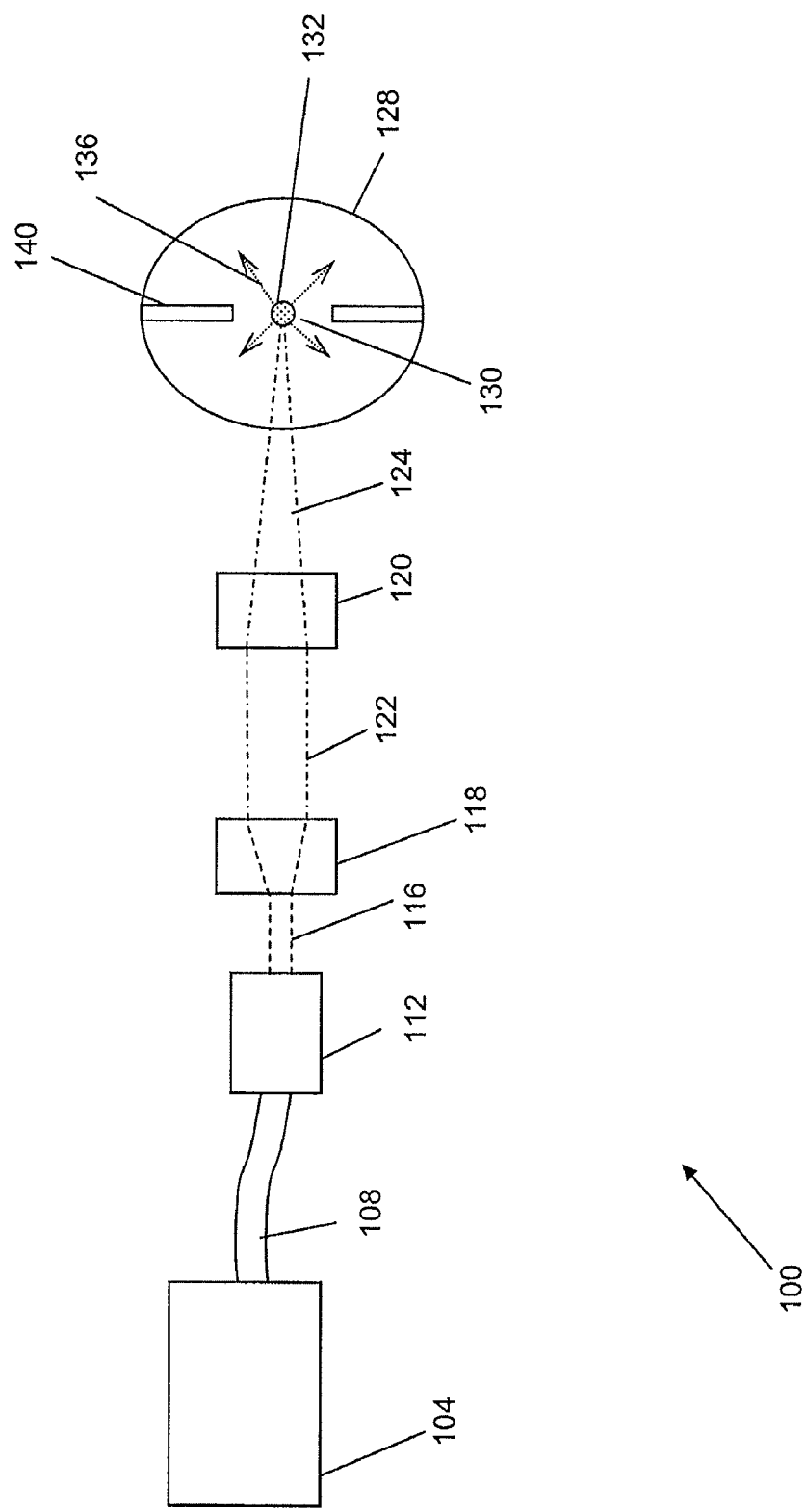
FIG. 1 is a schematic block diagram of a light source, according to an illustrative embodiment of the invention.

FIG. 1 is a schematic block diagram of a light source 100 for generating light that embodies the invention. The light source 100 includes a chamber 128 that contains an ionizable medium (not shown). The light source 100 provides energy to a region 130 of the chamber 128 having the ionizable medium which creates a plasma 132. The plasma 132 generates and emits a high brightness light 136 that originates from the plasma 132. The light source 100 also includes at least one laser source 104 that generates a laser beam that is provided to the plasma 132 located in the chamber 128 to initiate and/or sustain the high brightness light 136.

In some embodiments, it is desirable for at least one wavelength of electromagnetic energy generated by the laser source 104 to be strongly absorbed by the ionizable medium in order to maximize the efficiency of the transfer of energy from the laser source 104 to the ionizable medium.

In some embodiments, it is desirable for the plasma 132 to be small in size in order to achieve a high brightness light source. Brightness is the power radiated by a source of light per unit surface area into a unit solid angle. The brightness of the light produced by a light source determines the ability of a system (e.g., a metrology tool) or an operator to see or measure things (e.g., features on the surface of a wafer) with adequate resolution. It is also desirable for the laser source 104 to drive and/or sustain the plasma with a high power laser beam.

Generating a plasma 132 that is small in size and providing the plasma 132 with a high power laser beam leads simultaneously to a high brightness light 136. The light source 100 produces a high brightness light 136 because most of the power introduced by the laser source 104 is then radiated from a small volume, high temperature plasma 132. The plasma 132 temperature will rise due to heating by the laser beam until balanced by radiation and other processes. The high temperatures that are achieved in the laser sustained plasma 132 yield increased radiation at shorter wavelengths of electromagnetic energy, for example, ultraviolet energy. In one experiment, temperatures between about 10,000 K and about 20,000 K have been observed. The radiation of the plasma 132, in a general sense, is distributed over the electromagnetic spectrum according to Planck's radiation law. The wavelength of maximum radiation is inversely proportional to the temperature of a black body according to Wien's displacement law. While the laser sustained plasma is not a black body, it behaves similarly and as such, the highest brightness in the ultraviolet range at around 300 nm wavelength is expected for laser sustained plasmas having a temperature of between about 10,000 K and about 15,000 K. Most conventional arc lamps are, however, unable to operate at these temperatures.

It is therefore desirable in some embodiments of the invention to maintain the temperature of the plasma 132 during operation of the light source 100 to ensure that a sufficiently bright light 136 is generated and that the light emitted is substantially continuous during operation.

In this embodiment, the laser source 104 is a diode laser that outputs a laser beam via a fiberoptic element 108. The fiber optic element 108 provides the laser beam to a collimator 112 that aids in conditioning the output of the diode laser by aiding in making laser beam rays 116 substantially parallel to each other. The collimator 112 then directs the laser beam 116 to a beam expander 118. The beam expander 118 expands the size of the laser beam 116 to produce laser beam 122. The beam expander 118 also directs the laser beam 122 to an optical lens 120. The optical lens 120 is configured to focus the laser beam 122 to produce a smaller diameter laser beam 124 that is directed to the region 130 of the chamber 128 where the plasma 132 exists (or where it is desirable for the plasma 132 to be generated and sustained).

In this embodiment, the light source 100 also includes an ignition source 140 depicted as two electrodes (e.g., an anode and cathode located in the chamber 128). The ignition source 140 generates an electrical discharge in the chamber 128 (e.g., the region 130 of the chamber 128) to ignite the ionizable medium. The laser then provides laser energy to the ionized medium to sustain or create the plasma 132 which generates the high brightness light 136. The light 136 generated by the light source 100 is then directed out of the chamber to, for example, a wafer inspection system (not shown).

Alternative laser sources are contemplated according to illustrative embodiments of the invention. In some embodiments, neither the collimator 112, the beam expander 118, or the lens 120 may be required. In some embodiments, additional or alternative optical elements can be used. The laser source can be, for example, an infrared (IR) laser source, a diode laser source, a fiber laser source, an ytterbium laser source, a $CO_2$ laser source, a YAG laser source, or a gas discharge laser source. In some embodiments, the laser source 104 is a pulse laser source (e.g., a high pulse rate laser source) or a continuous wave laser source. Fiber lasers use laser diodes to pump a special doped fiber which then lasers to produce the output (i.e., a laser beam). In some embodiments, multiple lasers (e.g., diode lasers) are coupled to one or more fiber optic elements (e.g., the fiber optic element 108). Diode lasers take light from one (or usually many) diodes and direct the light down a fiber to the output. In some embodiments, fiber laser sources and direct semiconductor laser sources are desirable for use as the laser source 104 because they are relatively low in cost, have a small form factor or package size, and are relatively high in efficiency.

Efficient, cost effective, high power lasers (e.g., fiber lasers and direct diode lasers) are recently available in the NIR (near infrared) wavelength range from about 700 nm to about 2000 nm. Energy in this wavelength range is more easily transmitted through certain materials (e.g., glass, quartz and sapphire) that are more commonly used to manufacture bulbs, windows and chambers. It is therefore more practical now to produce light sources that operate using lasers in the 700 nm to 2000 nm range than has previously been possible.

In some embodiments, the laser source 104 is a high pulse rate laser source that provides substantially continuous laser energy to the light source 100 sufficient to produce the high brightness light 136. In some embodiments, the emitted high brightness light 136 is substantially continuous where, for example, magnitude (e.g. brightness or power) of the high brightness light does not vary by more than about 90% during operation. In some embodiments, the ratio of the peak power of the laser energy delivered to the plasma to the average power of the laser energy delivered to the plasma is approximately 2-3. In some embodiments, the substantially continuous energy provided to the plasma 132 is sufficient to minimize cooling of the ionized medium to maintain a desirable brightness of the emitted light 136.

In this embodiment, the light source 100 includes a plurality of optical elements (e.g., a beam expander 118, a lens 120, and fiber optic element 108) to modify properties (e.g., diameter and orientation) of the laser beam delivered to the chamber 132. Various properties of the laser beam can be modified with one or more optical elements (e.g., mirrors or lenses). For example, one or more optical elements can be used to modify the portions of, or the entire laser beam diameter, direction, divergence, convergence, numerical aperture and orientation. In some embodiments, optical elements modify the wavelength of the laser beam and/or filter out certain wavelengths of electromagnetic energy in the laser beam.

Lenses that can be used in various embodiments of the invention include, aplanatic lenses, achromatic lenses, single element lenses, and fresnel lenses. Mirrors that can be used in various embodiments of the invention include, coated mirrors, dielectric coated mirrors, narrow band mirrors, and ultraviolet transparent infrared reflecting mirrors. By way of example, ultraviolet transparent infrared reflecting mirrors are used in some embodiments of the invention where it is desirable to filter out infrared energy from a laser beam while permitting ultraviolet energy to pass through the mirror to be delivered to a tool (e.g., a wafer inspection tool, a microscope, a lithography tool or an endoscopic tool).

In this embodiment, the chamber 128 is a sealed chamber initially containing the ionizable medium (e.g., a solid, liquid or gas). In some embodiments, the chamber 128 is instead capable of being actively pumped where one or more gases are introduced into the chamber 128 through a gas inlet (not shown), and gas is capable of exiting the chamber 128 through a gas outlet (not shown). The chamber can be fabricated from or include one or more of, for example, a dielectric material, a quartz material, Suprasil quartz, sapphire, $MgF_2$, diamond or $CaF_2$. The type of material may be selected based on, for example, the type of ionizable medium used and/or the wavelengths of light 136 that are desired to be generated and output from the chamber 128. In some embodiments, a region of the chamber 128 is transparent to, for example, ultraviolet energy. Chambers 128 fabricated using quartz will generally allow wavelengths of electromagnetic energy of as long as about 2 microns to pass through walls of the chamber. Sapphire chamber walls generally allow electromagnetic energy of as long as about 4 microns to pass through the walls.

In some embodiments, it is desirable for the chamber 128 to be a sealed chamber capable of sustaining high pressures and temperatures. For example, in one embodiment, the ionizable medium is mercury vapor. To contain the mercury vapor during operation, the chamber 128 is a sealed quartz bulb capable of sustaining pressures between about 10 to about 200 atmospheres and operating at about 900 degrees centigrade. The quartz bulb also allows for transmission of the ultraviolet light 136 generated by the plasma 132 of the light source 100 through the chamber 128 walls.

Various ionizable media can be used in alternative embodiments of the invention. For example, the ionizable medium can be one or more of a noble gas, Xe, Ar, Ne, Kr, He, $D_2$, $H_2$, $O_2$, $F_2$, a metal halide, a halogen, Hg, Cd, Zn, Sn, Ga, Fe, Li, Na, an excimer forming gas, air, a vapor, a metal oxide, an aerosol, a flowing media, or a recycled media. In some embodiments, a solid or liquid target (not shown) in the chamber 128 is used to generate an ionizable gas in the chamber 128. The laser source 104 (or an alternative laser source) can be used to provide energy to the target to generate the ionizable gas. The target can be, for example, a pool or film of metal. In some embodiments, the target is a solid or liquid that moves in the chamber (e.g., in the form of droplets of a liquid that travel through the region 130 of the chamber 128). In some embodiments, a first ionizable gas is first introduced into the chamber 128 to ignite the plasma 132 and then a separate second ionizable gas is introduced to sustain the plasma 132. In this embodiment, the first ionizable gas is a gas that is more easily ignited using the ignition source 140 and the second ionizable gas is a gas that produces a particular wavelength of electromagnetic energy.

In this embodiment, the ignition source 140 is a pair of electrodes located in the chamber 128. In some embodiments, the electrodes are located on the same side of the chamber 128. A single electrode can be used with, for example, an RF ignition source or a microwave ignition source. In some embodiments, the electrodes available in a conventional arc lamp bulb are the ignition source (e.g., a model USH-200DP quartz bulb manufactured by Ushio (with offices in Cypress, Calif.)). In some embodiments, the electrodes are smaller and/or spaced further apart than the electrodes used in a conventional arc lamp bulb because the electrodes are not required for sustaining the high brightness plasma in the chamber 128.

Various types and configurations of ignition sources are also contemplated, however, that are within the scope of the present invention. In some embodiments, the ignition source 140 is external to the chamber 128 or partially internal and partially external to the chamber 128. Alternative types of ignition sources 140 that can be used in the light source 100 include ultraviolet ignition sources, capacitive discharge ignition sources, inductive ignition sources, RF ignition sources, a microwave ignition sources, flash lamps, pulsed lasers, and pulsed lamps. In one embodiment, no ignition source 140 is required and instead the laser source 104 is used to ignite the ionizable medium and to generate the plasma 132 and to sustain the plasma and the high brightness light 136 emitted by the plasma 132.

In some embodiments, it is desirable to maintain the temperature of the chamber 128 and the contents of the chamber 128 during operation of the light source 100 to ensure that the pressure of gas or vapor within the chamber 128 is maintained at a desired level. In some embodiments, the ignition source 140 can be operated during operation of the light source 100, where the ignition source 140 provides energy to the plasma 132 in addition to the energy provided by the laser source 104. In this manner, the ignition source 140 is used to maintain (or maintain at an adequate level) the temperature of the chamber 128 and the contents of the chamber 128.

In some embodiments, the light source 100 includes at least one optical element (e.g., at least one mirror or lens) for modifying a property of the electromagnetic energy (e.g., the high brightness light 136) emitted by the plasma 132 (e.g., an ionized gas), similarly as described elsewhere herein.

Figure 2:
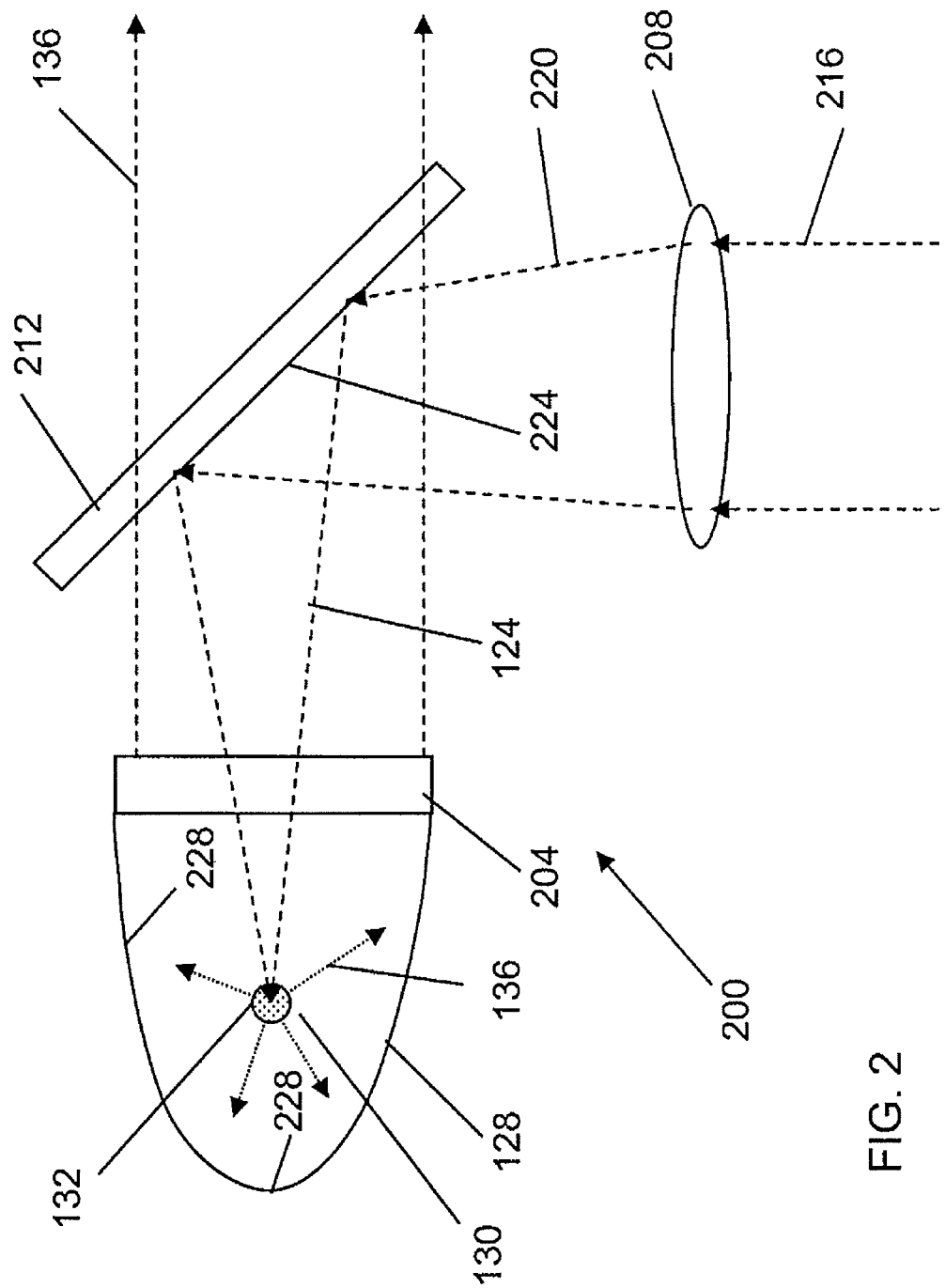
FIG. 2 is a schematic block diagram of a portion of a light source, according to an illustrative embodiment of the invention.

FIG. 2 is a schematic block diagram of a portion of a light source 200 incorporating principles of the present invention. The light source 200 includes a chamber 128 containing an ionizable gas and has a window 204 that maintains a pressure within the chamber 128 while also allowing electromagnetic energy to enter the chamber 128 and exit the chamber 128. In this embodiment, the chamber 128 has an ignition source (not shown) that ignites the ionizable gas (e.g., mercury or xenon) to produce a plasma 132.

A laser source 104 (not shown) provides a laser beam 216 that is directed through a lens 208 to produce laser beam 220. The lens 208 focuses the laser beam 220 on to a surface 224 of a thin film reflector 212 that reflects the laser beam 220 to produce laser beam 124. The reflector 212 directs the laser beam 124 on region 130 where the plasma 132 is located. The laser beam 124 provides energy to the plasma 132 to sustain and/or generate a high brightness light 136 that is emitted from the plasma 132 in the region 130 of the chamber 128.

In this embodiment, the chamber 128 has a paraboloid shape and an inner surface 228 that is reflective. The paraboloid shape and the reflective surface cooperate to reflect a substantial amount of the high brightness light 136 toward and out of the window 204. In this embodiment, the reflector 212 is transparent to the emitted light 136 (e.g., at least one or more wavelengths of ultraviolet light). In this manner, the emitted light 136 is transmitted out of the chamber 128 and directed to, for example, a metrology tool (not shown). In one embodiment, the emitted light 136 is first directed towards or through additional optical elements before it is directed to a tool.

Figure 3:
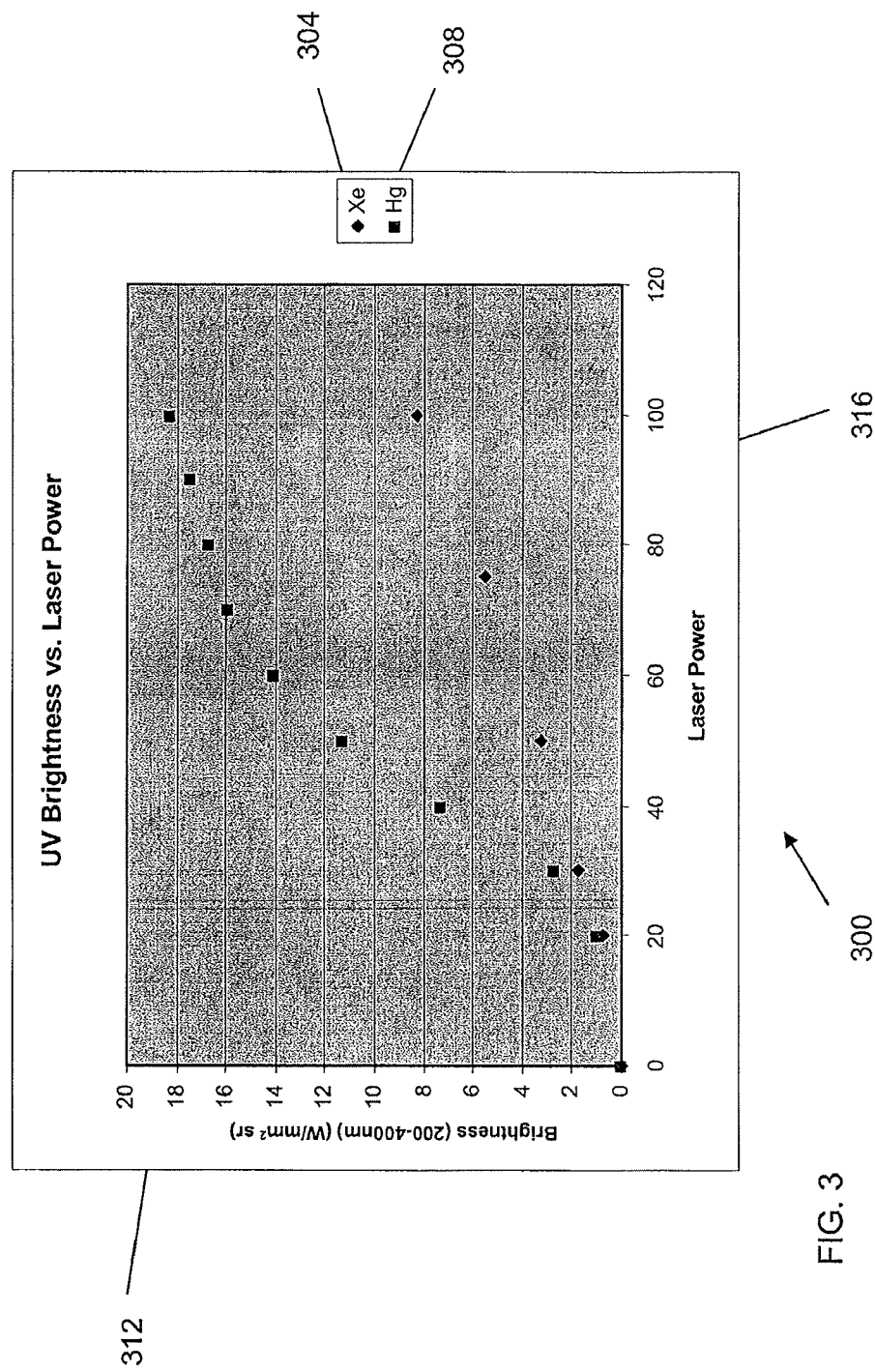
FIG. 3 is a graphical representation of UV brightness as a function of the laser power provided to a plasma, using a light source according to the invention.

By way of illustration, an experiment was conducted to generate ultraviolet light using a light source, according to an illustrative embodiment of the invention. A model L6724 quartz bulb manufactured by Hamamatsu (with offices in Bridgewater, N.J.) was used as the chamber of the light source (e.g., the chamber 128 of the light source 100 of FIG. 1) for experiments using xenon as the ionizable medium in the chamber. A model USH-200DP quartz bulb manufactured by Ushio (with offices in Cypress, Calif.) was used as the chamber of the light source for experiments using mercury as the ionizable medium in the chamber. FIG. 3 illustrates a plot 300 of the UV brightness of a high brightness light produced by a plasma located in the chamber as a function of the laser power (in watts) provided to the plasma. The laser source used in the experiment was a 1.09 micron, 100 watt CW laser. The Y-Axis 312 of the plot 300 is the UV brightness (between about 200 and about 400 nm) in watts/mm$^2$ steradian (sr). The X-Axis 316 of the plot 300 is the laser beam power in watts provided to the plasma. Curve 304 is the UV brightness of the high brightness light produced by a plasma that was generated using xenon as the ionizable medium in the chamber. The plasma in the experiment using xenon was between about 1 mm and about 2 mm in length and about 0.1 mm in diameter. The length of the plasma was controlled by adjusting the angle of convergence of the laser beam. A larger angle (i.e., larger numerical aperture) leads to a shorter plasma because the converging beam reaches an intensity capable of sustaining the plasma when it is closer to the focal point. Curve 308 is the UV brightness of the high brightness light produced by a plasma that was generated using mercury as the ionizable medium in the chamber. The plasma in the experiment using mercury was about 1 mm in length and about 0.1 mm in diameter.

Figure 4:
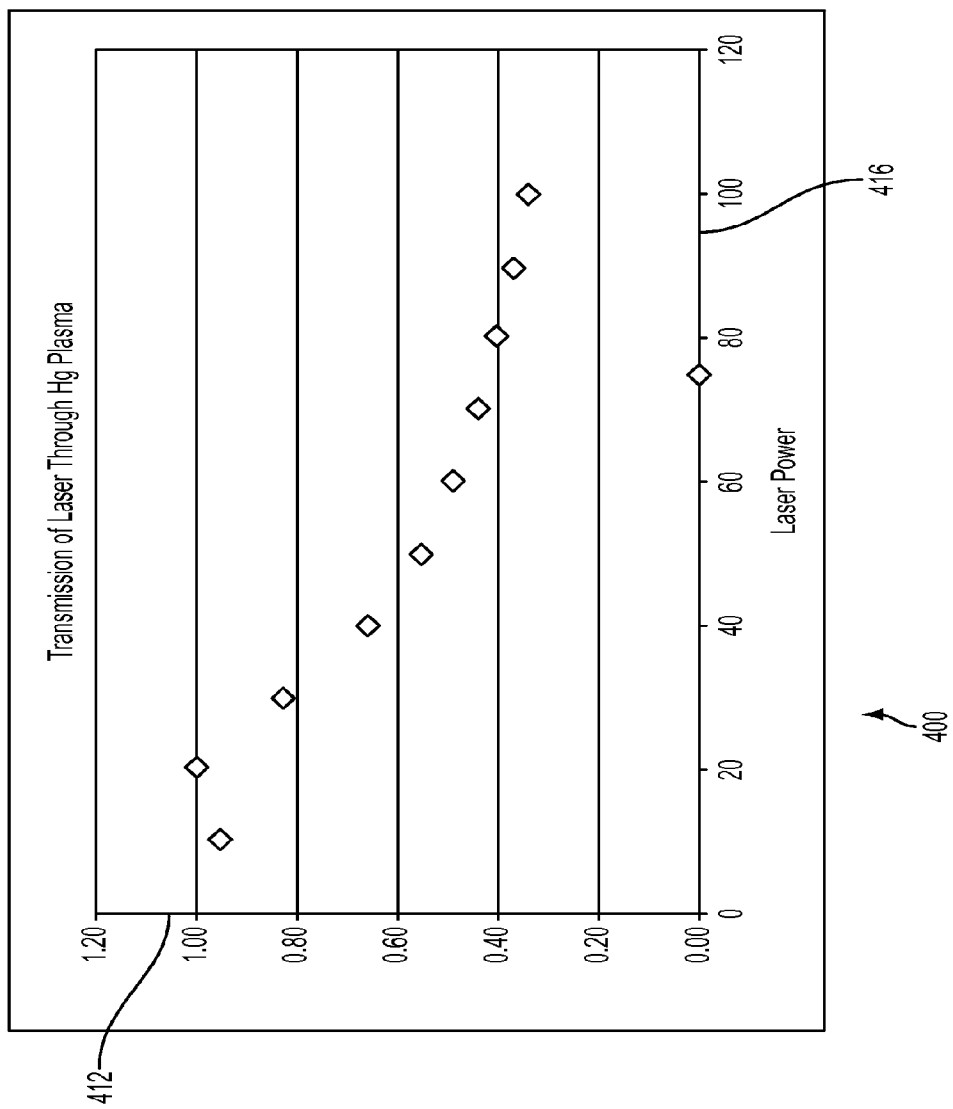
FIG. 4 is a graphical representation of the transmission of laser energy through a plasma generated from mercury, using a light source according to the invention.

By way of illustration, another experiment was conducted to generate ultraviolet using a light source according to an illustrative embodiment of the invention. A model USH-200DP quartz bulb manufactured by Ushio (with offices in Cypress, Calif.) was used as the chamber of the light source for experiments using mercury as the ionizable medium in the chamber (e.g., the chamber 128 of the light source 100 of FIG. 1). The laser source used in the experiment was a 1.09 micron, 100 watt ytterbium doped fiber laser from SPI Lasers PLC (with offices in Los Gatos, Calif.). FIG. 4 illustrates a plot 400 of the transmission of laser energy through a plasma located in the chamber generated from mercury versus the amount of power provided to the plasma in watts. The Y-Axis 412 of the plot 400 is the transmission coefficient in non-dimensional units. The X-Axis 416 of the plot 400 is the laser beam power in watts provided to the plasma. The curve in the plot 400 illustrates absorption lengths of 1 mm were achieved using the laser source. The transmission value of 0.34 observed at 100 watts corresponds to a 1/e absorption length of about 1 mm.

Figure 5:
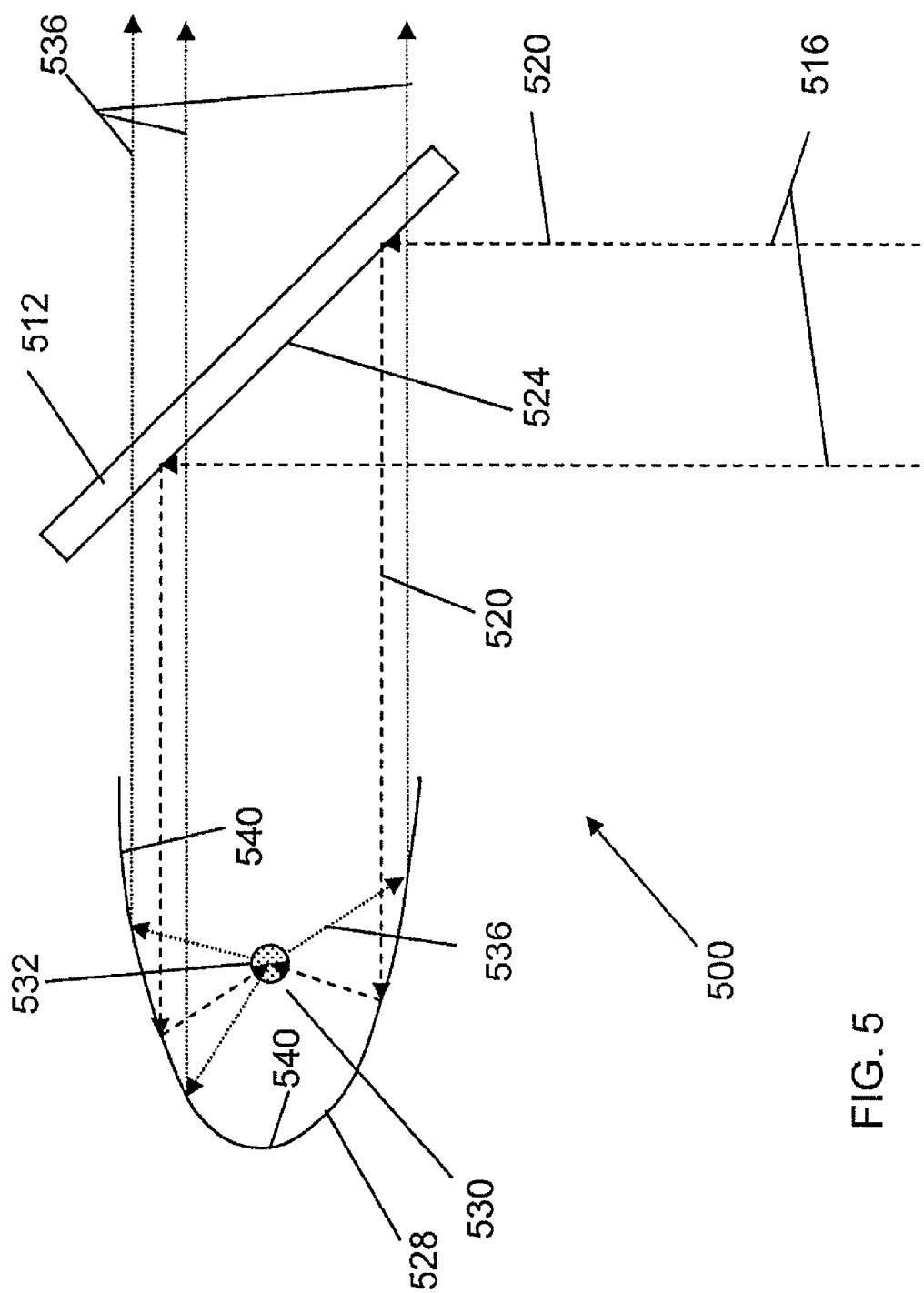
FIG. 5 is a schematic block diagram of a light source, according to an illustrative embodiment of the invention.

FIG. 5 is a schematic block diagram of a portion of a light source 500 incorporating principles of the present invention. The light source 500 includes a chamber 528 that has a reflective surface 540. The reflective surface 540 can have, for example, a parabolic shape, elliptical shape, curved shape, spherical shape or aspherical shape. In this embodiment, the light source 500 has an ignition source (not shown) that ignites an ionizable gas (e.g., mercury or xenon) in a region 530 within the chamber 528 to produce a plasma 532.

In some embodiments, the reflective surface 540 can be a reflective inner or outer surface. In some embodiments, a coating or film is located on the inside or outside of the chamber to produce the reflective surface 540.

A laser source (not shown) provides a laser beam 516 that is directed toward a surface 524 of a reflector 512. The reflector 512 reflects the laser beam 520 toward the reflective surface 540 of the chamber 528. The reflective surface 540 reflects the laser beam 520 and directs the laser beam toward the plasma 532. The laser beam 516 provides energy to the plasma 532 to sustain and/or generate a high brightness light 536 that is emitted from the plasma 532 in the region 530 of the chamber 528. The high brightness light 536 emitted by the plasma 532 is directed toward the reflective surface 540 of the chamber 528. At least a portion of the high brightness light 536 is reflected by the reflective surface 540 of the chamber 528 and directed toward the reflector 512. The reflector 512 is substantially transparent to the high brightness light 536 (e.g., at least one or more wavelengths of ultraviolet light). In this manner, the high brightness light 536 passes through the reflector 512 and is directed to, for example, a metrology tool (not shown). In some embodiments, the high brightness light 536 is first directed towards or through a window or additional optical elements before it is directed to a tool.

In some embodiments, the light source 500 includes a separate, sealed chamber (e.g., the sealed chamber 728 of FIG. 7) located in the concave region of the chamber 528. The sealed chamber contains the ionizable gas that is used to create the plasma 532. In alternative embodiments, the sealed chamber contains the chamber 528. In some embodiments, the sealed chamber also contains the reflector 512.

Figure 6:
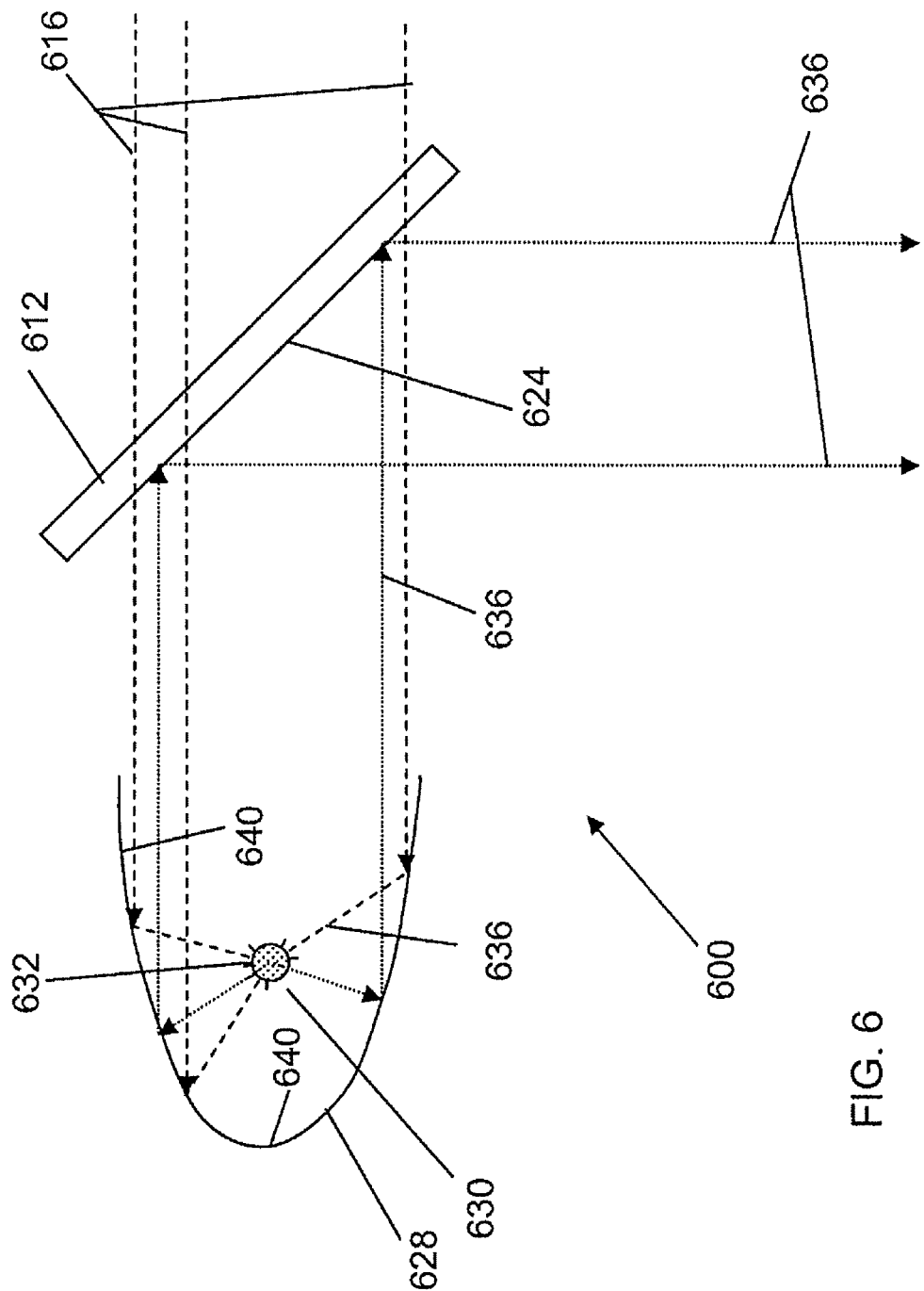
FIG. 6 is a schematic block diagram of a light source, according to an illustrative embodiment of the invention.

FIG. 6 is a schematic block diagram of a portion of a light source 600 incorporating principles of the present invention. The light source 600 includes a chamber 628 that has a reflective surface 640. The reflective surface 640 can have, for example, a parabolic shape, elliptical shape, curved shape, spherical shape or aspherical shape. In this embodiment, the light source 600 has an ignition source (not shown) that ignites an ionizable gas (e.g., mercury or xenon) in a region 630 within the chamber 628 to produce a plasma 632.

A laser source (not shown) provides a laser beam 616 that is directed toward a reflector 612. The reflector 612 is substantially transparent to the laser beam 616. The laser beam 616 passes through the reflector 612 and is directed toward the reflective surface 640 of the chamber 628. The reflective surface 640 reflects the laser beam 616 and directs it toward the plasma 632 in the region 630 of the chamber 628. The laser beam 616 provides energy to the plasma 632 to sustain and/or generate a high brightness light 636 that is emitted from the plasma 632 in the region 630 of the chamber 628. The high brightness light 636 emitted by the plasma 632 is directed toward the reflective surface 640 of the chamber 628. At least a portion of the high brightness light 636 is reflected by the reflective surface 640 of the chamber 628 and directed toward a surface 624 of the reflector 612. The reflector 612 reflects the high brightness light 636 (e.g., at least one or more wavelengths of ultraviolet light). In this manner, the high brightness light 636 (e.g., visible and/or ultraviolet light) is directed to, for example, a metrology tool (not shown). In some embodiments, the high brightness light 636 is first directed towards or through a window or additional optical elements before it is directed to a tool. In some embodiments, the high brightness light 636 includes ultraviolet light. Ultraviolet light is electromagnetic energy with a wavelength shorter than that of visible light, for instance between about 50 nm and 400 nm.

In some embodiments, the light source 600 includes a separate, sealed chamber (e.g., the sealed chamber 728 of FIG. 7) located in the concave region of the chamber 628. The sealed chamber contains the ionizable gas that is used to create the plasma 632. In alternative embodiments, the sealed chamber contains the chamber 628. In some embodiments, the sealed chamber also contains the reflector 612.

Figure 7:
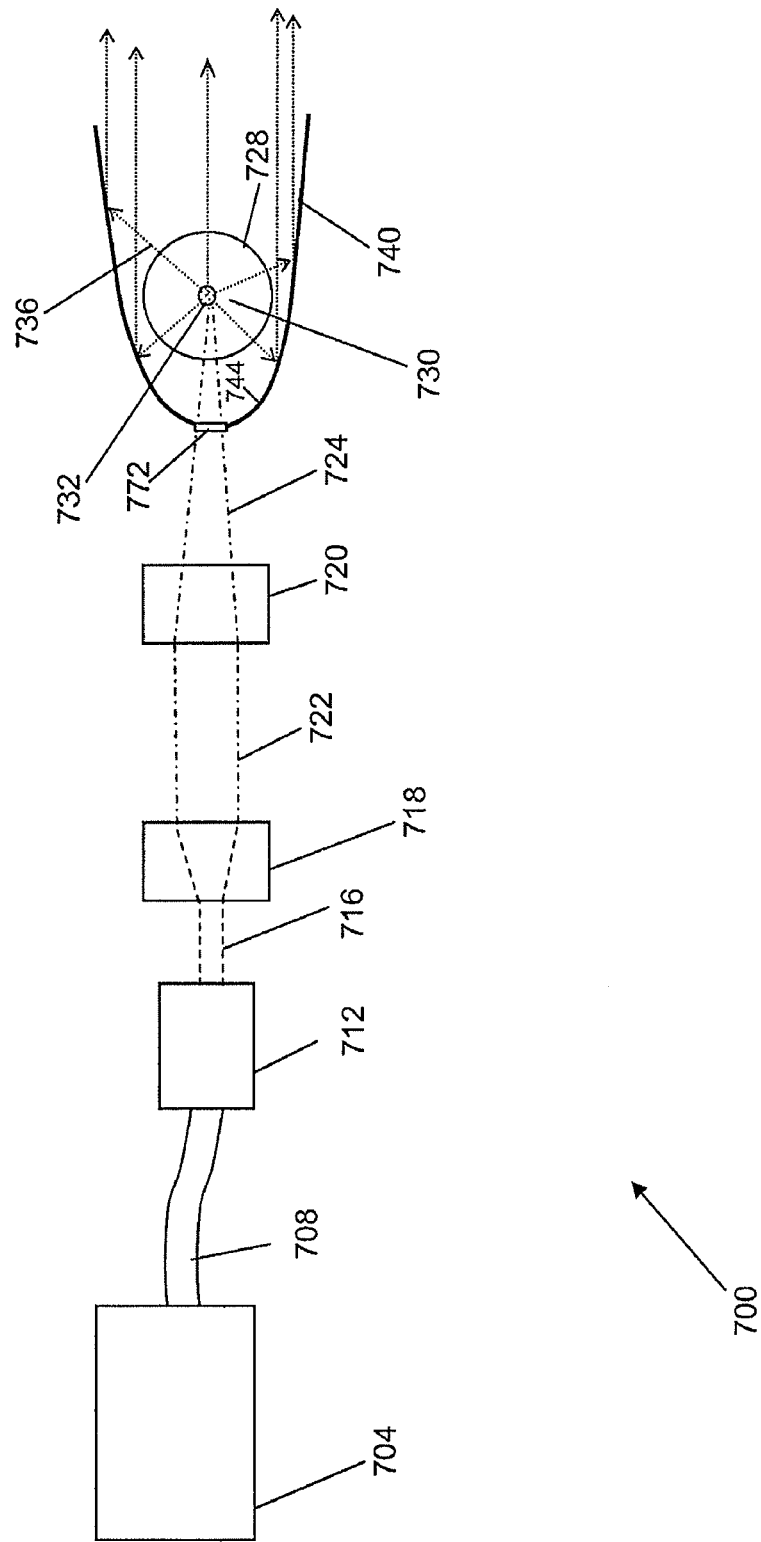
FIG. 7 is a schematic block diagram of a light source, according to an illustrative embodiment of the invention.

FIG. 7 is a schematic block diagram of a light source 700 for generating light that embodies the invention. The light source 700 includes a sealed chamber 728 (e.g., a sealed quartz bulb) that contains an ionizable medium (not shown). The light source 700 provides energy to a region 730 of the chamber 728 having the ionizable medium which creates a plasma 732. The plasma 732 generates and emits a high brightness light 736 that originates from the plasma 732. The light source 700 also includes at least one laser source 704 that generates a laser beam that is provided to the plasma 732 located in the chamber 728 to initiate and/or sustain the high brightness light 736.

In this embodiment, the laser source 704 is a diode laser that outputs a laser beam via a fiberoptic element 708. The fiber optic element 708 provides the laser beam to a collimator 712 that aids in conditioning the output of the diode laser by aiding in making laser beam rays 716 substantially parallel to each other. The collimator 712 then directs the laser beam 716 to a beam expander 718. The beam expander 718 expands the size of the laser beam 716 to produce laser beam 722. The beam expander 718 also directs the laser beam 722 to an optical lens 720. The optical lens 720 is configured to focus the laser beam 722 to produce a smaller diameter laser beam 724. The laser beam 724 passes through an aperture or window 772 located in the base 724 of a curved reflective surface 740 and is directed toward the chamber 728. The chamber 728 is substantially transparent to the laser beam 724. The laser beam 724 passes through the chamber 728 and toward the region 730 of the chamber 728 where the plasma 732 exists (or where it is desirable for the plasma 732 to be generated by the laser 724 and sustained).

In this embodiment, the ionizable medium is ignited by the laser beam 724. In alternative embodiments, the light source 700 includes an ignition source (e.g., a pair of electrodes or a source of ultraviolet energy) that, for example, generates an electrical discharge in the chamber 728 (e.g., the region 730 of the chamber 728) to ignite the ionizable medium. The laser source 704 then provides laser energy to the ionized medium to sustain the plasma 732 which generates the high brightness light 736. The chamber 728 is substantially transparent to the high brightness light 736 (or to predefined wavelengths of electromagnetic radiation in the high brightness light 736). The light 736 (e.g., visible and/or ultraviolet light) generated by the light source 700 is then directed out of the chamber 728 toward an inner surface 744 of the reflective surface 740.

In this embodiment, the light source 700 includes a plurality of optical elements (e.g., a beam expander 718, a lens 720, and fiber optic element 708) to modify properties (e.g., diameter and orientation) of the laser beam delivered to the chamber 732. Various properties of the laser beam can be modified with one or more optical elements (e.g., mirrors or lenses). For example, one or more optical elements can be used to modify the portions of, or the entire laser beam diameter, direction, divergence, convergence, and orientation. In some embodiments, optical elements modify the wavelength of the laser beam and/or filter out certain wavelengths of electromagnetic energy in the laser beam.

Lenses that can be used in various embodiments of the invention include, aplanatic lenses, achromatic lenses, single element lenses, and fresnel lenses. Mirrors that can be used in various embodiments of the invention include, coated mirrors, dielectric coated mirrors, narrow band mirrors, and ultraviolet transparent infrared reflecting mirrors. By way of example, ultraviolet transparent infrared reflecting mirrors are used in some embodiments of the invention where it is desirable to filter out infrared energy from a laser beam while permitting ultraviolet energy to pass through the mirror to be delivered to a tool (e.g., a wafer inspection tool, a microscope, a lithography tool or an endoscopic tool).

Figure 8A:
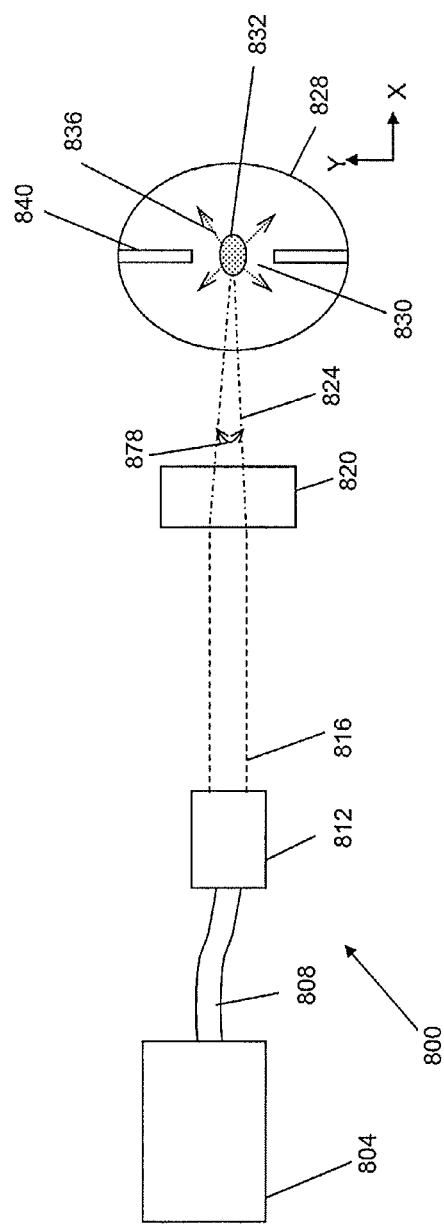
FIG. 8A is a schematic block diagram of a light source in which electromagnetic energy from a laser is provided to a plasma over a first solid angle, according to an illustrative embodiment of the invention.
Figure 8B:
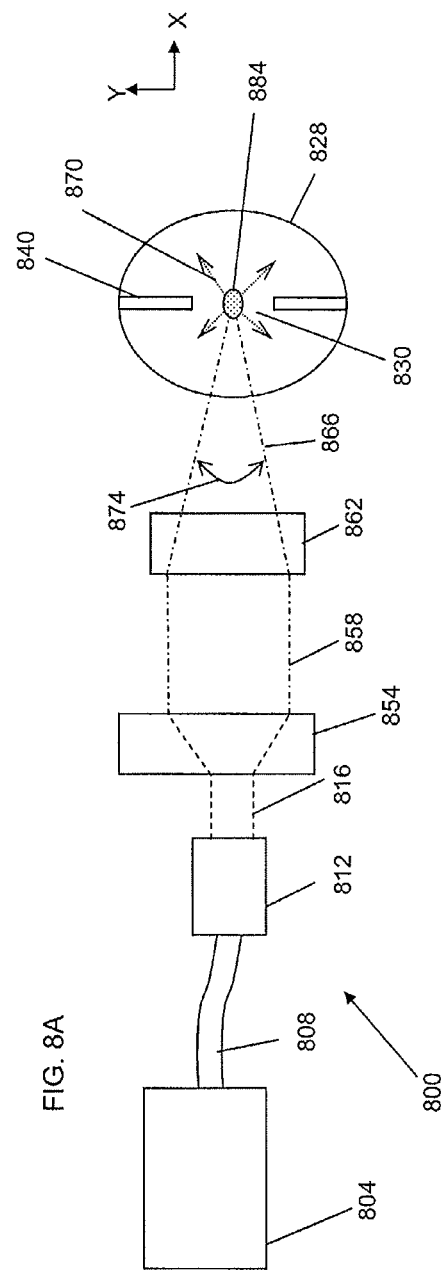
FIG. 8B is a schematic block diagram of the light source of FIG. 8A in which the electromagnetic energy from the laser is provided to the plasma over a larger solid angle, according to an illustrative embodiment of the invention.

FIGS. 8A and 8B are schematic block diagrams of a light source 800 for generating light that embodies the invention. The light source 800 includes a chamber 828 that contains an ionizable medium (not shown). The light source 800 provides energy to a region 830 of the chamber 828 having the ionizable medium which creates a plasma. The plasma generates and emits a high brightness light that originates from the plasma. The light source 800 also includes at least one laser source 804 that generates a laser beam that is provided to the plasma located in the chamber 828 to initiate and/or sustain the high brightness light.

In some embodiments, it is desirable for the plasma to be small in size in order to achieve a high brightness light source. Brightness is the power radiated by a source of light per unit surface area into a unit solid angle. The brightness of the light produced by a light source determines the ability of a system (e.g., a metrology tool) or an operator to see or measure things (e.g., features on the surface of a wafer) with adequate resolution. It is also desirable for the laser source 804 to drive and/or sustain the plasma with a high power laser beam.

Generating a plasma that is small in size and providing the plasma with a high power laser beam leads simultaneously to a high brightness light. The light source 800 produces a high brightness light because most of the power introduced by the laser source 804 is then radiated from a small volume, high temperature plasma. The plasma temperature will rise due to heating by the laser beam until balanced by radiation and other processes. The high temperatures that are achieved in the laser sustained plasma yield increased radiation at shorter wavelengths of electromagnetic energy, for example, ultraviolet energy. In one experiment, temperatures between about 10,000 K and about 20,000 K have been observed. The radiation of the plasma, in a general sense, is distributed over the electromagnetic spectrum according to Planck's radiation law. The wavelength of maximum radiation is inversely proportional to the temperature of a black body according to Wien's displacement law. While the laser sustained plasma is not a black body, it behaves similarly and as such, the highest brightness in the ultraviolet range at around 300 nm wavelength is expected for laser sustained plasmas having a temperature of between about 10,000 K and about 15,000 K. Conventional arc lamps are, however, unable to operate at these temperatures.

It is desirable in some embodiments of the invention to deliver the laser energy to the plasma in the chamber 828 over a large solid angle in order to achieve a plasma that is small in size. Various methods and optical elements can be used to deliver the laser energy over a large solid angle. In this embodiment of the invention, parameters of a beam expander and optical lens are varied to modify the size of the solid angle over which the laser energy is delivered to the plasma in the chamber 828.

Referring to FIG. 8A, the laser source 804 is a diode laser that outputs a laser beam via a fiberoptic element 808. The fiber optic element 808 provides the laser beam to a collimator 812 that aids in conditioning the output of the diode laser by aiding in making laser beam rays 816 substantially parallel to each other. The collimator 812 directs the laser beam 816 to an optical lens 820. The optical lens 820 is configured to focus the laser beam 816 to produce a smaller diameter laser beam 824 having a solid angle 878. The laser beam 824 is directed to the region 830 of the chamber 828 where the plasma 832 exists.

In this embodiment, the light source 800 also includes an ignition source 840 depicted as two electrodes (e.g., an anode and cathode located in the chamber 828). The ignition source 840 generates an electrical discharge in the chamber 828 (e.g., the region 830 of the chamber 828) to ignite the ionizable medium. The laser then provides laser energy to the ionized medium to sustain or create the plasma 832 which generates the high brightness light 836. The light 836 generated by the light source 800 is then directed out of the chamber to, for example, a wafer inspection system (not shown).

FIG. 8B illustrates an embodiment of the invention in which the laser energy is delivered to the plasma in the chamber 828 over a solid angle 874. This embodiment of the invention includes a beam expander 854. The beam expander 854 expands the size of the laser beam 816 to produce laser beam 858. The beam expander 854 directs the laser beam 858 to an optical lens 862. The combination of the beam expander 854 and the optical lens 862 produces a laser beam 866 that has a solid angle 874 that is larger than the solid angle 878 of the laser beam 824 of FIG. 8A. The larger solid angle 874 of FIG. 8B creates a smaller size plasma 884 than the size of the plasma in FIG. 8A. In this embodiment, the size of the plasma 884 in FIG. 8B along the X-axis and Y-axis is smaller than the size of the plasma 832 in FIG. 8A. In this manner, the light source 800 generates a brighter light 870 in FIG. 8B as compared with the light 836 in FIG. 8A.

An experiment was conducted in which a beam expander and optical lens were selected to allow operation of the light source as shown in FIGS. 8A and 8B. A Hamamatsu L2273 xenon bulb (with offices in Bridgewater, N.J.) was used as the sealed chamber 828. The plasma was formed in the Hamamatsu L2273 xenon bulb using an SPI continuous-wave (CW) 100 W, 1090 nm fiber laser (sold by SPI Lasers PLC, with offices in Los Gatos, Calif.)). A continuous-wave laser emits radiation continuously or substantially continuously rather than in short bursts, as in a pulsed laser. The fiber laser 804 contains laser diodes which are used to pump a special doped fiber (within the fiber laser 804, but not shown). The special doped fiber then lasers to produce the output of the fiber laser 804. The output of the fiber laser 804 then travels through the fiberoptic element 808 to the collimeter 812. The collimeter 812 then outputs the laser beam 816. The initial laser beam diameter (along the Y-Axis), corresponding to beam 816 in FIG. 8A, was 5 mm. The laser beam 816 was a Gaussian beam with a 5 mm diameter measured to the $1/e^2$ intensity level. The lens used in the experiment, corresponding to lens 820, was 30 mm in diameter and had a focal length of 40 mm. This produced a solid angle of illumination of the plasma 832 of approximately 0.012 steradians. The length (along the X-Axis) of the plasma 832 produced in this arrangement was measured to be approximately 2 mm. The diameter of the plasma 832 (along the Y-Axis), was approximately 0.05 mm. The plasma 832 generated a high brightness ultraviolet light 836.

Referring to FIG. 8B, a 2X beam expander was used as the beam expander 854. The beam expander 854 expanded beam 816 from 5 mm in diameter (along the Y-Axis) to 10 mm in diameter, corresponding to beam 858. Lens 862 in FIG. 8B was the same as lens 820 in FIG. 8A. The combination of the beam expander 854 and the optical lens 862 produced a laser beam 866 having a solid angle 874 of illumination of approximately 0.048 steradians. In this experiment, the length of the plasma (along the X-Axis) was measured to be approximately 1 mm and the diameter measured along the Y-Axis remained 0.05 mm. This reduction of plasma length by a factor of 2, due to a change in solid angle of a factor of 4, is expected if the intensity required to sustain the plasma at its boundary is a constant. A decrease in plasma length (along the X-Axis) by a factor of 2 (decrease from 2 mm in FIG. 8A to 1 mm in FIG. 8B) resulted in an approximate doubling of the brightness of the radiation emitted by the plasma for a specified laser beam input power because the power absorbed by the plasma is about the same, while the radiating area of the plasma was approximately halved (due to the decrease in length along the X-Axis). This experiment illustrated the ability to make the plasma smaller by increasing the solid angle of the illumination from the laser.

In general, larger solid angles of illumination can be achieved by increasing the laser beam diameter and/or decreasing the focal length of the objective lens. If reflective optics are used for illumination of the plasma, them the solid angle of illumination can become much larger than the experiment described above. For example, in some embodiments, the solid angle of illumination can be greater than about $2\pi$ (about 6.28) steradians when the plasma is surrounded by a deep, curved reflecting surface (e.g., a paraboloid or ellipsoid). Based on the concept that a constant intensity of light is required to maintain the plasma at its surface, in one embodiment (using the same bulb and laser power described in the experiment above) we calculated that a solid angle of 5 steradians would produce a plasma with its length equal to its diameter, producing a roughly spherical plasma.

Figure 9:
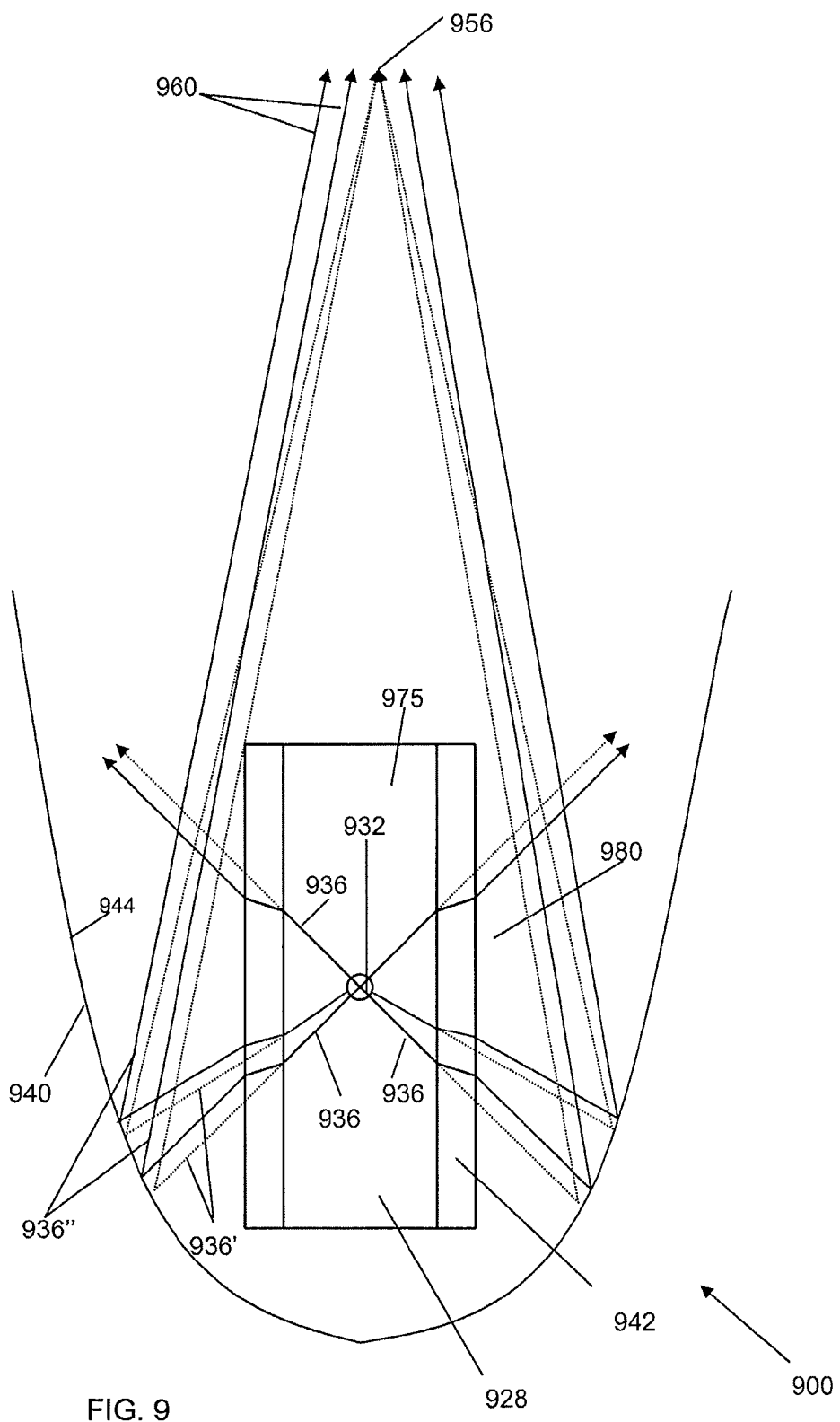
FIG. 9 is a schematic diagram of a light source in which the reflective surface does not compensate for the refractive index of the chamber containing a plasma.

FIG. 9 is a schematic diagram of a light source 900 for generating light. The light source 900 includes a sealed chamber 928 (e.g., a sealed quartz bulb, sealed sapphire tube) that contains an ionizable medium (not shown). The light source 900 also includes an energy source (not shown). The energy source provides energy to a region of the chamber 928 to produce a plasma 932. The plasma 932 generates and emits a light 936 that originates from the plasma 932. The light 936 generated by the light source 900 is directed through the walls 942 of the chamber 928 toward the reflective surface 944 of the reflector 940. The reflective surface 944 reflects the light generated by the light source 900.

The walls 942 of the chamber 928 allow electromagnetic energy (e.g., light) to pass through the walls 942. The refractive index of the walls is a measure for how much the speed of the electromagnetic energy is reduced inside the walls 942. Properties (e.g., the direction of propagation) of the light ray 936 generated by the plasma 932 that is emitted through the walls 942 of the chamber 928 are modified due to the refractive index of the walls 942. If the walls 942 have a refractive index equal to that of the medium 975 internal to the chamber 928 (typically near 1.0), the light ray 936 passes through the walls 942 as light ray 936'. If, however, the walls have a refractive index greater than that of the internal medium 975, the light ray 936 passes through the walls as light ray 936".

The direction of the light represented by light ray 936 is altered as the light ray 936 enters the wall 942 having an index of refraction greater than the medium 975. The light ray 936 is refracted such that the light ray 936 bends toward the normal to the wall 942. The light source 900 has a medium 980 external to the chamber 928. In this embodiment, the medium 980 has an index of refraction equal to the index of refraction of the medium 975 internal to the chamber 928. As the light ray 936 passes out of the wall 942 into the medium 980 external to the chamber 928, the light ray 936 is refracted such that the light ray (as light ray 936") bends away from the normal to the wall 942 when it exits the wall 942 The light ray 936" has been shifted to follow a route parallel to the route the light ray 936' would have followed had the refractive index of the wall 942 been equal to the refractive indices of the internal medium 975 and external medium 980.

This refractive shift of direction and the resulting position of the light ray 936 (and 936' and 936") is described by Snell's Law of Refraction:

$$n_1 \sin \theta_1 = n_2 \sin \theta_2 \qquad \text{EQN. 1}$$

where, according to Snell's Law, $n_1$ is the index of refraction of the medium from which the light is coming, $n_2$ is the index of refraction of the medium into which the light is passing, $\theta_1$ is the angle of incidence (relative to the normal) of the light approaching the boundary between the medium from which the light is coming and the medium into which the light is passing, and $\theta_2$ is the angle of incidence (relative to the normal) of the light departing from the boundary between the medium from which the light is coming and the medium into which the light is passing (Hecht, Eugene, *Optics*, M. A., Addison-Wesley, 1998, p. 99-100, QC355.2.H42).

If the internal medium 975 does not have an index of refraction equal to that of the external medium 980, the light ray 936 refracts to follow a route according to Snell's Law. The route the light ray 936 follows will diverge from the route that light ray 936' follows when the internal medium 975, wall 942, and external medium 980 do not have equal indices of refraction.

If the refractive index of the walls 942 of the chamber 928 is equal to the internal medium 975 and external medium 980, the reflective surface 944 reflects light ray 936' and produces a focused beam of light 956. If, however, the refractive index of the walls 942 is greater than the internal medium 975 and external medium 980, the reflective surface 944 reflects light ray 936" and does not produce a focused beam (the light ray 936" is dispersed producing light 960). Accordingly, it is therefore desirable to have a light source that includes a chamber and a reflective surface with a shape configured to compensate for the effect of the refractive index of the walls of the chamber.

In alternative embodiments, the reflective surface 940 is configured to produce a collimated beam of light when the refractive index of the walls 942 of the chamber 928 is equal to that of the internal medium 975 and external medium 980. However, if the refractive index of the walls 942 of the chamber 928 is greater than that of the internal medium 975 and external medium 980, the reflective surface 940 would produce a non-collimated beam of light (the reflected light would be dispersed, similarly as described above).

In other embodiments, aspects of the invention are used to compensate for the effect of the refractive index of the walls 942 of the chamber 928 for laser energy directed in to the chamber 928. Laser energy is directed toward the reflective surface 944 of the reflector 940. The reflective surface 944 reflects the laser energy through the walls 942 of the chamber 928 toward the plasma 932 in the chamber 928 (similarly as described herein with respect to, for example, FIGS. 5 and 6). If the walls 942 of the chamber 928 have a refractive index greater than that of the internal 975 and external 980 media, the direction of the laser energy is altered as the energy enters the walls 942. In these embodiments, if the reflective surface 944 of the reflector 942 has a shape configured to compensate for the effect of the refractive index of the walls of the chamber, the laser energy entering the chamber 928 will not diverge. Rather, the laser energy entering the chamber 928 will be properly directed to the location of the plasma 932 in the chamber 928, similarly as described herein. In this manner, principles of the invention can be applied to electromagnetic energy (e.g., laser energy) that is directed in to the chamber 928 and electromagnetic energy (e.g., light) produced by the plasma 932 that is directed out of the chamber 928.

Figure 10:
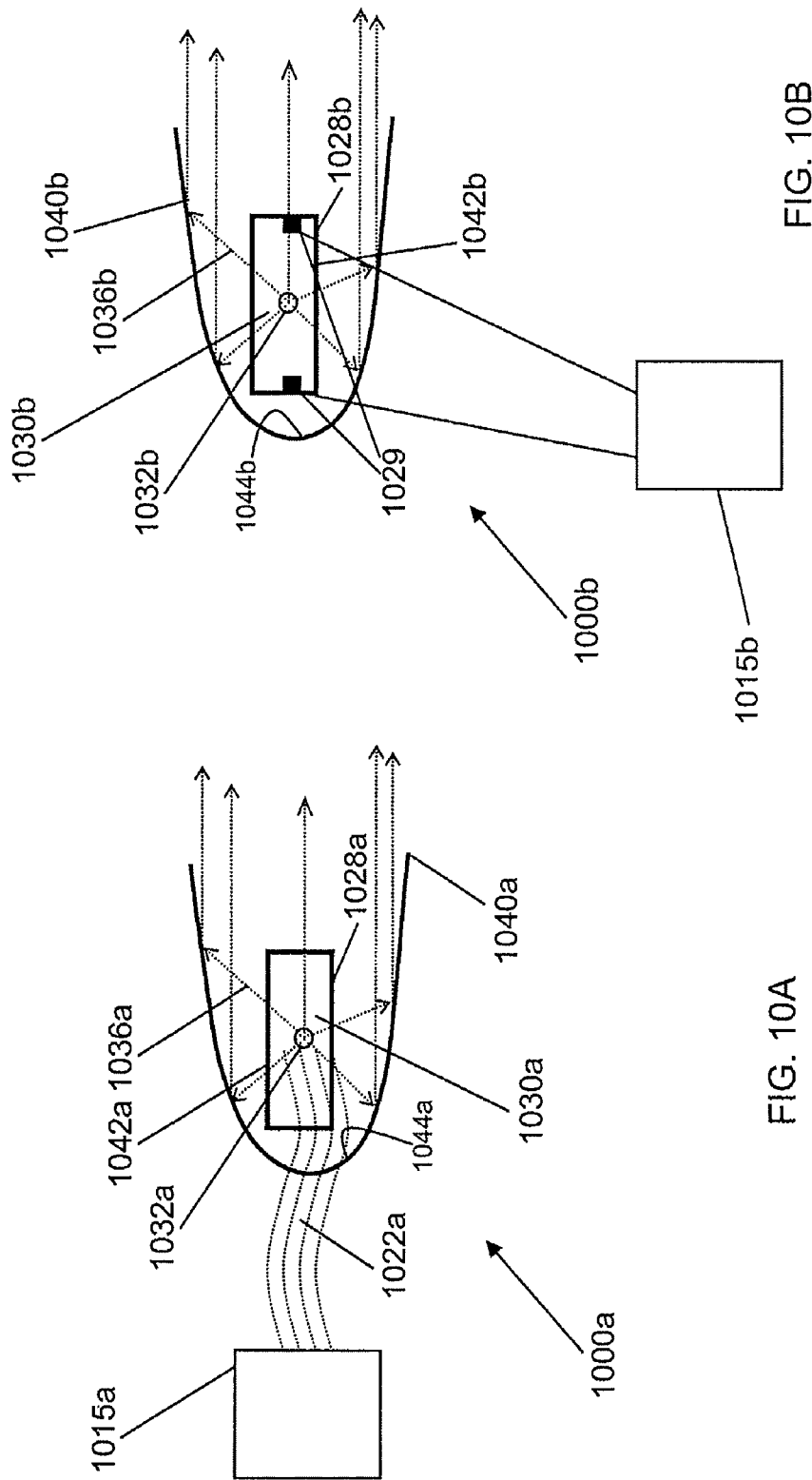
FIG. 10A is a schematic diagram of a light source with a chamber and a reflector that reflects light produced in the chamber according, to an illustrative embodiment of the invention.
FIG. 10B is a schematic diagram of a light source with a chamber and a reflector that reflects light produced in the chamber according, to an illustrative embodiment of the invention.

FIG. 10A is a schematic block diagram of a light source 1000a for generating light. The light source 1000a includes a sealed chamber 1028a (e.g., a sealed quartz tube or sealed sapphire tube) that contains an ionizable medium (not shown). The light source 1000a also includes an energy source 1015a. In various embodiments, the energy source 1015a is a microwave energy source, AC arc source, DC arc source, or RF energy source. The energy source 1015a provides energy 1022a to a region 1030a of the chamber 1028a having the ionizable medium. The energy 1022a creates a plasma 1032a. The plasma 1032a generates and emits a light 1036a that originates from the plasma 1032a. The light source 1000a also includes a reflector 1040a that has a reflective surface 1044a. The reflective surface 1044a of the reflector 1040a has a shape that is configured to compensate for the refractive index of the walls 1042a of the chamber 1028a.

The walls 1042a of the chamber 1028a are substantially transparent to the light 1036a (or to predefined wavelengths of electromagnetic radiation in the light 1036a). The light 1036a (e.g., visible and/or ultraviolet light) generated by the light source 1000a is directed through the walls 1042a of the chamber 1028a toward the inner reflective surface 1044a of the reflector 1040a.

If the refractive index of the walls 1042a is not equal to that of the media internal and external (not shown) to the chamber 1028a, the position and direction of the light ray 1036a is changed by passing through the walls 1042a of the chamber 1028a unless the reflective surface 1044a has a shape that compensates for the refractive index of the walls 1042a of the chamber 1028a. The light 1036a would disperse after reflecting off the surface 1044a of the reflector 1040a. However, because the shape of the reflective surface 1044a of the reflector 1040a is configured to compensate for the refractive index of the walls 1042a of the chamber 1028a, the light 1036a does not disperse after reflecting off the surface 1044a of the reflector 1040a. In this embodiment, the light 1036a reflects off the surface 1044a of the reflector 1040a to produce a collimated beam of light.

FIG. 10B is a schematic block diagram of a light source 1000b for generating light. The light source 1000b includes a sealed chamber 1028b (e.g., a sealed quartz tube or sealed sapphire tube) that contains an ionizable medium (not shown). The light source 1000b also includes an energy source 1015b. The energy source 1015b is electrically connected to electrodes 1029 located in the chamber 1028b. The energy source 1015b provides energy to the electrodes 1029 to generate an electrical discharge in the chamber 1028b (e.g., the region 1030b of the chamber 1028b) to ignite the ionizable medium and produce and sustain a plasma 1032b. The plasma 1032b generates and emits a light 1036b that originates from the plasma 1032b. The light source 1000b also includes a reflector 1040b that has a reflective surface 1044b. The reflective surface 1044b of the reflector 1040b has a shape that is configured to compensate for the refractive index of the walls 1042b of the chamber 1028b.

The walls 1042b of the chamber 1028b are substantially transparent to the light 1036b (or to predefined wavelengths of electromagnetic radiation in the light 1036b). The light 1036b (e.g., visible and/or ultraviolet light) generated by the light source 1000b is directed through the walls 1042b of the chamber 1028b toward the inner reflective surface 1044b of the reflector 1040b.

If the refractive index of the walls 1042b is not equal to that of media internal and external (not shown) to the chamber 1028b, the direction and position of the light ray 1036b is changed by passing through the walls 1042b of the chamber 1028b unless the reflective surface 1044b has a shape that compensates for the refractive index of the walls 1042b of the chamber 1028b. The light 1036b would disperse after reflecting off the surface 1044b of the reflector 1040b. However, because the shape of the reflective surface 1044b of the reflector 1040b is configured to compensate for the refractive index of the walls 1042b of the chamber 1028b, the light 1036b does not disperse after reflecting off the surface 1044b of the reflector 1040b. In this embodiment, the light 1036b reflects off the surface 1044b of the reflector 1040b to produce a collimated beam of light.

Figure 11:
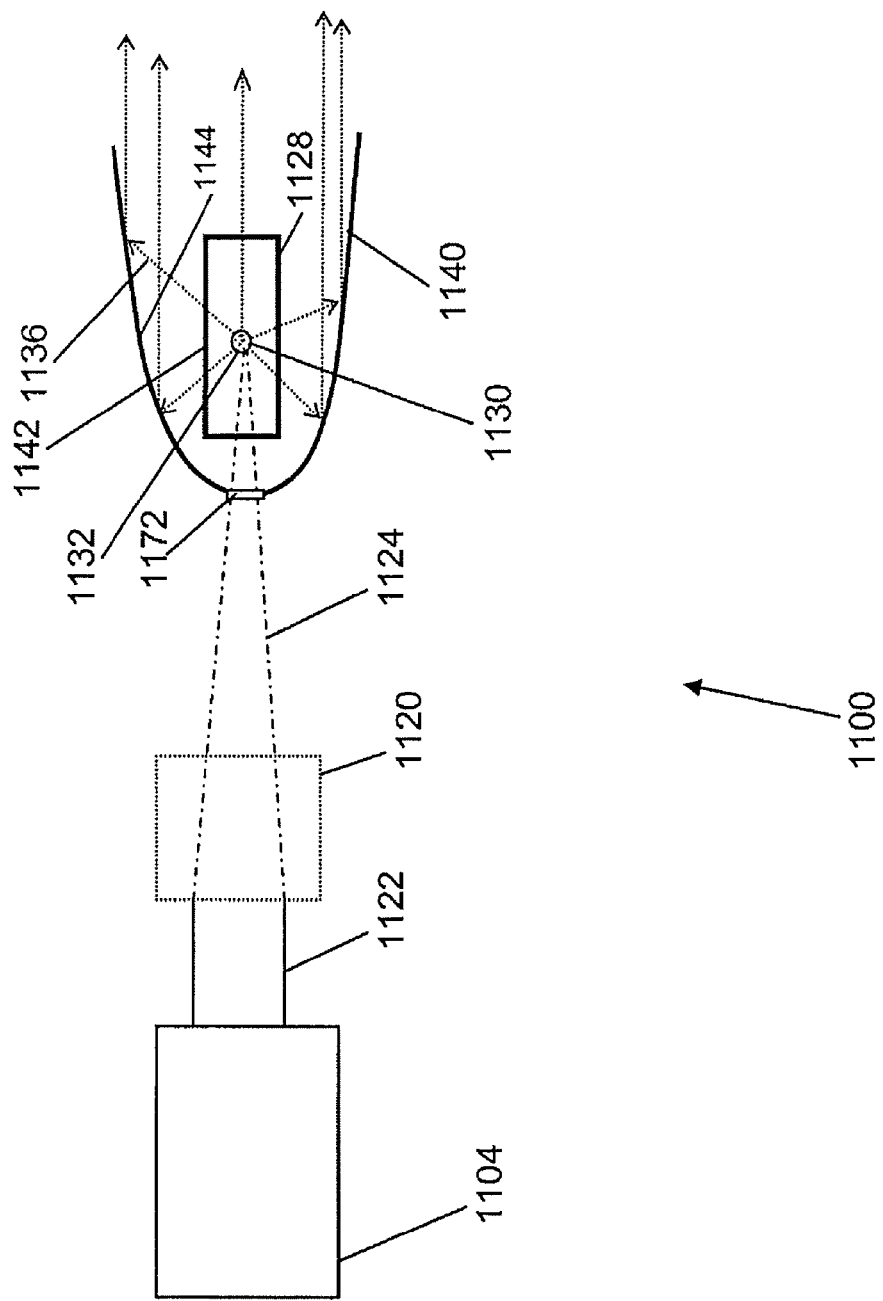
FIG. 11 is a schematic diagram of a light source including a chamber and a reflector that reflects light produced in the chamber, according to an illustrative embodiment of the invention.

FIG. 11 is a schematic block diagram of a light source 1100 for generating light that embodies the invention. The light source 1100 includes a sealed chamber 1128 (e.g., a sealed, cylindrical sapphire bulb) that contains an ionizable medium (not shown). The light source 1100 provides energy to a region 1130 of the chamber 1128 having the ionizable medium which creates a plasma 1132. The plasma 1132 generates and emits a light 1136 (e.g., a high brightness light) that originates from the plasma 1132. The light source 1100 also includes at least one laser source 1104 that generates a laser beam that is provided to the plasma 1132 located in the chamber 1128 to initiate and/or sustain the high brightness light 1136.

In this embodiment, the laser source 1104 is a diode laser that outputs a laser beam 1120. The optical lens 1120 is configured to focus the laser beam 1122 to produce a smaller diameter laser beam 1124. The laser beam 1124 passes through an aperture or window 1172 located in the base 1124 of a curved reflective surface 1140 and is directed toward the chamber 1128. The chamber 1128 is substantially transparent to the laser beam 1124. The laser beam 1124 passes through the chamber 1128 and toward the region 1130 of the chamber 1128 where the plasma 1132 exists (or where it is desirable for the plasma 1132 to be generated by the laser 1124 and sustained).

In this embodiment, the ionizable medium is ignited by the laser beam 1124. In alternative embodiments, the light source 1100 includes an ignition source (e.g., a pair of electrodes or a source of ultraviolet energy) that, for example, generates an electrical discharge in the chamber 1128 (e.g., in the region 1130 of the chamber 1128) to ignite the ionizable medium. The laser source 1104 then provides laser energy to the ionized medium to sustain the plasma 1132 which generates the light 1136. The chamber 1128 is substantially transparent to the light 1136 (or to predefined wavelengths of electromagnetic radiation in the light 1136). The light 1136 (e.g., visible and/or ultraviolet light) generated by the light source 1100 is then directed out of the chamber 1128 toward an inner surface 1144 of the reflective surface 1140.

The reflective surface 1144 of the reflector 1140 has a shape that compensates for the refractive index of the walls 1142 of the chamber 1128. If the refractive index of the walls 1142 is not equal to that of the media internal and external (not shown) to the chamber 1128, the speed of the light 1136 would be changed by passing through the walls 1142 of the chamber 1128 if the reflective surface 1144 does not have a shape that compensates for the refractive index of the walls 1142 of the chamber 1128 (similarly as described above with respect to FIG. 9).

Figure 12:
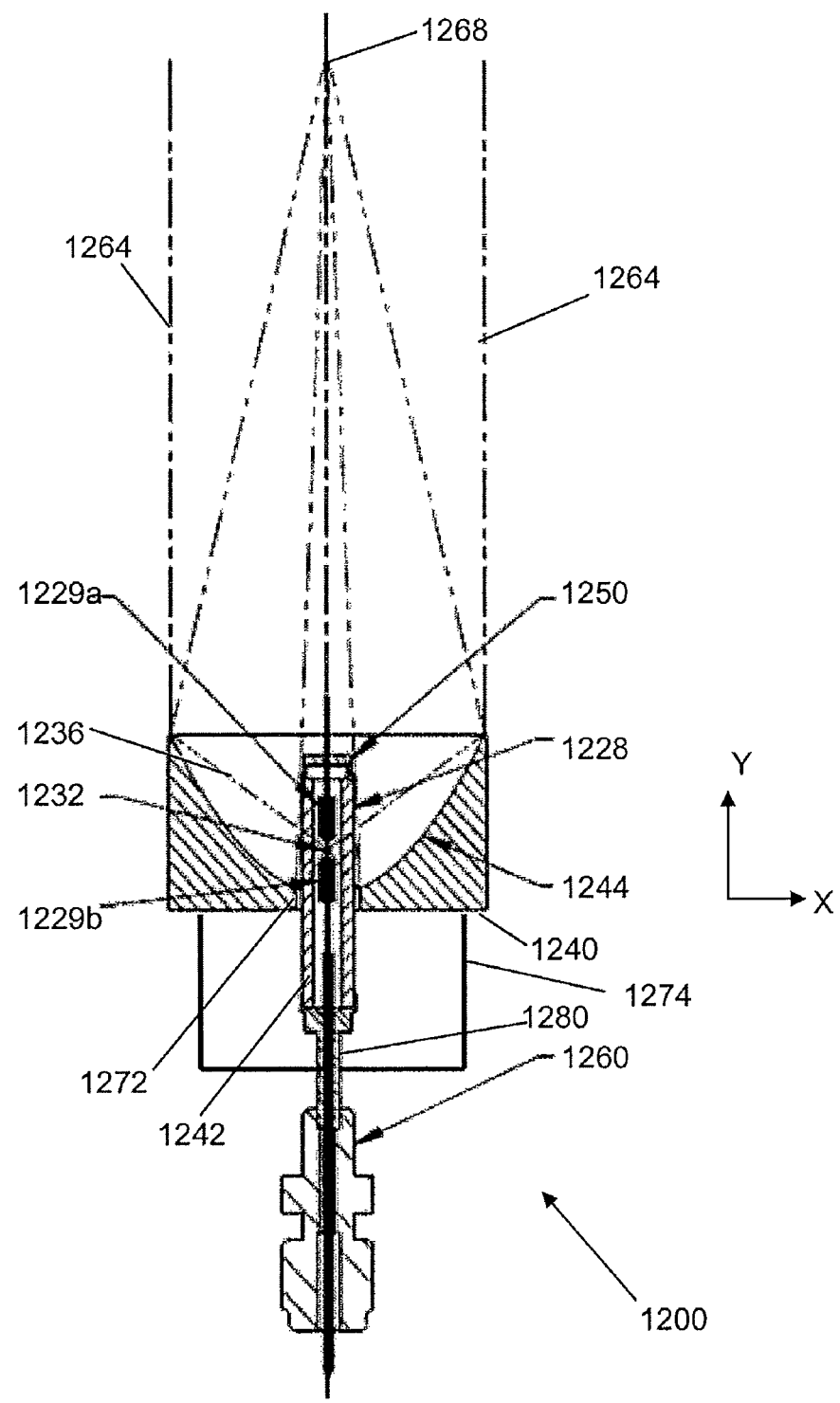
FIG. 12 is a cross-sectional view of a light source, according to an illustrative embodiment of the invention.

FIG. 12 is a cross-sectional view of a light source 1200 incorporating principles of the present invention. The light source 1200 includes a sealed cylindrical chamber 1228 that contains an ionizable medium. The light source 1200 also includes a reflector 1240. The chamber 1228 protrudes through an opening 1272 in the reflector 1240. The light source 1200 includes a support element 1274 (e.g. a bracket or attachment mechanism) attached to the reflector 1240. The support element 1274 is also attached to a back end 1280 of the chamber 1228 and locates the chamber 1228 relative to the reflector 1240. The light source 1200 includes electrodes 1229a and 1229b (collectively 1229) located in the chamber 1228 that ignite the ionizable medium to produce a plasma 1232. The electrodes 1229a and 1229b are spaced apart from each other along the Y-Axis with the plasma 1232 located between opposing ends of the electrodes 1229.

The light source 1200 also includes an energy source that provides energy to the plasma 1232 to sustain and/or generate a light 1236 (e.g., a high brightness light) that is emitted from the plasma 1232. The light 1236 is emitted through the walls 1242 of the chamber 1228 and directed toward a reflective surface 1244 of a reflector 1240. The reflective surface 1244 reflects the light 1236.

In some embodiments, the electrodes 1229 also are the energy source that provides energy to the plasma 1232 sustain and/or generate the light 1236. In some embodiments, the energy source is a laser external to the chamber 1228 which provides laser energy to sustain and/or generate the light 1236 generated by the plasma 1232, similarly as described herein with respect to other embodiments of the invention. For example, in one embodiment, the light source 1200 includes a laser source (e.g., the laser source 104 of FIG. 1) and associated laser delivery components and optical components that provides laser energy to the plasma 1232 to and/or generate the light 1236.

If the refractive index of the walls 1242 of the chamber is equal to that of the media internal and external (not shown) to the chamber 1228, and the reflective surface 1244 of the reflector 1240 is a parabolic shape, the light 1236 reflected off the surface 1244 produces a collimated beam of light 1264. If the refractive index of the walls 1242 of the chamber is equal to that of the media internal and external to the chamber 1228, and the reflective surface 1244 of the reflector 1240 is an ellipsoidal shape, the light 1236 reflected off the surface 1244 produces a focused beam of light 1268.

If the refractive index of the walls 1242 of the chamber 1228 is greater than that of the media internal and external to the chamber 1228, the direction and position of the light ray 1236 is changed by passing through the walls 1242 of the chamber 1228 unless the reflective surface 1244 of the reflector 1240 has a shape that compensates for the refractive index of the walls 1242 of the chamber 1228. The light ray 1236 would disperse after reflecting off the surface 1244 of the reflector 1240. However, because the shape of the reflective surface 1244 of the reflector 1240 is configured to compensate for the refractive index of the walls 1242 of the chamber 1228, the light 1236 does not disperse after reflecting off the surface 1244 of the reflector 1240.

In this embodiment, the refractive index of the walls 1242 of the chamber 1228 is greater than that of the internal and external media and the reflective surface 1242 has a modified parabolic shape to compensate for the refractive index of the walls 1242. The modified parabolic shape allows for the reflected light 1236 to produce the collimated beam of light 1264. If a parabolic shape was used, the reflected light 1236 would not be collimated, rather the reflected light would be dispersed. A modified parabolic shape means that the shape is not a pure parabolic shape. Rather, the shape has been modified sufficiently to compensate for the aberrations that would otherwise be introduced into the reflected light 1236. In some embodiments, the shape of the reflective surface 1242 is produced to reduce the error (e.g., dispersing of the reflected light 1236) below a specified value.

In some embodiments, the shape of the reflective surface 1242 is expressed as a mathematical equation. In some embodiments, by expressing the shape of the reflective surface 1242 as a mathematical equation, it is easier to reproduce the shape during manufacturing. In some embodiments, parameters of the mathematical equation are selected to reduce error due to the refractive index of the walls 1242 of the chamber 1228 below a specified value.

The light source 1200 includes a seal assembly 1250 at the top of the chamber 1228. The light source 1200 also includes a fitting 1260 at the bottom end of the chamber 1228. The seal assembly 1250 seals the chamber 1228 containing the ionizable medium. In some embodiments, the seal assembly 1250 is brazed to the top end of the chamber 1228. The seal assembly 1250 can include a plurality of metals united at high temperatures. The seal assembly 1250 can be, for example, a valve stem seal assembly, a face seal assembly, an anchor seal assembly, or a shaft seal assembly. In some embodiments the seal assembly 1250 is mechanically fastened to the top end of the chamber 1228. In some embodiments, there are two seal assemblies 1250, located at the two ends of the chamber 1228.

The fitting 1260 allows for filling the chamber with, for example, the ionizable medium or other fluids and gases (e.g., an inert gas to facilitate ignition). The fitting 1260 also allows for controlling the pressure in the chamber 1228. For example, a source of pressurized gas (not shown) and/or a relief valve (not shown) can be coupled to the fitting to allow for controlling pressure in the chamber 1228. The fitting 1260 can be a valve that allows the ionizable medium to flow into the chamber 1228 through a gas inlet (not shown).

Figure 13:
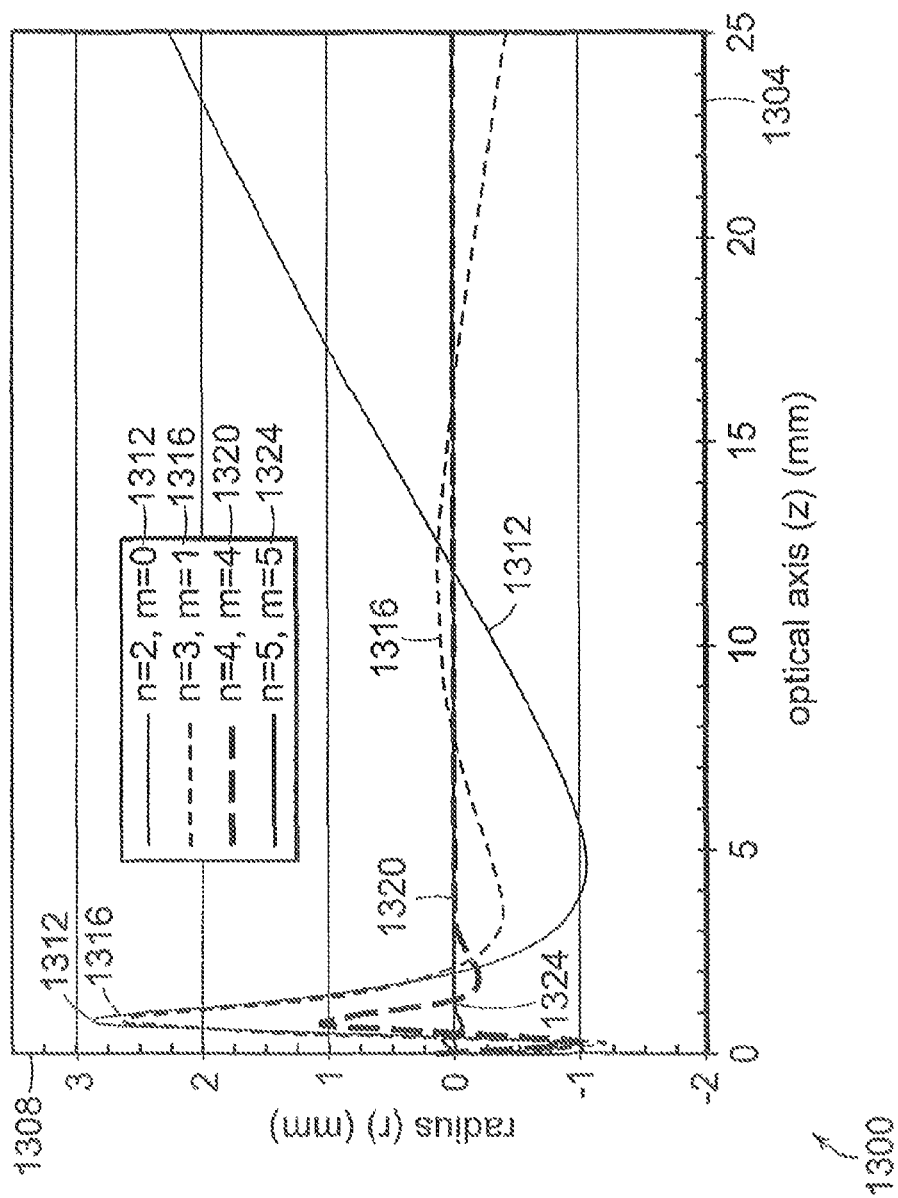
FIG. 13 is a graphical representation of the radii by which light rays reflected off of the reflective surface miss the remote focus point for different mathematical fit orders for a mathematical equation that expresses the shape of the reflective surface.

FIG. 13 is a graphical representation of a plot 1300 of the blur or dispersal produced by a reflective surface (e.g., the reflective surface 1244 of FIG. 12) for a reflective surface having various shapes that are expressed as a mathematical expression having the form of EQN. 2. The blur or dispersal is the radius by which light rays reflected off of the reflective surface miss the desired remote focus point for the reflected light (e.g., the reflected light 1268 of FIG. 12 in the situation where the shape of the reflective surface 144 is a modified elliptical shape).

$$r(z) = \sqrt{\frac{a_1 z + a_2 z^2 + a_3 z^3 + \ldots + a_n z^n}{1 + b_1 z + b_2 z^2 + \ldots + b_m z^m}}$$  EQN. 2

The X-axis 1304 of the plot 1300 is the position along the optical axis (in millimeter units) where a particular ray of light reflects from the reflective surface (e.g. the reflective surface 1244) of FIG. 12). The Y-Axis 1308 of the plot 1300 is the radius (i.e., blur or dispersal) in millimeter units. The cylindrical chamber has an outer diameter (along the X-axis) of 7.11 mm and an inner diameter of 4.06 mm. Curve 1312 shows the radius by which light rays reflected off of the location along the optical axis of the reflective surface miss the desired remote focus point for the reflected light, in which the reflective surface is expressed as a mathematical equation (EQN. 2) in which n=2 and m=0. Curve 1316 shows the radius by which light rays reflected off of the location along the optical axis of the reflective surface miss the desired remote focus point for the reflected light, in which the reflective surface is expressed as a mathematical equation (EQN. 2) in which n=3 and m=1. Curve 1320 shows the radius by which light rays reflected off of the location along the optical axis of the reflective surface miss the desired remote focus point for the reflected light, in which the reflective surface is expressed as a mathematical equation (EQN. 2) in which n=4 and m=4. Curve 1324 shows the radius by which light rays reflected off of the location along the optical axis of the reflective surface miss the desired remote focus point for the reflected light, in which the reflective surface is expressed as a mathematical equation (EQN. 2) in which n=5 and m=5.

In this embodiment, a ray tracing program was used to select (e.g., optimize) the parameters of the mathematical equation so the shape of the reflective surface compensates for the refractive index of the walls of the chamber containing the ionizable medium. Referring to FIG. 13 and EQN 2, the parameters are the order and coefficients of the mathematical equation. In this embodiment, a ray tracing program was used to determine the paths of the light rays emitted through the walls of a chamber in which the walls had a refractive index greater than that of the media internal and external to the chamber, and reflected off a reflective surface with a shape described according to EQN. 2 with selected order and coefficients. In this embodiment, the ray tracing program graphs the radii by which light rays originating at points along the optical path of the reflective surface miss the desired remote focus point.

In this embodiment, the order and coefficients of the rational polynomial (EQN. 2) are adjusted until the radii by which light rays miss the remote focus point are within a threshold level of error. In other embodiments, the order and/or coefficients are adjusted until the full width at half maximum (FWHM) of the light rays emitted by the plasma converge within a specified radius of the remote focus point. In one embodiment, the specified radius is 25 μm.

In other embodiments, the ray tracing program graphs the radii by which light rays originating at points along the optical path of the reflective surface miss a target collimated area at a specified distance from the vertex of the reflective surface. The parameters of the mathematical equation expressing the shape of the reflective surface are adjusted until the radii by which light rays miss the target collimated area are within a threshold level of error. In other embodiments, the order and/or coefficients are adjusted until the full width at half maximum (FWHM) of the light rays emitted by the plasma is located within a specified radii of a target collimated area at a specified distance from the vertex of the reflective surface.

In alternative embodiments of the invention, alternative forms of mathematical equations can be used to describe or express the shape of the reflective surface of the reflector (e.g., reflective surface 1244 of reflector 1240 of FIG. 12). The principles of the present invention are equally applicable to light sources that have different chamber shapes and/or reflective surface shapes. For example, in some embodiments, the reflective surface of the reflector has a shape that is a modified parabolic, elliptical, spherical or aspherical shape that is used to compensate for the refractive index of the walls of the chamber.

Figure 14:
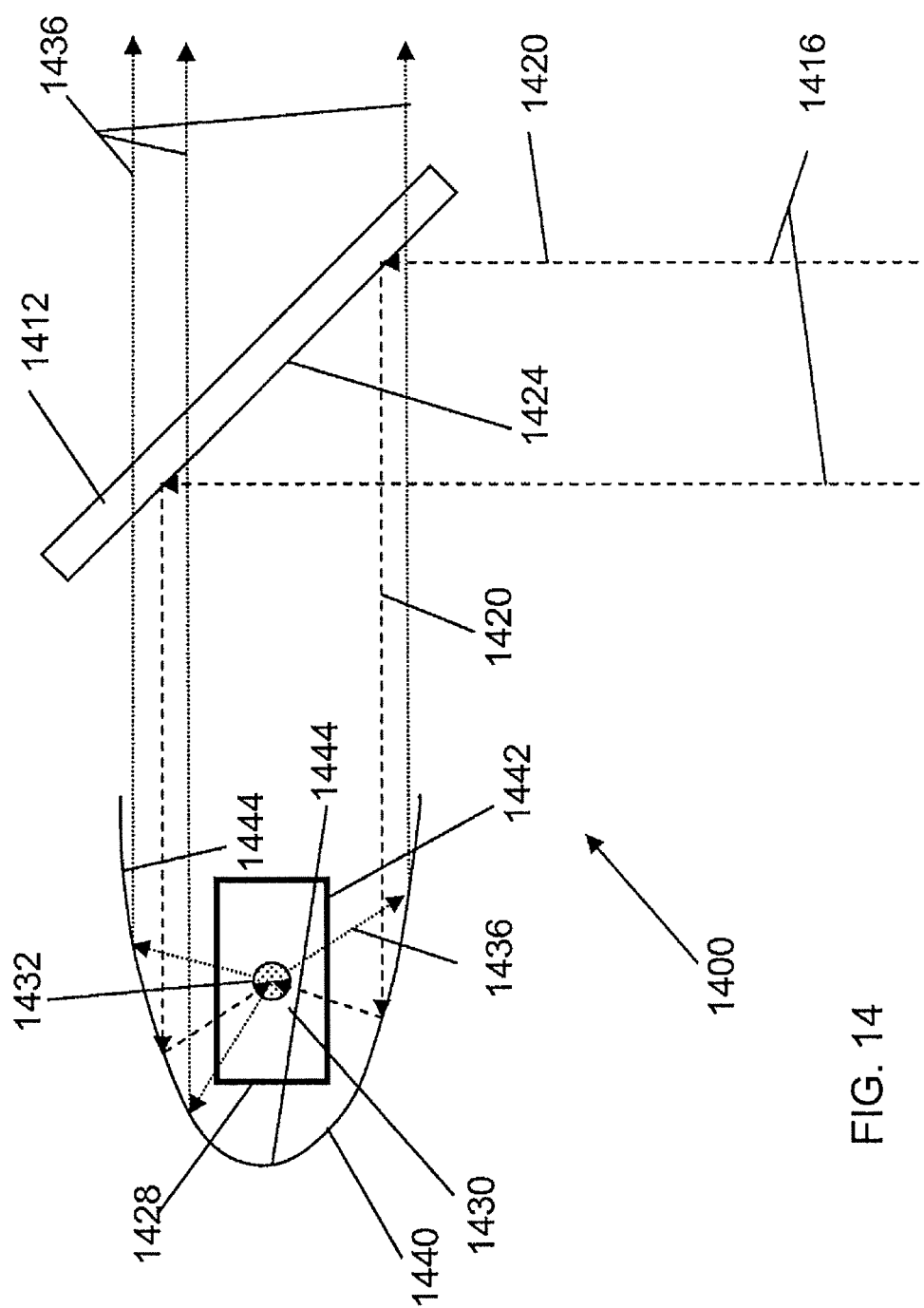
FIG. 14 is a schematic block diagram of a light source, according to an illustrative embodiment of the invention.

FIG. 14 is a schematic block diagram of a portion of a light source 1400, according to an illustrative embodiment of the invention. The light source 1400 includes a sealed chamber 1428 that includes an ionizable medium. The light source 1400 also includes a first reflector 1440 that has a reflective surface 1444. The reflective surface 1444 can have, for example, a parabolic shape, elliptical shape, curved shape, spherical shape or aspherical shape. In this embodiment, the light source 1400 has an ignition source (not shown) that ignites an ionizable gas (e.g., mercury or xenon) in a region 1430 within the chamber 1428 to produce a plasma 1432.

In some embodiments, the reflective surface 1444 can be a reflective inner or outer surface. In some embodiments, a coating or film is located on the inside or outside of the chamber to produce the reflective surface 1444.

A laser source (not shown) provides a laser beam 1416 that is directed toward a surface 1424 of a second reflector 1412. The second reflector 1412 reflects the laser beam 1420 toward the reflective surface 1444 of the first reflector 1440. The reflective surface 1444 reflects the laser beam 1420 and directs the laser beam toward the plasma 1432. The refractive index of the walls 1442 of the chamber 1430 affects the laser beam 1416 as it passes through the walls 1442 in to the chamber 1430 similarly as light passing through the walls 1442 of the chamber 1430 is affected as described previously herein. If the shape of the reflective surface 1444 is not selected to compensate for the refractive index, the laser energy disperses or fails to focus after entering the chamber 1430 and is not focused on the plasma 1432. Accordingly, in this embodiment, the reflective surface 1444 of the reflector has a shape that is selected to compensate for the refractive index of the walls 1442 of the chamber 1430 (similarly as described previously herein with respect to, for example, FIGS. 12 and 13).

The laser beam 1416 provides energy to the plasma 1432 to sustain and/or generate a high brightness light 1436 that is emitted from the plasma 1432 in the region 1430 of the chamber 1428. The high brightness light 1436 emitted by the plasma 1432 is directed toward the reflective surface 1444 of the first reflector 1440. At least a portion of the high brightness light 1436 is reflected by the reflective surface 1444 of the first reflector 1440 and directed toward the second reflector 1412. Because the reflective surface 1444 of the reflector has a shape that is selected to compensate for the refractive index of the walls 1442 of the chamber 1430, the light 1436 reflected by the reflective surface 1444 produces the desired collimated beam of light 1436 that is directed towards the second reflector 1412.

The second reflector 1412 is substantially transparent to the high brightness light 1436 (e.g., at least one or more wavelengths of ultraviolet light). In this manner, the high brightness light 1436 passes through the second reflector 1412 and is directed to, for example, a metrology tool (not shown). In some embodiments, the light 1436 is directed to a tool used for photoresist exposure, conducting ellipsometry (e.g., UV or visible), thin film measurements.

In some embodiments, the high brightness light 1436 is first directed towards or through a window or additional optical elements before it is directed to a tool.

Figure 15B:
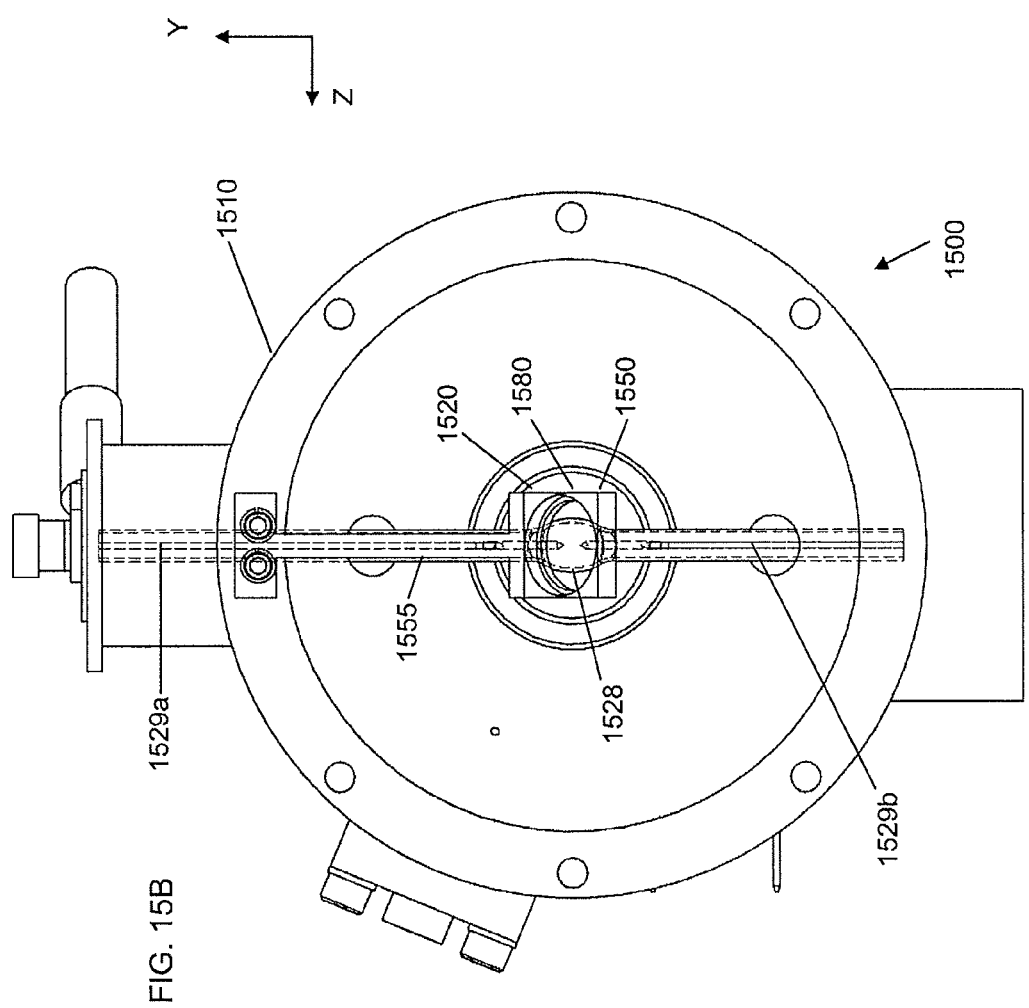
FIG. 15B is an end face view of the light source of FIG. 15A.

FIG. 15A is a cross-sectional view of a light source 1500 incorporating principles of the present invention. FIG. 15B is a sectional view (in the Y-Z plane) of the light source 1500 of FIG. 15A. The light source 1500 includes a housing 1510 that houses various elements of the light source 1500. The housing 1510 includes a sealed chamber 1522 and has an output 1580 which includes an optical element 1520 (e.g., a quartz disk-shaped element) through which light can exit the housing 1510. The light source 1500 includes a sealed chamber 1528 that contains an ionizable medium (not shown). The light source 1500 also includes a reflector 1540. The light source 1500 also includes a blocker 1550. The light source 1500 includes electrodes 1529a and 1529b (collectively 1529) located in part in the chamber 1528 that ignite the ionizable medium to produce a plasma (not shown). The electrodes 1529a and 1529b are spaced apart from each other (along the Y-Axis) with the plasma located between opposing ends of the electrodes 1529.

In some embodiments, the electrodes 1529 also are the energy source that provides energy to the plasma to sustain and/or generate the light. In this embodiment, the energy source is a laser (not shown) external to the chamber 1528 which provides laser energy 1524 (e.g., infrared light) to sustain and/or generate the light 1530 (e.g., a high brightness light including ultraviolet and/or visible wavelengths) generated by the plasma, similarly as described herein with respect to other embodiments of the invention. The laser energy 1524 enters the chamber 1528 on a first side 1594 of the chamber 1528. In some embodiments, the light source 1500 also includes associated laser delivery components and optical components that provide laser energy to the plasma to sustain and/or generate the light 1530. In this embodiment, the light source 1500 includes an optical element 1560 to delivery the laser energy 1524 from the laser to the plasma to sustain and/or generate the light 1530 that is emitted from the plasma.

The light 1530 is emitted through the walls of the chamber 1528. Some of the light 1530 emitted through the walls of the chamber 1528 propagates toward a reflective surface 1532 of the reflector 1540. The reflective surface 1532 reflects the light through the optical element 1520 in the housing 1510 to a focal point 1525 of the reflector 1540. Some of the light 1536 propagates toward the optical element 1560. The optical element 1560 absorbs the light 1536, and the light 1536 is not reflected through the optical element 1520. As a result, the light reflected to the focal point 1525 is the light 1530 emitted from the plasma that is reflected by the reflector 1540 along paths shown as the regions 1540 and 1541. Consequently, the light source 1500 includes dark region 1542 due to the light that is radiated toward the optical element 1560 and therefore not reflected to the focal point 1525 of the reflectors 1540.

Some of the laser energy delivered to the plasma is not absorbed by the plasma. The laser energy that is not absorbed (laser energy 1556) continues to propagate along the positive X-Axis direction towards the end of the housing 1510. The blocker 1550 is suspended on a second side 1596 of the chamber 1528. The blocker 1550 is suspended along a path 1562 the laser energy 1556 travels. The blocker 1550 is coupled to an arm 1555 that suspends the blocker 1550 in the chamber 1522 of the light source 1500. The blocker 1550 blocks the laser energy 1556 to prevent it from propagating toward the end of the housing and through an output 1580 of the light source 1500.

In this embodiment, the blocker 1550 is a mirror that deflects the laser energy 1556 that is not absorbed by the plasma away from the opening 1520 and towards the walls of the housing 1510 (illustrated as laser energy 1584). The blocker 1550 reflects the laser energy 1556 toward a wall 1588 of the housing 1510. The housing 1510 absorbs part of the reflected laser energy 1584 and reflects part of the laser energy 1584 toward the opposite wall 1592 of the housing 1510. A portion of the laser energy 1584 is absorbed each time it impacts a wall (e.g., wall 1588 or 1592) of the housing 1510. Repetitive impact of the laser energy 1584 with the walls of the housing 1510 causes the laser energy 1584 to be substantially (or entirely) absorbed by the walls of the housing 1510. The blocker 1550 prevents laser energy (e.g., infrared wavelengths of electromagnetic energy) from exiting the housing 1510 through the opening 1580 by deflecting the laser energy 1556 using the blocker 1550. As a result, only the light produced by the plasma (e.g., ultraviolet and/or visible wavelengths) exits the housing 1510 through the opening 1580.

The blocker 1550 is suspended in the housing 1510 in a location where the blocker 1550 would not deflect light 1530 reflected by the reflector 1540 through the opening 1580 to the focal point 1525. The blocker 1550 does not deflect the light 1530 because the blocker 1550 is located in the dark region 1542. In addition, the arm 1555 coupled to the blocker 1550 also does not deflect the light 1530 because the arm is positioned in the housing 1510 in a location that is aligned with the electrode 1529a along the positive X-Axis direction relative to the electrode 1529a. In this manner, the blocker 1550 and arm 1555 are positioned to minimize their blocking of the light 1530.

The dark region 1542 tapers as the region 1542 approaches the opening 1580. To prevent the blocker 1550 from deflecting light reflected by the reflector 1540, the laser energy blocker 1550 is positioned at a location along the X-Axis where the cross-sectional area (in the Y-Z plane) of the blocker 1550 is equal to or less than the cross sectional area (in the Y-Z plane) of the dark region 1542. As a result, the smaller the cross-sectional area (in the Y-Z plane) of the blocker 1550, the closer along the X-Axis the blocker 1550 can be placed to the opening 1580.

In some embodiments, the laser energy blocker 1550 is made of any material that reflects the laser energy 1556. In some embodiments, the blocker 1550 is configured to reflect the laser energy 1556 back toward the ionized medium in the chamber 1528. In some embodiments, the blocker 1550 is a coating on a portion of the chamber 1528. In some embodiments, the blocker is a coating on the optical element 1520 at the opening 1580.

In some embodiments, the laser energy blocker 1550 is made of a material that absorbs, rather than reflects, the laser energy 1556 (e.g., graphite). In some embodiments in which the blocker absorbs the laser energy 1556, the blocker 1550 heats up because it absorbs the laser energy 1556.

In some embodiments, the blocker 1550 is cooled. The blocker 1550 can include one or more coolant channels in the blocker 1550. The light source can also include a coolant supply coupled to the coolant channel which provides coolant to the coolant channel to cool the blocker 1550. In some embodiments, the light source 1500 includes a gas source (e.g., a pressurized gas canister or gas blower) to blow gas (e.g., air, nitrogen, or any other gas) on the blocker 1550 to cool the blocker 1550. In some embodiments, the light source 1500 includes one or more tubes (e.g., copper tubes) that wind around the laser energy blocker 1550. The light source 1500 flows a coolant (e.g., water) through the tubes to cool the blocker 1550.

Figure 16:
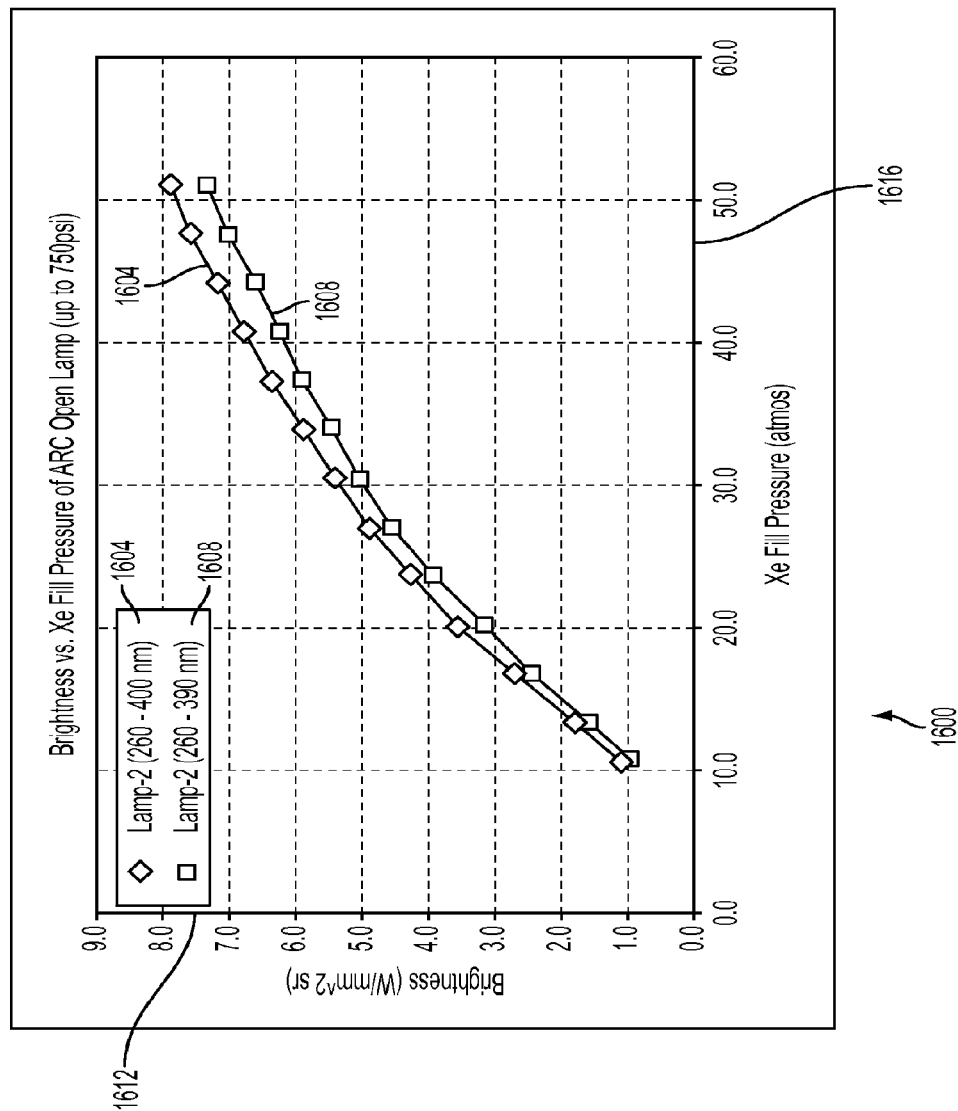
FIG. 16 is a graphical representation of brightness as a function of the pressure in a chamber of a light source, using a light source according to the invention.

By way of illustration, an experiment was conducted to generate ultraviolet light using a light source, according to an illustrative embodiment of the invention. A specially constructed quartz bulb with a volume of 1 cm$^3$ was used as the chamber of the light source (e.g., the chamber 128 of the light source 100 of FIG. 1) for experiments using xenon as the ionizable medium in the chamber. The bulb was constructed so that the chamber formed within the quartz bulb was in communication with a pressure controlled source of xenon gas. FIG. 16 is a graphical representation of brightness as a function of the pressure in a chamber of a light source, using a light source according to the invention. FIG. 16 illustrates a plot 1600 of the brightness of a high brightness light produced by a plasma located in the chamber as a function of the pressure in the chamber.

The laser source used in the experiment was a 1.09 micron, 200 watt CW laser and it was focused with a numerical aperture of 0.25. The resulting plasma shape was typically an ellipsoid of 0.17 mm diameter and 0.22 mm length. The Y-Axis 1612 of the plot 1600 is the brightness in watts/mm$^2$ steradian (sr). The X-Axis 1616 of the plot 1600 is the fill pressure of Xenon in the chamber. Curve 1604 is the brightness of the high brightness light (between about 260 and about 400 nm) produced by a plasma that was generated. Curve 1608 is the brightness of the high brightness light (between about 260 and about 390 nm) produced by the plasma. For both curves (1604 and 1608), the brightness of the light increased with increasing fill temperatures. Curve 1604 shows a brightness of about 1 watts/mm$^2$ sr at about 11 atmospheres which increased to about 8 watts/mm$^2$ sr at about 51 atmospheres. Curve 1608 shows a brightness of about 1 watts/mm$^2$ sr at about 11 atmospheres which increased to about 7.4 watts/mm$^2$ sr at about 51 atmospheres. An advantage of operating the light source with increasing pressures is that a higher brightness light can be produced with higher chamber fill pressures.

To start a laser-driven light source ("LDLS"), the absorption of the laser light by the gas within the chamber (e.g., chamber 128 of FIG. 1) is strong enough to provide sufficient energy to the gas to form a dense plasma. However, during operation, the same absorption that was used to start the LDLS can be too strong to maintain the brightness of the light because the light can be prematurely absorbed before the light is near the laser focus. These criteria often come into conflict and can create an imbalance in the absorption needed to start a LDLS and the absorption needed to maintain or operate the LDLS. When starting a LDLS, the plasma density is generally low and hence, other things being equal, the absorption is weak. This can cause most of the laser light to leave the plasma region without being absorbed. Such a situation can lead to an inability to sustain the plasma by the laser alone. One solution to this problem is to tune the laser to a wavelength near a strong absorption line of the excited working gas within the chamber (e.g., chamber 128 of FIG. 1). However, after ignition this same strong absorption can become a liability because the laser energy can be absorbed too easily before the laser power reaches the core of the plasma near the laser focus. This latter condition can lead to a low brightness light source radiating from a large volume. One solution to this problem is to tune the laser wavelength away from the strong absorption line until a condition is reached where the maximum radiance is achieved. The optimum operating state can be a balance between small plasma size and sufficiently high power absorption. This scenario leads to a light source and a method of operation where the laser is first tuned to a wavelength nearer the absorption line and then tuned to another wavelength further away from the strong absorption line for optimum operation.

A light source can use an excited gas that has at least one strong absorption line at an infrared wavelength to produce a high brightness light. For example, referring to FIG. 1, the light source 100 includes a chamber 128 that has a gas disposed therein. The gas can comprise a noble gas, for example, xenon, argon, krypton, or neon. An ignition source 140 can be used to excite the gas within the chamber 128. The ignition source 140 can be, for example, two electrodes. The excited gas has electrons at an energy level that is higher than the energy of the gas at its ground state, or lowest energy level. The excited gas can be in a metastable state, for example, at an energy that is higher than the ground state energy of the gas but that lasts for an extended period of time (e.g., about 30 seconds to about one minute). The specific energy level of the excited state can depend on the type of gas that is within the chamber 128. The excited gas has at least one strong absorption line at an infrared wavelength, for example at about 980 nm, 895 nm, 882, nm, or 823 nm. The light source 100 also includes at least one laser 104 for providing energy to the excited gas at a wavelength near a strong absorption line of the excited gas within the chamber 128 to produce a high brightness light 136. The gas within the chamber 128 can be absorptive near the wavelength of the laser 104.

Operation of the light source to balance the conflicting criteria for starting and maintaining the high brightness light can comprise tuning a laser (e.g., laser 104 of FIG. 1) to a first wavelength to produce a high brightness light and then tuning the laser to a second wavelength to maintain the high brightness light. The first wavelength can be at an energy level that is capable of forming and sustaining a dense plasma, thus creating a high brightness light, and the second wavelength can be at an energy level such that the laser energy is not substantially absorbed by the plasma prior to the laser reaching its focus point.

For example, a gas within a chamber (e.g., chamber 128 of FIG. 1) can be excited with an ignition source. In some embodiments, a drive laser at a power below 1000 W can be used to ignite the plasma. In other embodiments, a drive laser at a power above or below 1000 W can be used to ignite the plasma. To ignite the plasma and/or the excited gas within the chamber, a LDLS can be operated near the critical point of the gas within the chamber. The critical point is the pressure above which a gas does not have separate liquid and gaseous phases. For example, the critical point of xenon is at a temperature of about 290 Kelvin and at a pressure of about 5.84 MPa (about 847 psi). In some embodiments, other gases are used, for example neon, argon or krypton can be used. In other embodiments, combinations of gases can be used, for example, a mixture of neon and xenon.

After the gas within the chamber is ignited, a laser (e.g., laser 104 of FIG. 1) can be tuned to a first wavelength to provide energy to the excited gas in the chamber to produce a high brightness light. The excited gas within the chamber absorbs energy near the first wavelength. After the high brightness light is initiated, the laser can be tuned to a second wavelength to provide energy to the excited gas within the chamber to maintain the high brightness light. The second wavelength can either be less than or greater than the first wavelength. The excited gas within the chamber absorbs energy near the second wavelength.

The gas within the chamber can be, for example, a noble gas and can have atoms with electrons in at least one excited atomic state. Noble gases such as xenon, argon, krypton or neon can be transparent in the visible and near infrared range of the spectrum, but this is not the case when the gas is at high temperature or in the presence of excited molecular states, such as excimers. Any condition of the gas which results in population of high energy electronic states, such as the lowest excited state (e.g., the excited state closest in energy to the ground state) in xenon, will also result in the appearance of strong absorption lines due to transitions between the relatively high energy state and any of the several higher level states which lie at a level of order 1 eV above it.

Figure 17:
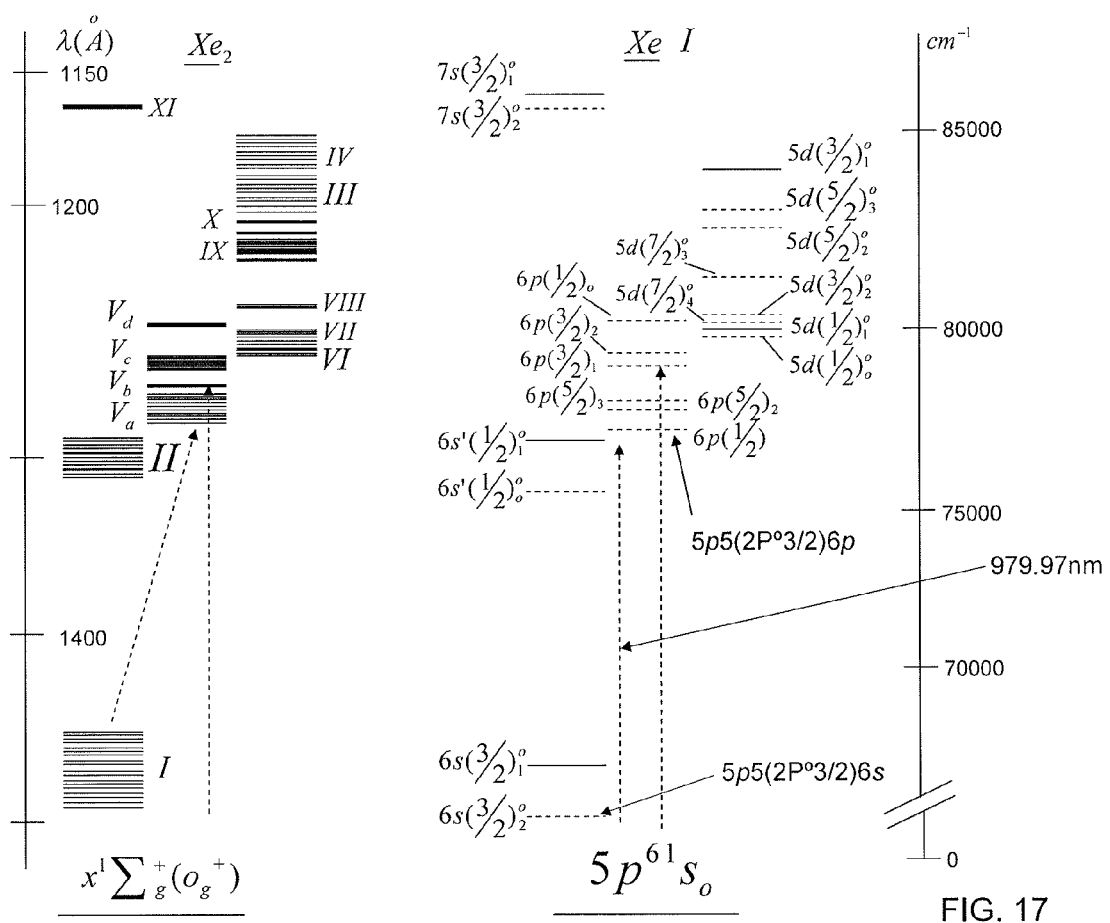
FIG. 17 is an energy level diagram of atomic and molecular xenon.

FIG. 17 shows a simplified diagram of the relevant energy levels in xenon. Each of the horizontal bars represents an energy level which can be occupied by an electron in the xenon atom or molecule (dimer). When an electron moves between two levels, a photon can be emitted or absorbed, e.g. a 980 nm photon. The groups of close together horizontal bars on the "Molecular Levels," or left, side of the diagram show that the close association of xenon atoms in the molecule leads to broadening of the energy levels of the atom into bands. Transitions between these bands then allow for a broadened range of absorption, which explains the enhanced absorption even at wavelengths some distance (e.g., several nanometers) away from the exact atomic transition of 980.0 nm.

Still referring to FIG. 17, an example of such an absorption line is the one at about 980 nm and about 882 nm in xenon which is a transition from the metastable atomic 5p5(2P°3/2)6s level to the 5p5(2P°3/2)6p level. The molecules have a corresponding set of transitions yielding a broadened 980 nm or 882 nm line. Such lines are also observed in emission due to the reverse transition.

Other examples of suitable absorption lines in xenon are, for example, 881.69 nm, 823.1 nm, and 895.2 nm. Table 1 shows emission and absorption measurements and average temperature of the cathode spot of a xenon arc in the stationary mode. As shown, xenon in the plasma form has multiple absorbance lines in the IR spectrum. As shown by the high percentage of energy that can be absorbed at multiple wavelengths, 881.69 nm, 823.1 nm and 895.2 nm, as well as 980 nm, are good wavelengths that can be used within a LDLS to initiate a high brightness light.

TABLE 1

(as measured by Lothar Klein (April 1968/Vol. 7, No. 4/APPLIED OPTICS 677)).

| | λ (Å) | $N_{\lambda,0}$ (W cm$^{-1}$ sr$^{-1}$ μ$^{-1}$) | Absorption (%) | $\overline{T}$ (°K.) |
|---|---|---|---|---|
| Xe$_I$ | 8232 | 5,900 | 89 | 10,020 |
| cont | 8500 | 1,615 | 23 | 10,750 |
| Xe$_I$ | 8819 (peak) | 4,390 | 97 | 9,160 |
| | (wing) | 4,960 | 90 | 10,500 |
| Xe$_I$ | 9800 | 3,400 | 89 | 9,820 |
| Xe$_I$ | 9923 | 3,340 | 90 | 9,840 |
| Xe$_I$ | 10528 | 892 | 28.5 | 9,950 |
| Xe$_I$ | 11742 | 906 | 42.5 | 9,400 |
| Xe$_I$ | 12623 | 640 | 37 | 9,920 |
| cont | 13100 | 213 | 17 | 8,870 |
| Xe$_I$ | 14733 | 575 | 55 | 10,060 |
| Xe$_I$ | 15418 | 317 | 37 | 9,840 |

Figure 18:
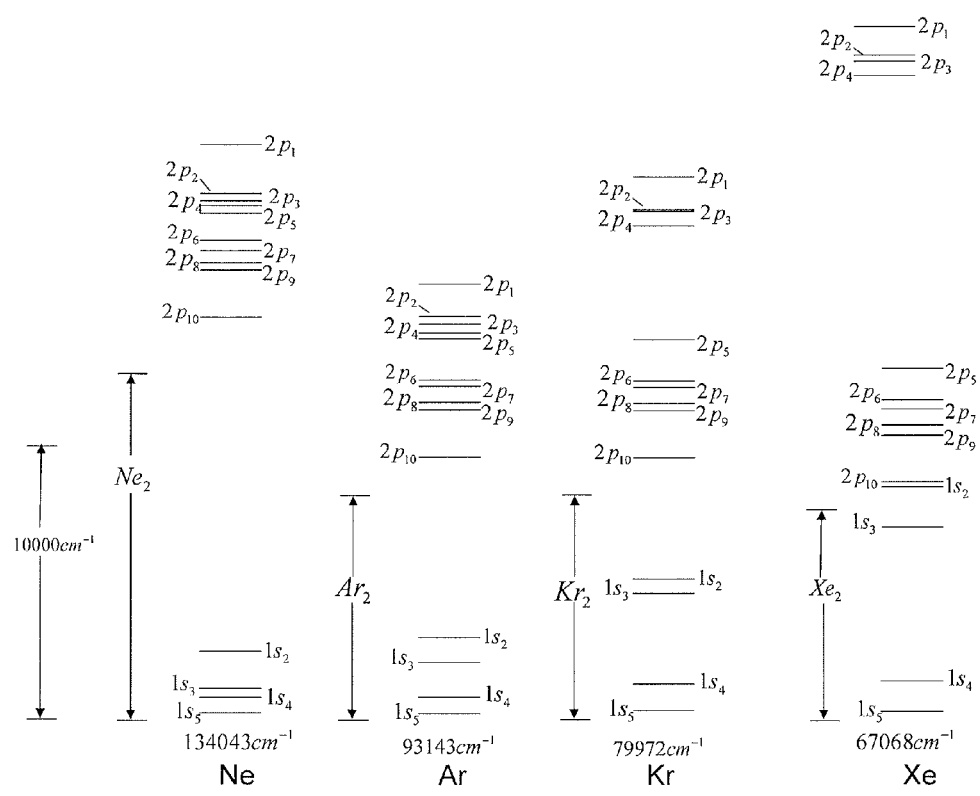
FIG. 18 is a graphical representation of transition energies of first absorptions and energy levels of rare gas atoms.

FIG. 18 shows simplified spectral diagrams of the relevant energy levels in neon, argon, krypton and xenon. Each horizontal bar represents an energy level which can be occupied by an electron in the neon, argon, krypton, or xenon atom or molecule (dimer). The transition between these energy levels in the noble gases, allow for a broadened range of absorption. Therefore, these noble gases can be used in a LDLS to start and maintain a high brightness light in accordance with the systems and methods described herein.

Figure 19:
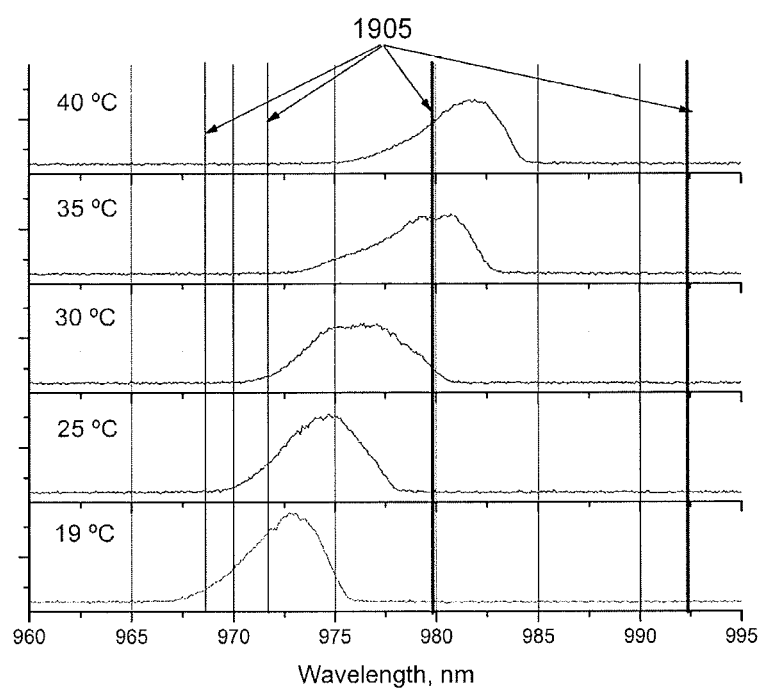
FIG. 19 is a graph depicting laser output wavelength versus temperature for a tuning mechanism, according to an illustrative embodiment of the invention.

Tuning the laser several nanometer, as can be needed to adjust the wavelength of the laser from a first wavelength to initiate a high brightness light to a second wavelength to sustain the high brightness light, can be accomplished by adjusting the operating temperature of the laser. FIG. 19 shows a graph of laser output wavelength versus temperature for xenon, which can be used as a tuning mechanism for a laser of a LDLS. The laser bandwidth is approximately 5 nm and the xenon absorption lines 1905 are shown, for example, at about 980 nm. For example, the wavelength of a typical diode laser operating near the 980 nm absorption line of xenon can be tuned approximately 0.4 nm per degree Celsius of temperature change. The specific temperature or range of temperatures depends on the particular laser. The effect is that thermal expansion of the laser material causes the length of the laser cavity to increase with temperature, thereby shifting the resonant wavelength of the cavity to a longer wavelength. The temperature of the laser can be set by a thermoelectric cooling device (e.g., a Peltier cooling device) and quickly tuned by varying the current to the thermoelectric cooler ("TEC"). Electronic fan speed control of a cooling fan is another option for laser temperature control. Also, electric heating of the laser can be used to control the temperature. Temperature of the laser can be monitored by a sensor and controlled by a feedback circuit driving the cooling and/or heating means.

The second wavelength that the laser of the LDLS is tuned to can be approximately 1 nm to approximately 10 nm displaced from the first wavelength. In some embodiments, the second wavelength is less than the first wavelength and in some embodiments the second wavelength is greater than the first wavelength. For example, to start a LDLS, the laser can be tuned to a wavelength of about 980 nm using xenon gas within the chamber of the light source. After a high brightness light is initiated, the laser can be tuned to a wavelength of about 975 nm to maintain the high brightness light. In some embodiments, the second wavelength is about 985 nm.

Several different methods can be used to start and maintain the light source. In some embodiments, a high voltage pulse is applied to the ignition electrodes in the lamp. A DC current of about 1 to about 5 Amps can initially flow through the resulting plasma from an ignition power supply. The current can decay exponentially with a time constant of about 2 milliseconds. During this time the resulting plasma is illuminated by a focused laser beam at a wavelength of, for example, about 980 nm where the laser temperature is about 35 (see, e.g., FIG. 19, which shows that when the laser temperature is at about 35° C. the laser will emit energy at a wavelength of about 980 nm). The laser plasma is then sustained after the DC current decays to zero. A plasma light sensor can be used to determine that the plasma is sustained by the laser and then the laser is cooled to a temperature about 25° C. and the resulting wavelength of about 975 nm, or a desired predetermined operating wavelength, which can be determined by active feedback on the properties of the laser driven light source, such as radiance (e.g., brightness) (see, e.g., FIG. 19, which shows that when the laser temperature is at about 25° C. the laser will emit energy at a wavelength of about 975 nm). This method can rely on direct electron heating by the laser, and therefore, can require sufficient electron density to couple the laser power. This method can be used for a LDLS that operates at about 60 W.

In some embodiments, a different starting scheme can be used, which is suitable for low laser powers, for example, laser powers between about 10 W and about 50 W. For example, a laser wavelength can be deliberately tuned to rely on direct absorption of the laser power by the neutral gas, which is absorptive at or near the laser wavelength. However, since laser photon energy is low (approximately 1.26 eV for 980 nm), compared to atomic excited states (e.g., the lowest xenon excited state is about 8.31 eV), this method cannot not rely on absorption from the ground state. In addition, multi-photon effects can require high power and usually a pulsed laser.

Since the starting scheme cannot rely on absorption from the ground state, the starting scheme can instead rely on absorption from an excited state. However, this requires that at least one excited state of the gas within a chamber of a LDLS be populated with electrons. Some excited states have long life times, for example, the lifetime of metastable xenon is approximately 40 seconds. Due to the long lifetime, the metastable states tend to be preferentially populated. When choosing absorption lines of a gas near the laser wavelength, it can be preferred to choose those with lower level on a metastable state. In addition, at high pressures (e.g., pressures greater than about 0.1 bar), pressure and molecular effects broaden the absorption lines.

A certain level of DC arc current can be required to start the LDLS, but less DC arc current can be required for a laser at higher power and operating closer to an absorption line of the gas within the chamber of the light source. A peak DC current can be varied by changing the resistance of a current limiting resistor after a booster capacitor. Threshold current is the laser driving current above which the plasma can be started when well aligned. Laser output power is proportional to laser current. Higher laser driving current can also make the laser center wavelength closer to an atomic line, for example, closer to 980 nm.

Figure 20:
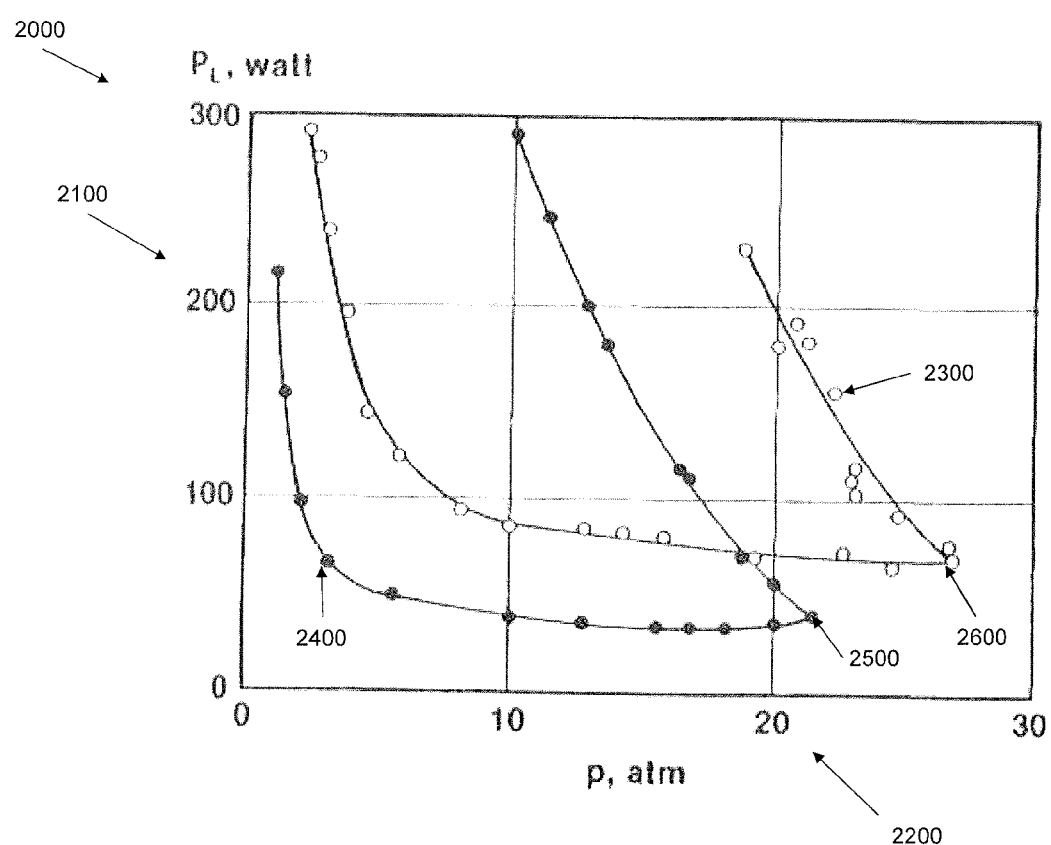
FIG. 20 is a graph depicting power versus pressure for xenon and argon.

FIG. 20 is a graph 2000 of power 2100 versus pressure 2200 for argon 2300 and xenon 2400. See Keefer, "Laser-Sustained Plasmas," *Laser-Induced Plasmas and Applications*, published by Marcel Dekker, edited by Radziemski et al., 1989, pp. 169-206, at page 191. The graph 2000 shows the minimum power (about 30 W, with minimum power occurring below 20 atm.) required to sustain plasmas in argon and xenon as well as the maximum pressure that can be obtained. In addition, at points 2500 and 2600, the prior art laser sustained plasma can not be operated at any higher pressure when the laser sustained plasma is operated according to the prior art. For instance, the highest pressure that can be achieved for xenon 2400 is about 21 atm and the highest pressure that can be achieved for argon 2300 is about 27 atm. At these pressures, the prior art laser sustain plasma requires about 50 W of power to sustain a xenon plasma and about 70 W of power to sustain an argon plasma. Operating at higher pressure is beneficial because plasmas for the purpose of light generation can be obtained with higher brightness while lower powers are required when operated according to the present invention.

To obtain lower powers the LDLS can be operated at a wavelength of about 980 nm. When the LDLS is operated at 980 nm, a higher maximum pressure is observed than the maximum pressures shown in FIG. 20. In addition, a maximum pressure, similar to that shown in FIG. 20, has not been achieved when a LDLS is operated at 980 nm. Therefore, when the LDLS is operated at the 980 nm wavelength, the LDLS can be operated at substantially higher pressures than prior art laser sustained plasmas. For example, the LDLS can be operated at pressures greater than about 30 atm. When the LDLS is operated at these high pressures and at a wavelength of about 980 nm, the power needed to sustain the plasma drops dramatically. For example, when the LDLS is operated at a pressure greater than about 30 atm, the power need to sustain the plasma can be as low as about 10 W.

Figure 21:
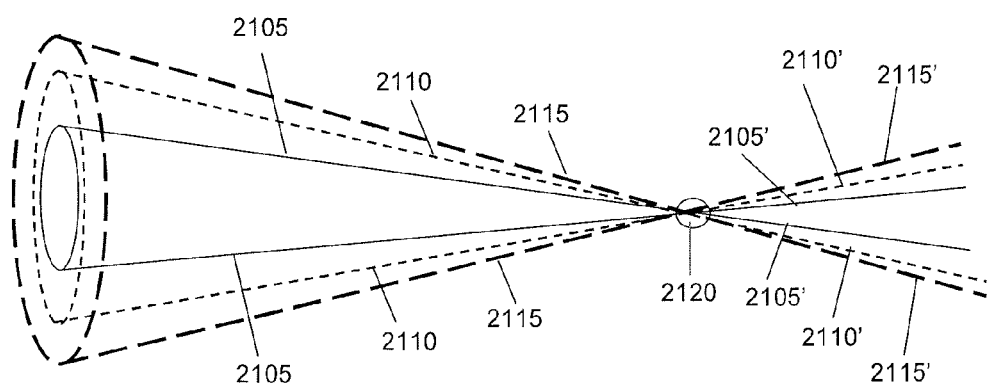
FIG. 21 is a schematic illustration of converging laser beam numerical apertures, according to an illustrative embodiment of the invention.

FIG. 21 shows different sized laser beams 2105, 2110, 2115 focused on a small plasma 2120. Each laser beam 2105, 2110, 2115 has a different numerical aperture ("NA"), which is a measure of the half angle of a cone of light. The NA is defined to be the sine of the half angle of the cone of light. For example, laser beam 2105 has a smaller NA than laser beam 2110, which has a smaller NA than laser beam 2115. As shown in FIG. 21, a laser beam with a larger NA, for example, laser beam 2115, can have an intensity that converges more quickly on plasma 2120 (e.g., it can converge more quickly to the laser focal point) than a laser beam with a smaller NA, for example, laser beam 2105. In addition, laser beams with a larger NA can rapidly decrease in intensity as the laser beam leaves the focus point and thus will have less of an effect on the high brightness light than a laser beam with a smaller NA. For example, laser beam 2105' corresponds to laser beam 2105, laser beam 2110' corresponds to laser beam 2110, and laser beam 2115' corresponds to laser beam 2115. As shown by FIG. 21, the intensity of laser beam 2115 decreases more rapidly (2115') after the focus point than laser beam 2105 due to the larger NA of beam 2115, which also results in less interference of the laser beam with the high brightness light.

Referring to FIG. 1, a light source 100 can utilize the NA property of a beam of light to produce a high brightness light. The light source 100 can include a chamber 128 having one or more walls. A gas can be disposed within the chamber 128. At least one laser 104 can provide a converging beam of energy focused on the gas within the chamber 128 to produce a plasma that generates a light emitted through the walls of the chamber 128. The NA of the converging beam of energy can be between about 0.1 or about 0.8, or between about 0.4 to about 0.6, or about 0.5.

In some embodiments, the laser 104 is a diode laser. A diode laser can include optical elements and can emit a converging beam of energy without any other optical elements present in the optical system. In some embodiments, an optical element is positioned within a path of the laser beam, for example, referring to FIG. 1, an optical element can be positioned between the laser 104 and the region 130 where the laser beam energy is provided. The optical element can increase the NA of the beam of energy from the laser. The optical element can be, for example, a lens or a mirror. The lens can be, for example, an aspheric lens. In FIG. 1, the combination of beam expander 118 and lens 120 serves to increase the NA of the beam. For example, a NA of 0.5 can be achieved when the illuminated diameter of lens 120 is equal to its focal length multiplied by 1.15. These conditions correspond to a beam half angle of 30 degrees.

A laser beam having a large numerical aperture can be beneficial because a laser beam with a large NA can converge to obtain a high intensity in a small focal zone while having an intensity which rapidly decreases outside the small focal zone. This high intensity can sustain the plasma. In some embodiments, it is beneficial to have the plasma be in a sphere. A laser beam with a large NA can help to maintain the plasma in a spherical shape because of the convergence and focus of the laser beam on the plasma. In addition, a laser beam with a large NA can increase the spectral radiance or brightness of the emitted light because a high intensity light is emitted from a small, spherical plasma. In some embodiments it is beneficial to have the plasma be in any other geometric shape, including but not limited to an oval. In some embodiments, an aspheric lens for laser focus is used to achieve high NA and small plasma spot size.

Figure 22:
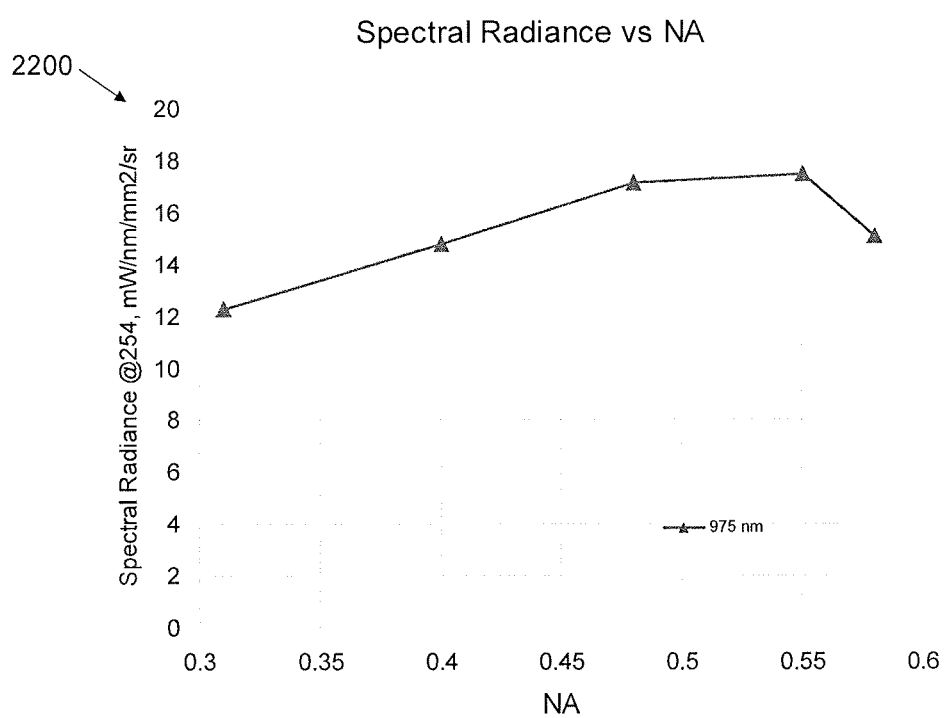
FIG. 22 is a graph of spectral radiance versus numerical aperture, according to an illustrative embodiment of the invention.

FIG. 22 is a graph 2200 showing spectral radiance on the y-axis and NA on the x-axis. As shown on FIG. 22, spectral radiance of the plasma increases with an increase in numerical aperture of the beam. For example, for a laser tuned to approximately 975 nm, as NA increases up to 0.55, the spectral radiance also increases. For example, when the NA is about 0.4, the spectral radiance is about 15 mW/nm/mm2/sr. When the NA is increased to about 0.5, the spectral radiance increases to about 17 mW/nm/mm2/sr. Therefore, when the NA was increased by about 0.1, the spectral radiance increased by about 2 mW/nm/mm2/sr. A laser beam having an NA of about 0.5 can produce a higher brightness light than a laser beam having a smaller NA.

Figure 23A:
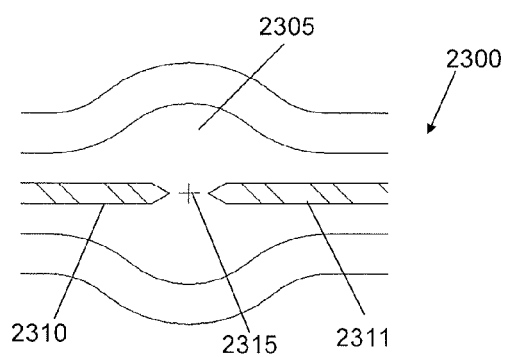
FIG. 23A is a side view of a chamber within a bulb assembly, according to an illustrative embodiment of the invention.

FIG. 23A shows a bulb 2300 having a chamber 2305 that can be used in a LDLS. To assure reliable ignition of a LDLS, a high degree of alignment can be achieved between the focus of the laser and a point 2315 within the bulb 2300 which lies on a line between the tips of the electrodes 2310, 2311 used for ignition and is approximately equidistant from the tips of the electrodes 2310, 2311. This line is important because the initial arc used for ignition of the laser plasma follows close to this line. In addition to this requirement, there can also be a need for simple replacement of a bulb at the point of use of the LDLS without complex alignment procedures. In the case of prior art aligned bulbs, the purpose of pre-alignment is to provide alignment of the light source zone with an optical system. That goal can be met in the LDLS by alignment of the laser beam, not the bulb, which assures alignment of the light emitting zone during operation and which alignment remains fixed independent of the replacement of a bulb. Therefore the purpose achieved by pre-aligning the bulb in the LDLS is primarily that of LDLS ignition, not optical alignment of the light emitting zone. In some embodiments, the lamps or bulbs can be pre-aligned. In one embodiment, the electrodes are positioned within a tolerance of about 0.01 to about 0.8 mm, and more specifically that the electrodes are within a tolerance of about 0.1 to about 0.4 mm. In some embodiments, the center of the plasma should be within about 0.001 to 0.02 mm of the center of the gap between the electrodes. With these tight tolerances, it can be beneficial to have the lamps/bulbs pre-aligned so that the end user does not have to align the lamps/bulbs upon replacement.

Figure 23B:
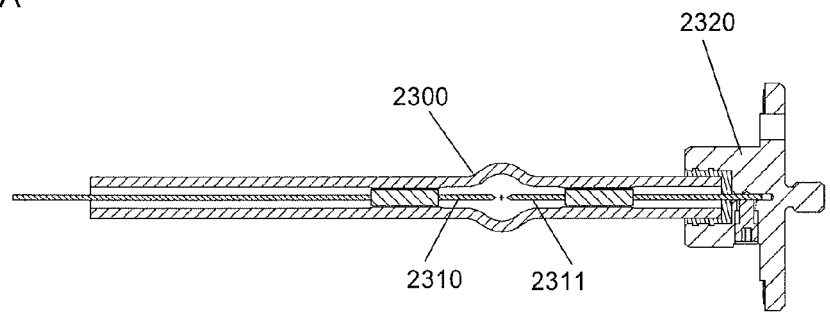
FIG. 23B is a side view of a bulb assemble with a mounting base, according to an illustrative embodiment of the invention.

A bulb for a light source can be pre-aligned so that an operator of the light source does not have to align the bulb prior to use. The bulb 2300 having two electrode 2310, 2311 can be coupled to a mounting base 2320, as shown in FIG. 23B. The bulb 2300 can be coupled to the mounting base 2320 by a dog-point set screw, a nail, a screw, or a magnet.

Figure 24:
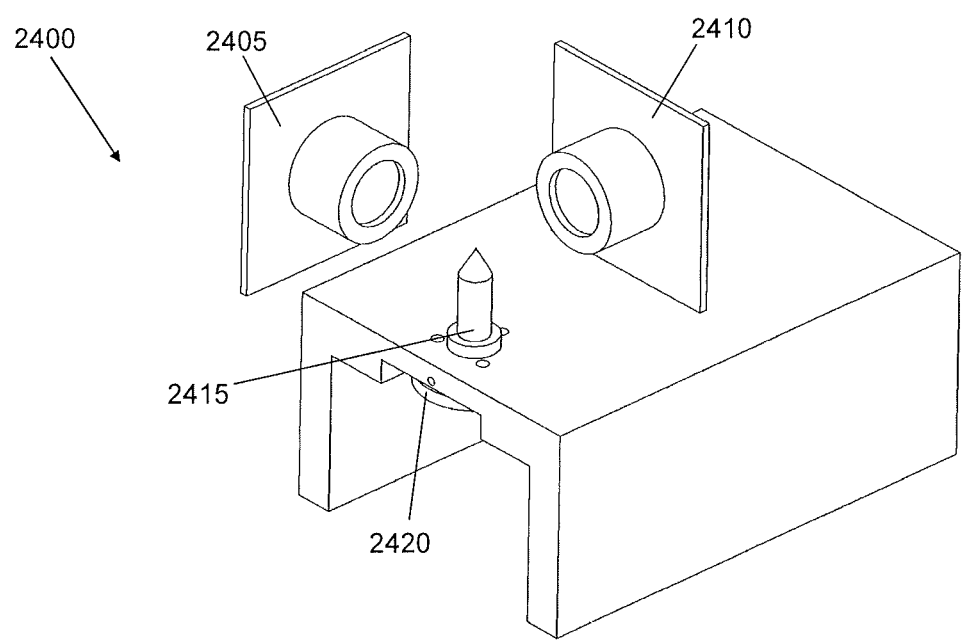
FIG. 24 is a schematic illustration of a camera assembly, according to an illustrative embodiment of the invention.

The bulb and mounting based structure can be inserted into a camera assembly, for example, camera assembly 2400 of FIG. 24. The camera assembly includes at least one camera, for example, cameras 2405, 2410 and a display screen (not shown). The camera assembly 2400 can include more than two cameras. In some embodiments, a master pin 2415 is placed in an alignment base 2420. The alignment base 2420 and master pin 2415 can be placed into the camera assembly 2400 for use as a bulb centering target. After the camera assembly 2400 is initially set up with the alignment base 2420 and master pin 2415, the bulb 2300 and mounting base 2320 of FIG. 23B can be inserted into the camera assembly 2400 in place of the alignment base 2420 and master pin 2415.

The two cameras 2405, 2410 can be arranged to look at the bulb from two orthogonal directions to allow a high accuracy (25 to 50 microns) when the bulb is positioned correctly with respect to the mounting base. The mounting base can be made of metal or any other suitable material.

Figure 25:
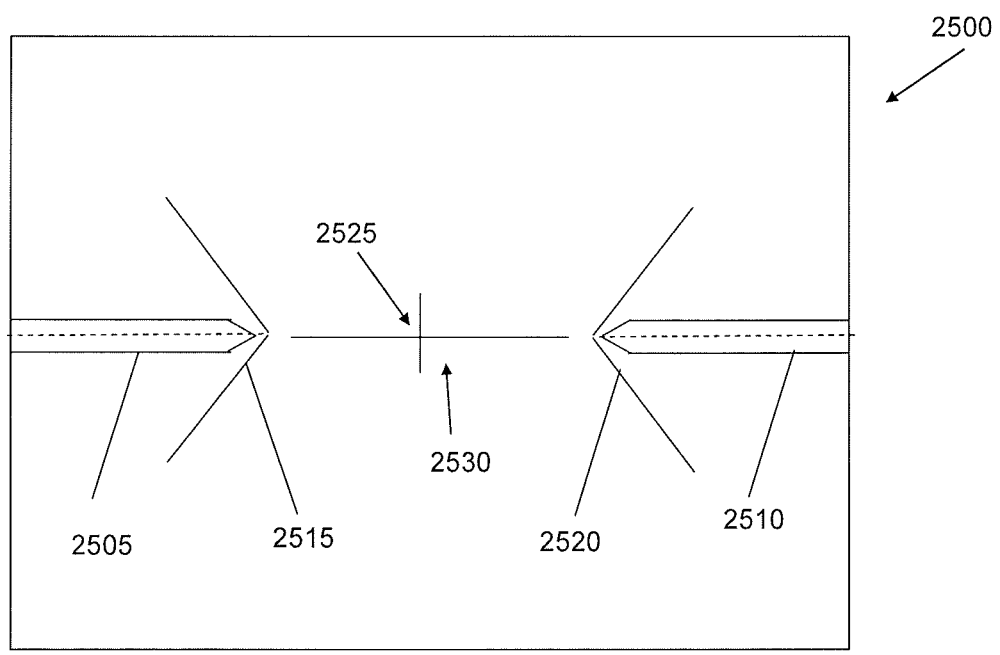
FIG. 25 is a schematic illustration of a display screen with an alignment feature, according to an illustrative embodiment of the invention.

FIG. 25 shows a display screen 2500 that can be displayed from at least one of the cameras (e.g., cameras 2405, 2410 of FIG. 24) when a bulb (e.g., bulb 2300 of FIG. 23B) is mounted in the camera assembly (e.g., camera assembly 2400 of FIG. 24). The display screen can show two electrodes 2505, 2510 that are within a bulb. The arrows 2515, 2520 can be used to help position the electrodes 2505, 2510 and thus the bulb in a mounting base. The center point 2525 can be positioned equidistant from the tips of the electrodes 2505, 2510 when the tip of the electrodes 2505, 2510 is aligned with the arrows 2515, 2520, respectively. The arrows 2515, 2520 and the center grid 2530 can comprise a positioning grid with which the electrodes are aligned. If the bulb assembly is not positioned correctly within the mounting base (and thus the electrodes do not align properly in the display screen 2500), the position of the bulb within the mounting base can be adjusted such that a region of the bulb between the two electrode (e.g., center point 2525) aligns with a positioning grid on the display screen 2500. The position of the bulb can be adjusted either vertically or horizontally within the mounting base to align the electrodes 2505, 2510 with the positioning grid. The position of the bulb can be adjusted by a manipulator that is positioned above the bulb when the bulb is in the camera assembly. The manipulator can be capable of moving the bulb vertically and horizontally. For example, the manipulator can be a robotized arm that can clamp to the bulb. The robotized arm can be moved, for example, by a computer program.

In some embodiments, the method of pre-aligning the bulb includes toggling between the two cameras (e.g., cameras 2405, 2410 of FIG. 24) to align the bulb. The display screen 2500 and a predetermined grid can change based on what camera is being displayed. In some embodiments, the images from the cameras are displayed side-by-side on the display screen. In some embodiments, the images from the two cameras are displayed in different colors, for example, one camera can display an image in red while another camera can display an image in green.

The positioning grid on the display screen can be predetermined such that when the center area 2525 of the bulb between the two electrodes 2505, 2510 aligns with the positioning grid on the display screen, the region 2525 is aligned relative to a focal point of a laser when the bulb and mounting base are inserted into a light source. When the bulb has been aligned, the bulb can be secured to the mounting base. In some embodiments, cement is cured to fix the bulb position permanently in the base. In some embodiments any other type of securing or fastening agent/material can be used to secure the bulb position permanently in the base. This pre-aligned bulb can be used by inserting the pre-aligned bulb into a light source. The user does not have to align the bulb in any way. The user can simply insert the pre-aligned bulb into a LDLS without having to make any adjustments for alignment.

The mounting base can guarantee the alignment of the bulb when the bulb is placed into the LDLS. In one embodiment the base has one or more alignment features to guarantee the alignment of the bulb when it is placed into the LDLS. In another embodiment, the base has one or more mating features, for example, apertures, grooves, channels, or protuberances, to guarantee the alignment of the bulb when it is placed into the LDLS.

A feedback loop can be installed in the LDLS to decrease the amount of noise within the LDLS. Noise can occur due to gas convection within the bulb or outside the bulb. Noise can also occur due to mode changes within the laser, and especially within laser diodes or due to mechanical vibration generated within or outside the LDLS. One solution to decrease the amount of noise is to install a feedback loop. Another solution to decrease the amount of noise is to tilt the laser to 90 degrees from a horizontal plane of the plasma. Another solution is to precisely stabilize the temperature of the laser, for example by sensing the laser temperature and using a feedback control system to maintain a constant temperature. Such a temperature stabilization system can utilize a thermoelectric cooler controlled by the feedback system. In some embodiments, the amount of noise increases as the laser is tilted closer to horizontal.

Figure 26:
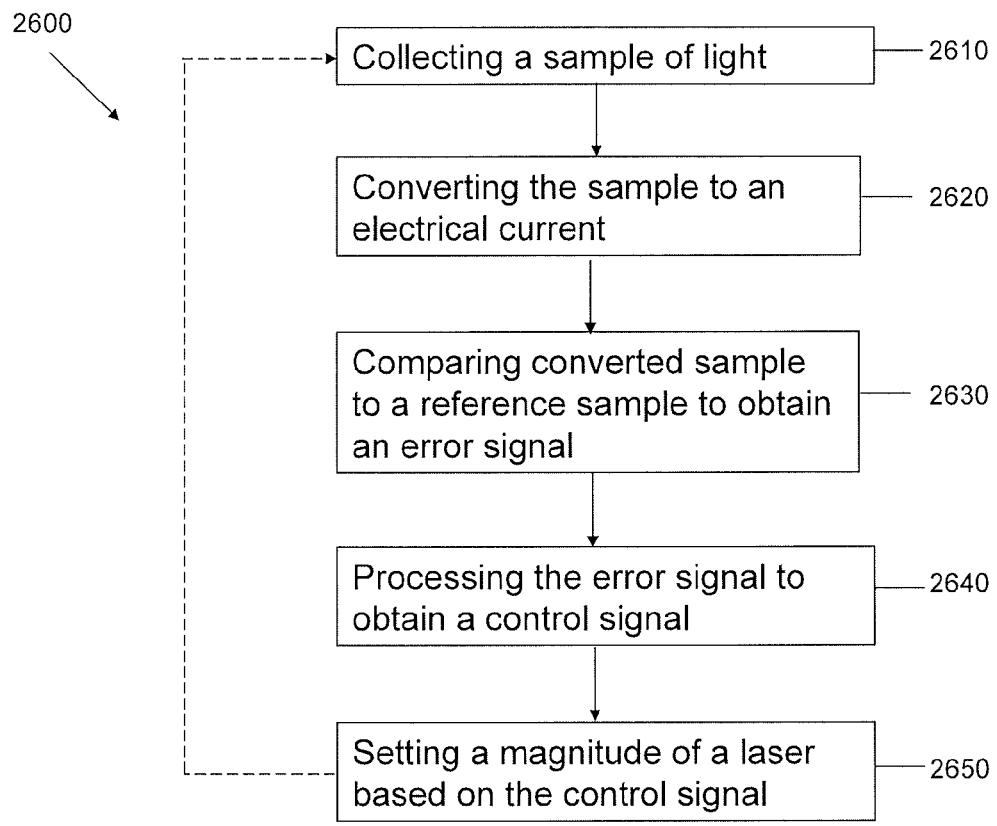
FIG. 26 is a flow chart of a method of pre-aligning a bulb for a light source, according to an illustrative embodiment of the invention.

FIG. 26 shows a flow chart 2600 for a method of decreasing noise within a light source. A sample of light that is emitted from the light source can be collected (step 2610). The sample of light that is collected from the light source can be collected from a beam splitter. The beam splitter can be a glass beam splitter or a bifurcated fiber bundle. The sample of light can be collected using a photodiode. The photodiode can be within a casing of the light source or the photodiode can be external to the casing of the light source. In some embodiments, two samples of light are collected. One sample can be collected by a first photodiode within the casing of the light source and one sample can be collected by a second photodiode external to the casing of the light source. The sample of light can be converted to an electrical signal (step 2620). The electrical signal can be compared to a reference signal to obtain an error signal (step 2630). The error signal can be the difference between the reference signal and the electrical signal. The error signal can be processed to obtain a control signal (step 2640). In some embodiments, the error signal is processed by a control amplifier. The control amplifier can be capable of outputting a control signal proportional to at least one of a time integral, a time derivative, or a magnitude of the error signal. A magnitude of a laser of the light source can be set based on the control signal to decrease noise within the light source (step 2650). Steps 2610-2650 can be repeated until a desired amount of noise is reached. Once the desired amount of noise is reached, steps 2610-2650 can continue to be repeated to maintain the amount of noise within the system. Steps 2610-2650 can be carried out by analog or digital electronics in a manner whereby the steps are not discrete, but rather form a continuous process.

Figure 27:
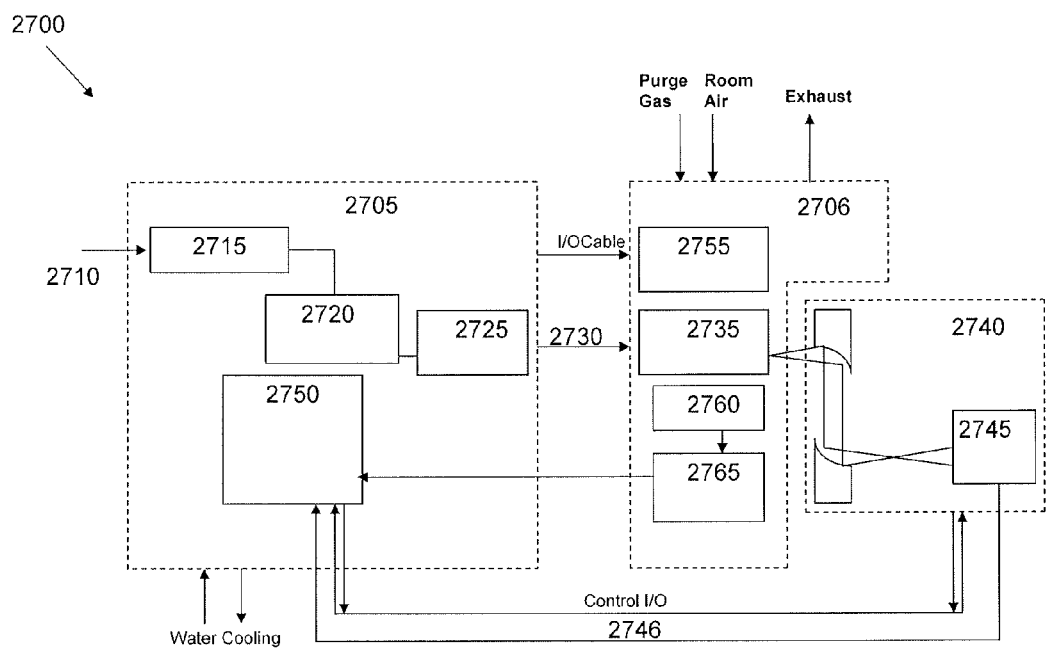
FIG. 27 is a schematic illustration of a feedback loop, according to an illustrative embodiment of the invention.

FIG. 27 shows a schematic illustration of a functional block diagram 2700 of an embodiment of a feedback loop. The circuit can consist of one or more modules 2705, 2706. In one embodiment, the circuit consists of two modules, for example, a lamp controller module 2705 and a lamp house module 2706. In one embodiment, universal AC 2710 is put into an AC to DC converter 2715. In one embodiment the AC power input is about 200 W. The AC to DC converter 2715 converts AC power to DC power. In some embodiments, the DC power is provided to a Laser Drive 2720. The laser drive 2720 can then operate the laser 2725, for example an IPG diode laser. In some embodiments, the laser 2725 is operated at about 975 nm and in other embodiments the laser is 2725 operated at about 980 nm. The laser 2725 can be coupled to a fiber 2730, for example a fiber optic cable, which transmits the laser beam to a bulb 2735. In some embodiments the bulb 2735 is a quartz bulb that is greater than 180 nm.

In some embodiments, output light from the LDLS is stabilized so that the noise over a bandwidth of greater than 1 KHz is substantially reduced and long term drift is prevented. In some embodiments, a sample of the output beam is obtained by a beam splitter, or other means, so that the sample of light is taken effectively from the same aperture and the same NA or solid angle as the output light is taken from.

As an example, a glass beam splitter can be placed in the beam. A few percent of the output power can be deflected from the beam, but it retains all the angular and spatial character of the actual output beam. Then, this sample is converted to electrical current by a detector and compared to a preset or programmable reference level. A signal representing the difference between the reference and actual detector current, e.g., an error signal, can then be processed by a control amplifier having, for example, the capability to produce an output control signal proportional to any or all of the time integral, the time derivative, and the magnitude of the error signal. The output of this control amplifier then sets the magnitude of the current flowing in the laser diode. The variation in laser output produced in this way can cancel out any fluctuation or drift in the output beam power.

In some embodiments, one or more modules are connected to a tool 2740. The tool 2740 can be any device that can utilize a LDLS, for example, a high pressure/performance liquid chromatography machine ("HPLC"). In some embodiments, the tool 2740 contains a photodiode 2745 that converts the light emitted from the LDLS into either current or voltage. In some embodiments, the photodiode 2745 sends a signal 2746 to a control board 2750 that contains a closed loop control. This signal 2746 can then be compared with a reference signal and the resulting error signal can be used to adjust the LDLS so that the light monitored by the photodiode 2745 remains at a constant value over time.

In some embodiments, water is used to cool the lamp control module 2705. In some embodiments, purge gas and/or room air are used to cool the lamp house module 2706. In some embodiments, other coolants are used to cool the lamp control module 2705 or the lamp house module 2706. In some embodiments the laser module is cooled by a thermoelectric cooler.

The lamp house module 2706 can also include an igniter module 2755 that can be used to excite a gas within a chamber of the light source. The lamp house module 2706 can include a photodiode 2760 and a photodiode conditioning circuit 2765. The photodiode 2760 can provide a current signal proportional to the intensity of the high brightness light. Photodiode conditioning circuit 2765 can provide a robust, buffered electrical signal suitable for transmitting the photodiode signal to remotely located electronic control circuits. The photodiode signal can be used to establish that the lamp is ignited and operating properly and it can be used in an internal feedback loop as described herein.

Figure 28:
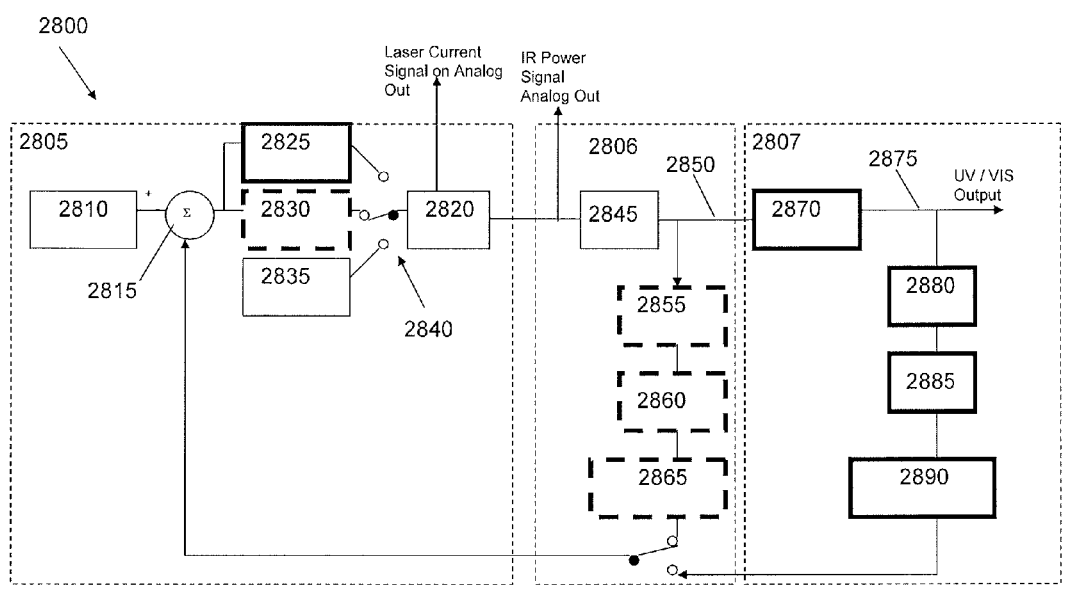
FIG. 28 is a schematic illustration of a control system block diagram of a feedback loop, according to an illustrative embodiment of the invention.

FIG. 28 shows a control system block diagram 2800 that employs two feedback loops. For example, one feedback loop can use an external photodiode (see the bolded boxes of FIG. 28) and another feedback loop can use an internal photodiode (see the bolded, dashed boxes of FIG. 28). In some embodiments, the external diode feedback loop results in a 0.3% pk-pk noise level. In some embodiments, the external photodiode feedback loop is a closed loop control ("CLC") system with feedback from a sample of the output beam, sampled with the same aperture and NA as the output beam.

The control system block diagram 2800 employing two feedback loops includes three modules, a lamp controller module 2805, a lamp house module 2806, and a fixture module 2807. Within the lamp controller module 2805 an internal reference 2810 is provided to a comparison tool 2815. The comparison tool can be a summing junction. The lamp controller module 2805 also includes a power supply 2820 to the laser that can obtain a signal from an external feedback PI controller 2825, an internal feedback PI controller 2830 or a fixed set point 2835 depending on the circuit 2840. For example, as shown in FIG. 28, the power supply 2820 is receiving a signal from the internal feedback PI controller 2830.

The power supply 2820 sends power to a bulb 2845 within the lamp house module 2806. Light 2850 is emitted from the bulb 2845. A portion of the light 2850 can be used for the internal feedback loop. The internal feedback loop within the lamp house module 2806 includes optics 2855, a detector 2860, and a pre-amplified calibration, noise and power feedback 2865. The internal feedback loop can be send a signal to the comparison tool 2815 to be compared to the internal reference 2810 to obtain an error signal.

The light 2850 emitted from the bulb 2845 can be sent to optics 2870. The light 2875 emitted from the optics 2870 can be the high brightness light that is used in a variety of applications, for example, an HPLC device. A portion of the light 2870 can be used for the external feedback loop. The internal feedback loop within the fixture module 2807 includes optics 2880, a detector 2885, and a pre-amplified calibration, noise and power feedback 2890. The external feedback loop can send a signal to the comparison tool 2815 to be compared to the internal reference 2810 or the internal feedback loop signal to obtain an error signal.

In some embodiments, the feedback system can correct the laser drive current to maintain a constant intensity of light as measured in a sample of the output beam sampled from the same spatial region of the emitting area and from the same solid angle used in the application. In some embodiments, a beam splitter is used to obtain such a sample and deliver the sample of light to a photodetector, which generates the feedback signal.

Figure 29:
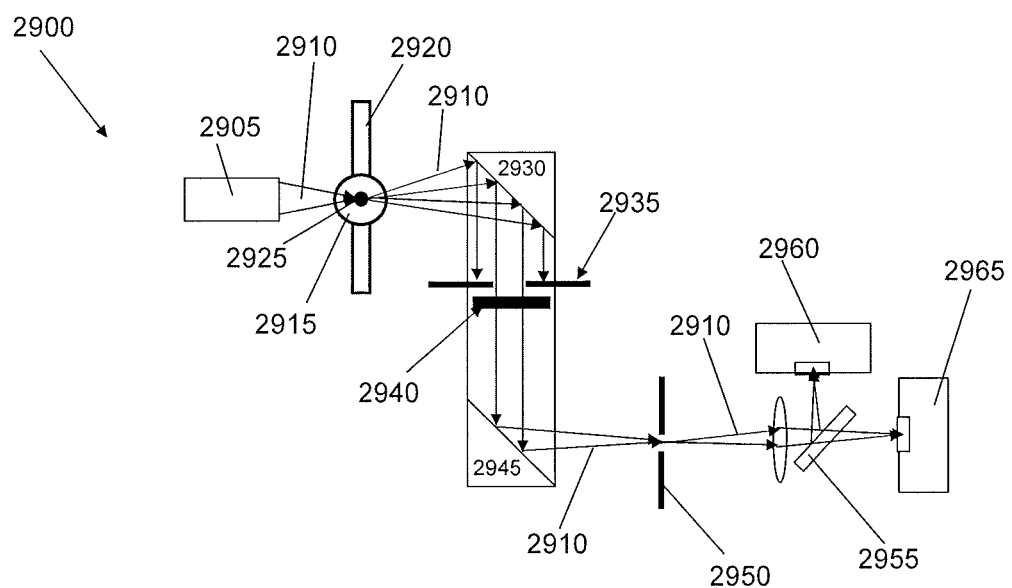
FIG. 29 is a schematic illustration of an optical setup for a laser-drive light source noise measurement system, according to an illustrative embodiment of the invention.

FIG. 29 shows an optical system 2900 of a light source with a noise measurement system and feedback loop. The optical system includes a collimator and focusing lens 2905 that focuses a beam of light 2910 from a laser (not shown) on a chamber 2915 of a bulb 2920. The light 2910 is emitted from the plasma 2925 within the chamber 2915 toward an off axis parabolic mirror ("OAP") 2930. The light continues though an iris 2935, for example a 10 mm iris, and an optical filter 2940 to a second OAP 2945. The light 2910 passes through an aperture 2950, for example a 200 µm aperture. A beam sampler 2955 can be used to deflect a portion of the light 2910 to a feedback detector photodiode 2960 to be used as a sample in the feedback loop. The remaining light 2910 continues to an output beam detector photodiode 2965. The optical system 2900 simulates an application of the light source and allows measurement of the noise level achieved in the light reaching the output beam detector photodiode 2965, which light and noise level are representative of the light entering a users optical system, such as an HPLC detector.

The use of a feedback loop or closed loop control ("CLC") can decrease the amount of noise within a light source. Table 2 shows noise measurement data with and without a CLC circuit. Averaged for many scans, the Pk-Pk/Mean in a 20 second period is 0.74% without using a CLC system, and 0.47% with a CLC system. Even for a 200 second period the noise is 0.93% without CLC, and 0.46% with a CLC.

TABLE 2

Pk-Pk/Mean noise for LDLS with or without CLC

| Pk-Pk/Mean (%) | LDLS without CLC | LDLS with CLC |
|---|---|---|
| 200 ms | 0.39 | 0.33 |
| 2 s | 0.61 | 0.44 |
| 20 s | 0.74 | 0.47 |
| 200 s | 0.93 | 0.46 |

As shown in FIG. 29 the plasma 2925 is imaged by the second OAP 2945 reflector onto a 200 μm aperture at the front end of a lens tube. A quartz lens (1" diameter, 25 mm focusing length, Edmund Optics, NT48-293) is mounted in the same lens tube and forming a 1:1 image of the aperture 2950 to a noise measurement photodiode 2965 (Thorlabs DET25K) through a beam sampler 2955 (fused silica, 0.5° Wedged, Thorlabs, BSF10-A1). The beam reflected by the beam sampler 2955 is focused to a second photodiode 2960 (Thorlabs DET25K) which is the detector for a closed-loop control system. There is no aperture in front of the photodiodes so the photodiodes were under-filled by the image of the 200 μm aperture.

In some embodiments, the LDLS noise is caused by the laser mode hopping. The output spectrum of a semiconductor laser employed for a LDLS has a discrete set of frequencies i.e., modes. Small fluctuation of the current running through the laser diode or laser temperature can cause the laser diode to switch to the different set of modes. The instantaneous switching between modes is called mode hopping. The mode hopping can cause rapid changes in the laser output spectrum and output power. As the plasma emission intensity depends on these parameters, the mode hopping also causes changes of the LDLS radiance and therefore can compromise the LDLS stability. This effect is undesirable as high stability is required for LDLS used for absorption detectors in chromatography applications.

To eliminate the negative impact of the mode hopping on the LDLS stability, the current of the semiconductor laser can be modulated at a frequency of a few tens of kHz. The amplitude of modulation is about 10-20% of the total laser current. The modulation of the current can cause intentional switching of the laser diode between different sets of modes. If this switching occurred slowly it can be observed and measured as noise by instruments having a certain bandwidth, or a predetermined frequency band. However, a rapid modulation of the laser current, at a frequency greater than the predetermined frequency band, and corresponding rapid mode hopping, can have effects which are averaged out when measured within the predetermined frequency band. As an example of an application requiring low noise, the measurement in the chromatography application is relatively slow and takes about 0.1-2.0 seconds and therefore the frequency band of interest when measuring noise in that case is primarily about 0.5 Hz to 10 Hz and secondarily about 0.1 Hz to 100 Hz to allow for digital sampling of the data. The frequency of the modulation imposed on the laser current can then be a frequency higher than about 100 Hz and preferably about 10 kHz to 100 kHz. Multiple oscillations of the laser current can occur during the period of the measurement. The contribution of different modes averaged during the period of the measurement leads to effective reduction of noise in chromatographic measurements.

Some applications, for which the LDLS can be used, for example a spectrometer, have light detectors that are sensitive in a specific wavelength range. A LDLS can output a high brightness light that is about 20 times as bright in the most sensitive wavelength range of the detector as previous light sources. This dramatic increase in spectral radiance can saturate the detector of the application, which can result in the application not being able to take advantage of light outside the detector's most sensitive wavelength range, even though the LDLS can have its greatest practical advantage outside the detector's most sensitive range, e.g., in the deep ultraviolet range. In other words, the high radiance in a less useful part of the wavelength spectrum can result in an inability to use the high radiance in the useful part of the spectrum.

One solution to this problem is to use a light source that has a chamber with a gas disposed therein, an ignition source of exciting the gas and at least one laser for providing energy to the excited gas within the chamber to produce a high brightness light. The high brightness light has a first spectrum. The light source also includes an optical element disposed within the path of the high brightness light to modify the first spectrum of the high brightness light to a second spectrum. The optical element can be, for example, a prism, a weak lens, a strong lens, or a dichroic filter. The second spectrum can have a relatively greater intensity of light in the ultraviolet range than the first spectrum. The first spectrum can have a relatively greater intensity of light in the visible range than the second spectrum. The optical element can increase the intensity of the light at certain wavelengths relative to the intensity of light at certain other wavelengths.

Figure 30:
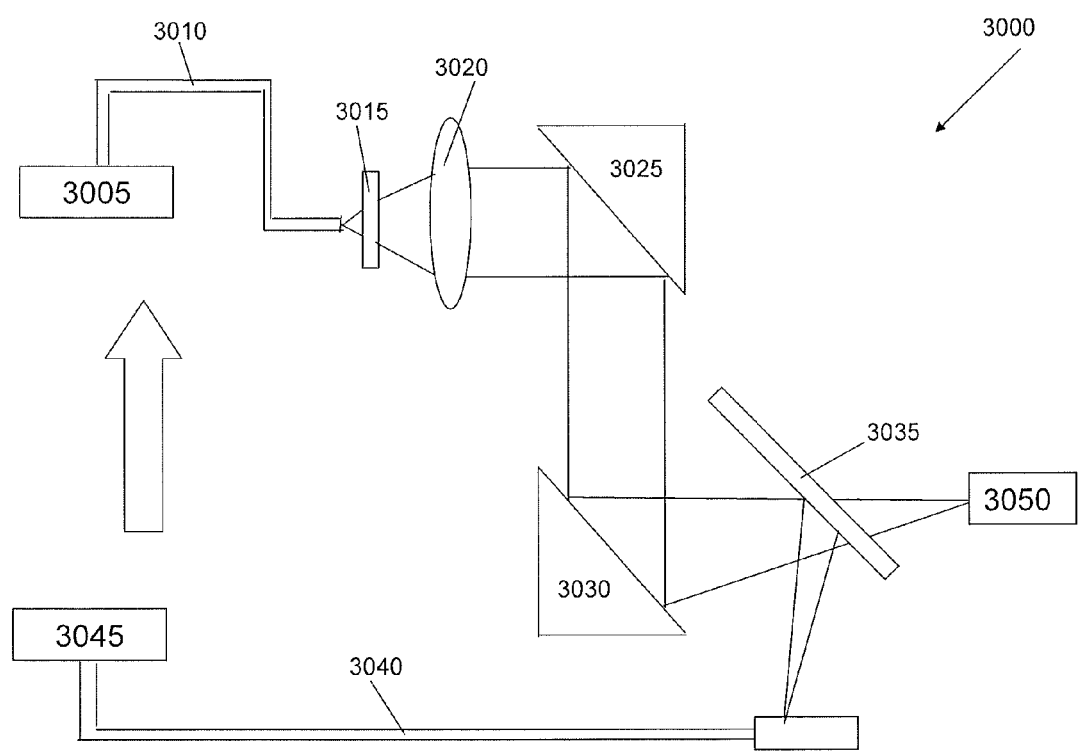
FIG. 30 is a schematic illustration of a weak lens feedback method, according to an illustrative embodiment of the invention.

FIG. 30 shows a schematic illustration of a weak lens method 3000 for modifying a spectrum of a high brightness light. High brightness light from a LDLS 3005 is sent via a delivery fiber 3010 to a filter 3015. A weak lens 3020, which can focus certain, pre-determined wavelengths because the refractive index of the lens material is dependent on wavelength modifies the spectrum of the high brightness light. The lens can be made of glass or fused quartz or other materials whose refractive index is wavelength dependent. The spectrum is modified because the chromatic aberration of the weak lens causes some wavelengths of the light to focus at the aperture of the application 3050, while other wavelengths fail to focus there and are lost from the system. The high brightness light with a modified spectrum then goes to two OAPs 3025, 3030 and then to a beam splitter 3035. The beam splitter 3035 can send a portion of the high brightness light with the modified spectrum to a feedback fiber 3040. This sample of the light can be sent to a photodiode and PID controller 3045. The PID controller 3045 can control the current to the LDLS 3005 to maintain a constant output of high brightness light. The remainder of the high brightness light can be sent to an application 3050, for example a spectrometer. The light sent to the application can have a modified spectrum from the original high brightness light emitted from the LDLS 3005 due to the light passing through the weak lens 3020.

Figure 31:
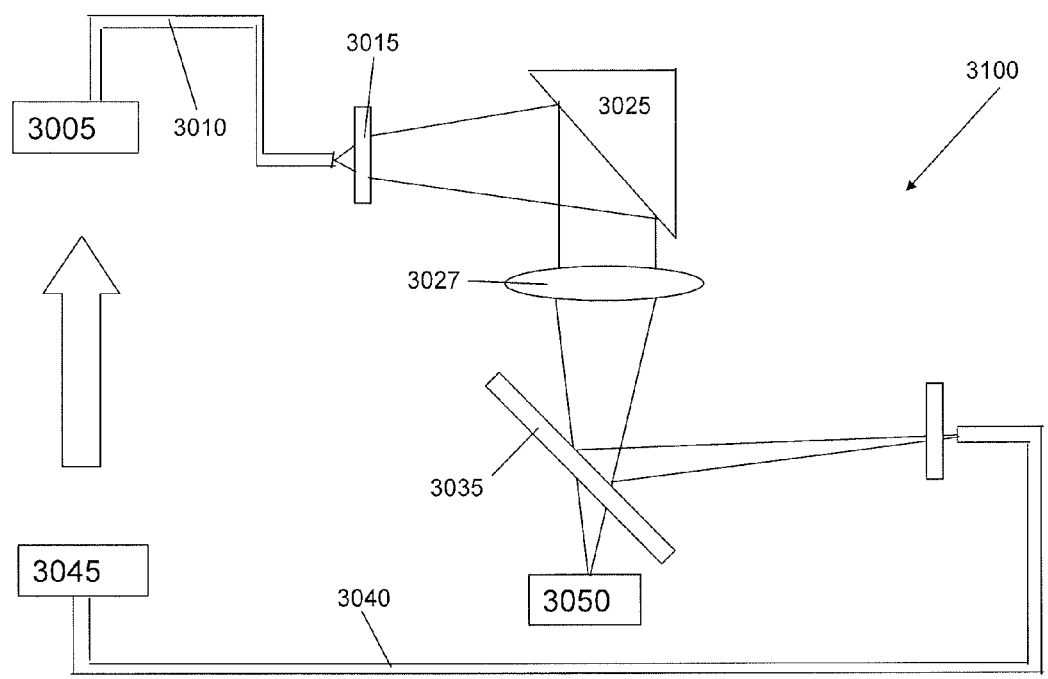
FIG. 31 is a schematic illustration of a strong lens feedback method, according to an illustrative embodiment of the invention.

FIG. 31 shows a schematic illustration of a strong lens method 3100 for modifying a spectrum of a high brightness light. Similar to the weak lens method of FIG. 30, high brightness light from a LDLS 3005 is sent via a delivery fiber 3010 to a filter 3015. The high brightness light then goes to an OAP 3025. A strong lens 3027 exhibiting chromatic aberration, as for the weak lens above, is positioned between the OAP 3025 and a beam splitter 3035. The strong lens 3027 can focus certain, pre-determined wavelengths to modify the spectrum of the high brightness light. After the high brightness light is modified, the light can be sent to an application 3050, for example a spectrometer. The light sent to the application can have a modified spectrum from the original high brightness light emitted from the LDLS 3005 due to the light passing through the strong lens 3020. The beam splitter 3035 can send a portion of the high brightness light with the modified spectrum to a feedback fiber 3040. This sample of the light can be sent to a photodiode and PID controller 3045. The PID controller 3045 can control the current to the LDLS 3005 to adjust the current to maintain a constant output of high brightness light.

Figure 32:
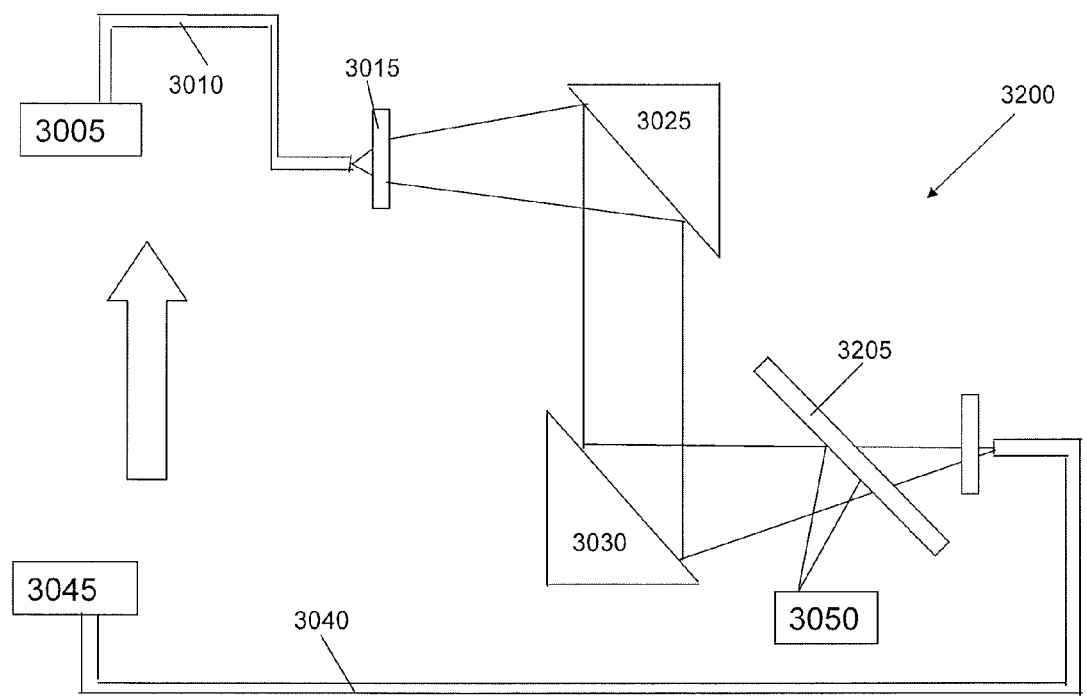
FIG. 32 is a schematic illustration of a filter feedback method, according to an illustrative embodiment of the invention.

FIG. 32 shows a schematic illustration of a filter method 3200 for modifying a spectrum of a high brightness light. High brightness light from a LDLS 3005 is sent via a delivery fiber 3010 to a filter 3015. The high brightness light then goes to two OAPs 3025, 3030. A reflective filter 3205 is positioned between OAP 3030 and application 3050. The reflective filter 3205 can filter certain, pre-determined wavelengths to modify the spectrum of the high brightness lights. The light sent to the application 3050 can have a modified spectrum from the original high brightness light emitted from the LDLS 3005 due to the light passing through the reflective filter 3205. For example, the reflective filter can use many layers of materials having differing refractive indexes and be designated so that shorter wavelengths are efficiently reflected whereas longer wavelengths are at least partially transmitted or absorbed by the filter. A transmissive filter can also be applied.

Figure 33:
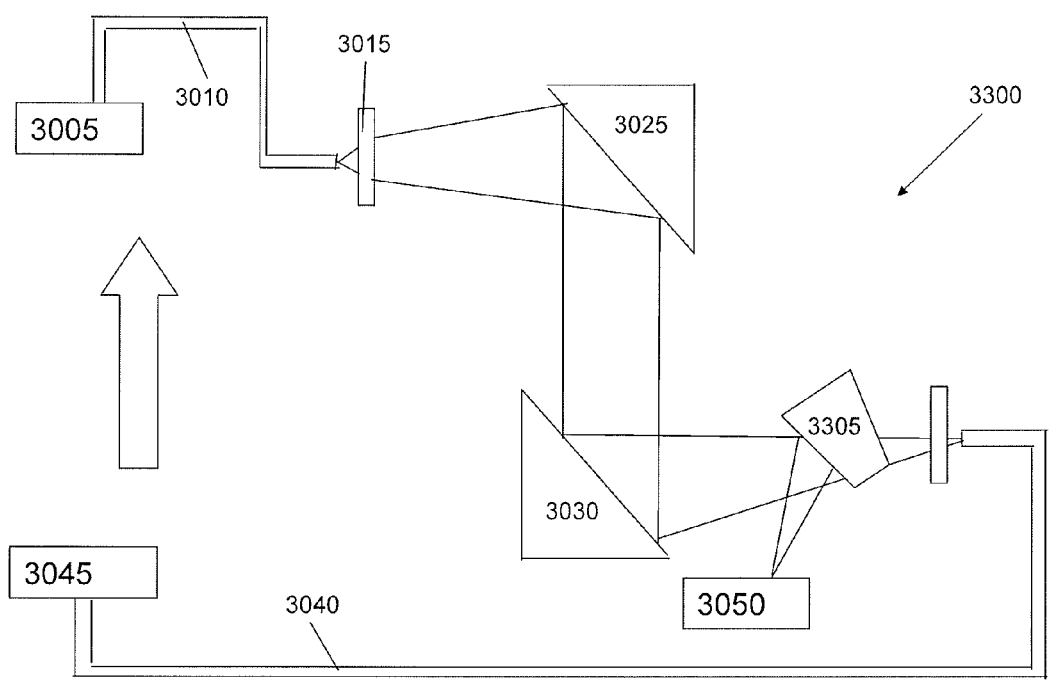
FIG. 33 is a schematic illustration of a prism feedback method, according to an illustrative embodiment of the invention.

FIG. 33 shows a schematic illustration of a prism method 3300 for modifying a spectrum of a high brightness light. High brightness light from a LDLS 3005 is sent via a delivery fiber 3010 to a filter 3015. The high brightness light then goes to two OAPs 3025, 3030. A prism 3305, for example a 20° quartz prism, is positioned between the output OAP 3030 and the application 3050. The prism disperses the light according to wavelength and produces an elongated focus spot that contains a short wavelength enhanced spectrum at one end and a long wavelength enhanced spectrum at the other end. The light sent to the application 3050 can have a modified spectrum from the original high brightness light emitted from the LDLS 3005 due to the light passing through the prison 3305. For example, if the position of the elongated focus spot is adjusted so that the aperture leading into the application 3050 receives light from one end of the elongated focus spot the spectrum of light in the application will be primarily short wavelength light and long wavelengths will be suppressed.

Figure 34:
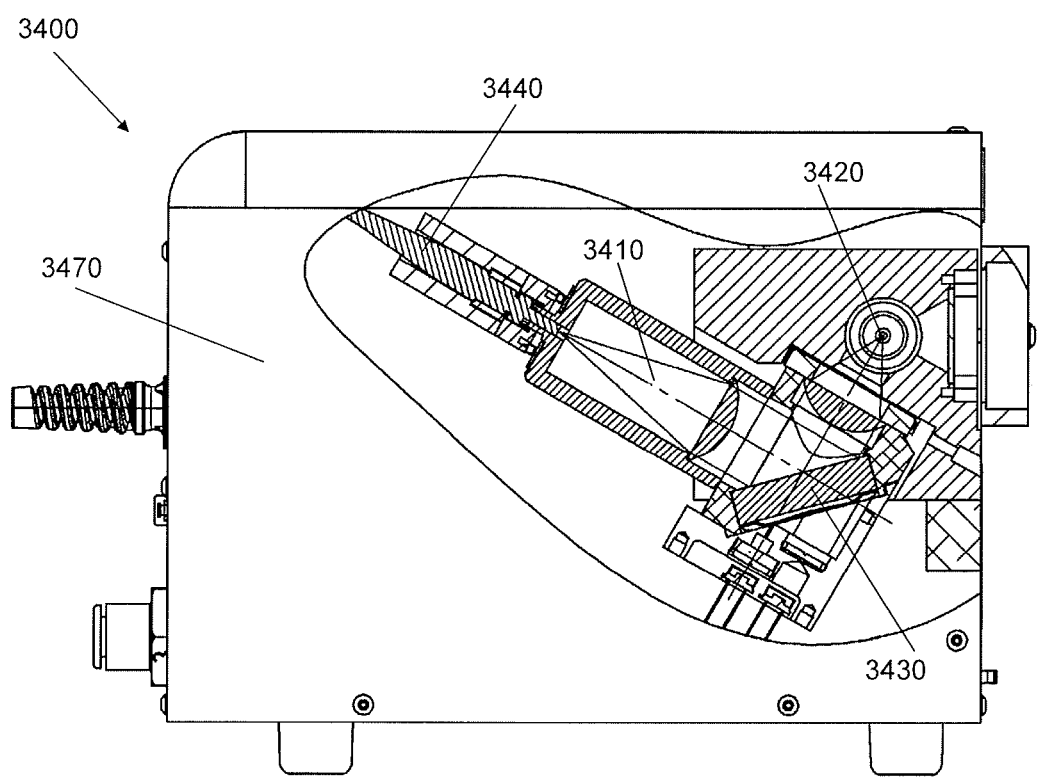
FIG. 34 is a schematic illustration of a selectively reflective mirror, according to an illustrative embodiment of the invention.

In some embodiments, it is desirable to minimize the laser power in the light source output to reduce the amount of safety procedures that are required to operate the LDLS. FIG. 34 is a schematic illustration of a laser-driven light source 3400. To minimize the laser power in the light source output, the laser beam 3410 is positioned to contact a mirror 3430. The mirror 3430 re-directs the laser beam at a 90° angle to the plasma 3420. Light output from the laser-driven light source 3400 is emitted from the system horizontally. In some embodiments, an absorbing structure or coating is placed on the inside of the enclosure 3470 where the residual laser beams (e.g., laser beams that are unabsorbed by the plasma) will strike after transiting the bulb.

In some embodiments the mirror 3430 selectively reflects the laser wavelength. The mirror 3430 can be used to deliver the laser beam 3410 to the plasma 3420 as well as reduce the back reflection of light from the plasma to the laser and/or the laser delivery fiber 3440. For example, the mirror can be a dichroic mirror positioned within the path of the laser such that the laser energy is directed toward the plasma. The dichroic mirror can selectively reflect at least one wavelength of light such that the light generated by the plasma is not substantially reflected toward the at least one laser. The dichroic mirror can comprise glass with multiple layers of dielectric optical coatings. The optical coating can reflect energy at one wavelength and transmit energy at a different wavelength. Therefore, the dichroic mirror can reflect the wavelength energy of the laser to the plasma 3420. The high brightness light that is produced by the plasma can have a different wavelength than the laser energy. The high brightness light can pass through the mirror 3430 instead of being reflected back to the laser.

In some embodiments, the mirror 3430 helps keep the fiber end and/or the connector from being damaged. In other embodiments, the mirror is used to change the direction of the laser beam 3410.

A LDLS has numerous applications. For example, a LDLS can be used to replace D2 lamps, xenon arc lamps, and mercury arc lamps. In addition, a LDLS can be used for HPLC, UV/VIS spectroscopy/spectrophotometry, and endoscopy. Furthermore, a LDLS can be used in a microscope illuminator for protein absorption at 280 nm and DNA at 260 nm. A LDLS can also be used for general illumination in a microscope and for fluorescence excitation in a fluorescence based instrument or microscope. A LDLS can also be used in a confocal microscope.

A LDLS can also be used for circular dichroism ("CD") spectroscopy. A LDLS can provide brighter light at shorter wavelengths with lower input power, as compared to high wattage xenon arc lamps currently used. In addition, a LDLS can be used in atomic absorption spectroscopy to provide a brighter light source than arc lamps currently used. In addition, a LDLS can be used spectrometers or spectrographs to provide lower noise than arc lamps currently used.

Figure 35:
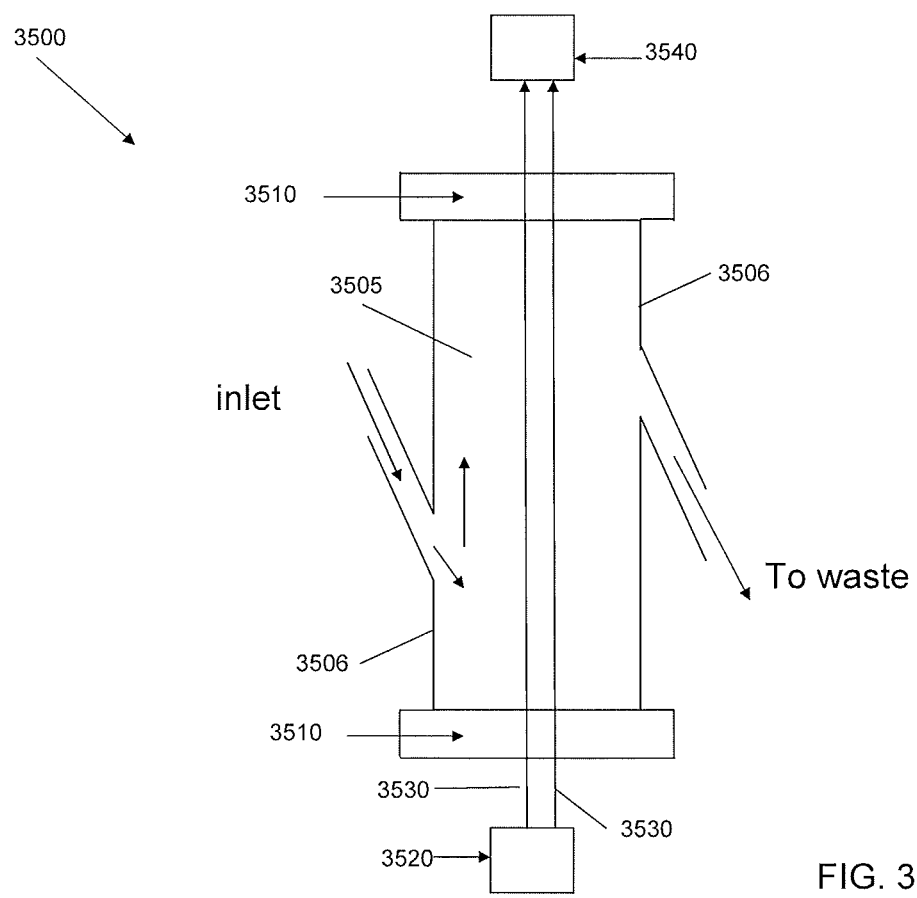
FIG. 35 is a schematic illustration of a laser-driven light source in an absorption cell, according to an illustrative embodiment of the invention.

In some embodiments, a LDLS can be used with an absorption cell. A system using a LDLS with an absorption cell has the advantage that a very small cell can be used while still maintaining a high rate of photon flux through the cell due to the very high radiance, high brightness, of the LDLS. Thus, smaller volumes of material are needed to carry out an analysis in the cell, and for a given time resolution, lower flow rates are required. FIG. 35 is a schematic illustration of an absorption cell 3500. An absorption cell has a vessel 3505 with transparent walls 3506. The vessel 3505 can hold a gas or a liquid. The absorptivity or absorption spectrum of the gas or liquid can be measured. The absorption cell 3500 can contain one or more optical windows, 3510. In some embodiments the optical windows 3510 can let in light from a light source 3520. In some embodiments the light source 3520 is a LDLS. One of the windows 3510 can be illuminated by light 3530 from the LDLS which is delivered to the window 3510 by an optical system (not shown). The optical system can include a combination of lenses, mirrors, gratings and other optical elements. The system can be a focusing mirror to focus the LDLS light into the absorption cell 3500 while avoiding the chromatic aberration which can occur if a lens is used. The light 3530 can be detected by a detector 3540. The absorption cell 3500 can be used as the sample cell 3680 in FIG. 36

Figure 36:
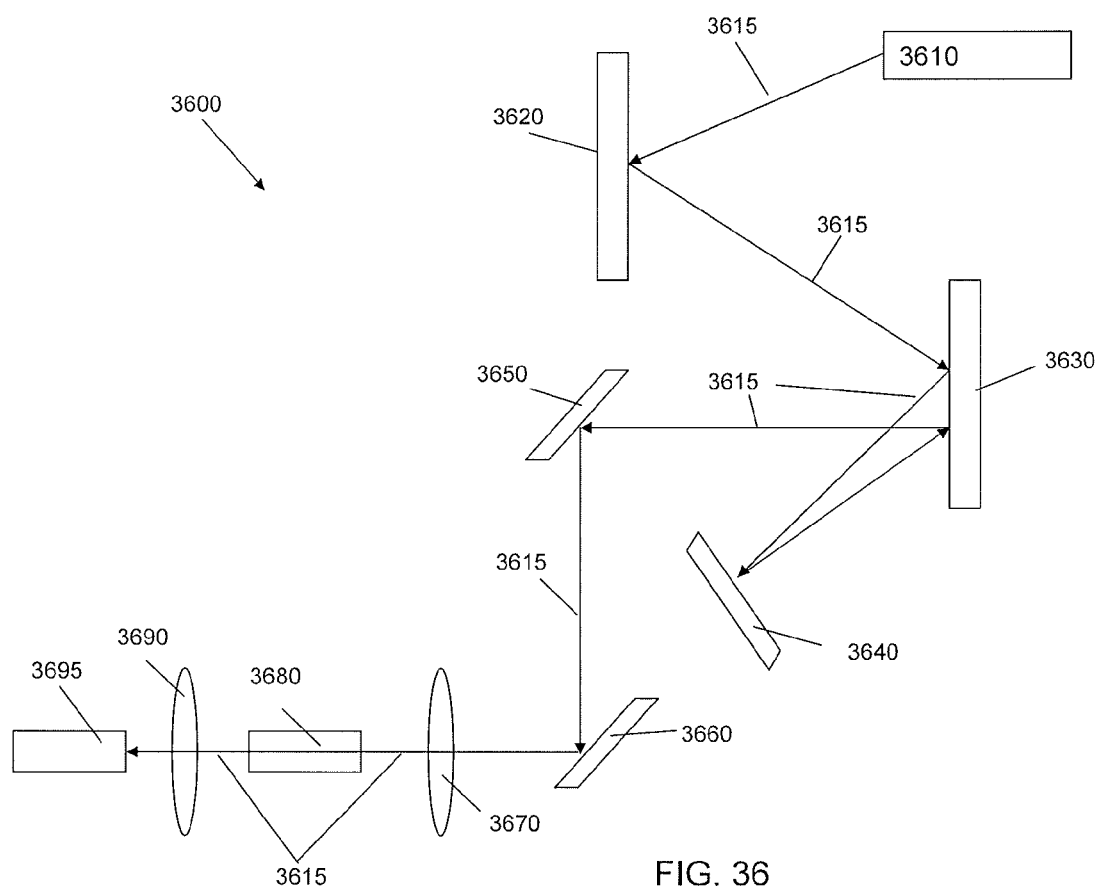
FIG. 36 is a schematic illustration of a laser-driven light source in a ultraviolet ("UV") light detector, according to an illustrative embodiment of the invention.

In some embodiments, a LDLS can be used with a UV detector. FIG. 36 is a schematic illustration of a UV detector 3600. The UV detector 3600 contains a light source 3610. In some embodiments the light source 3610 is a LDLS. Light 3615 from the light source 3610 follows the path of the arrows in FIG. 36. For example, the light 3615 emitted from the light source 3610, contacts a first curved mirror 3620 and then a second curved mirror 3630. The light 3615 then contacts a diffraction grating 3640 and returns to the second curved mirror 3630. The light 3615 then contacts a first plane mirror 3650 and then a second plane mirror 3660. The light 3615 passes through a first lens 3670. In some embodiments, the first lens 3670 is a quartz lens. The light 3615 then enters a sample cell 3680 and passes through a second lens 3690. In some embodiments, the second lens 3690 is a quartz lens. The light 3615 then enters a photo cell 3695.

Figure 37:
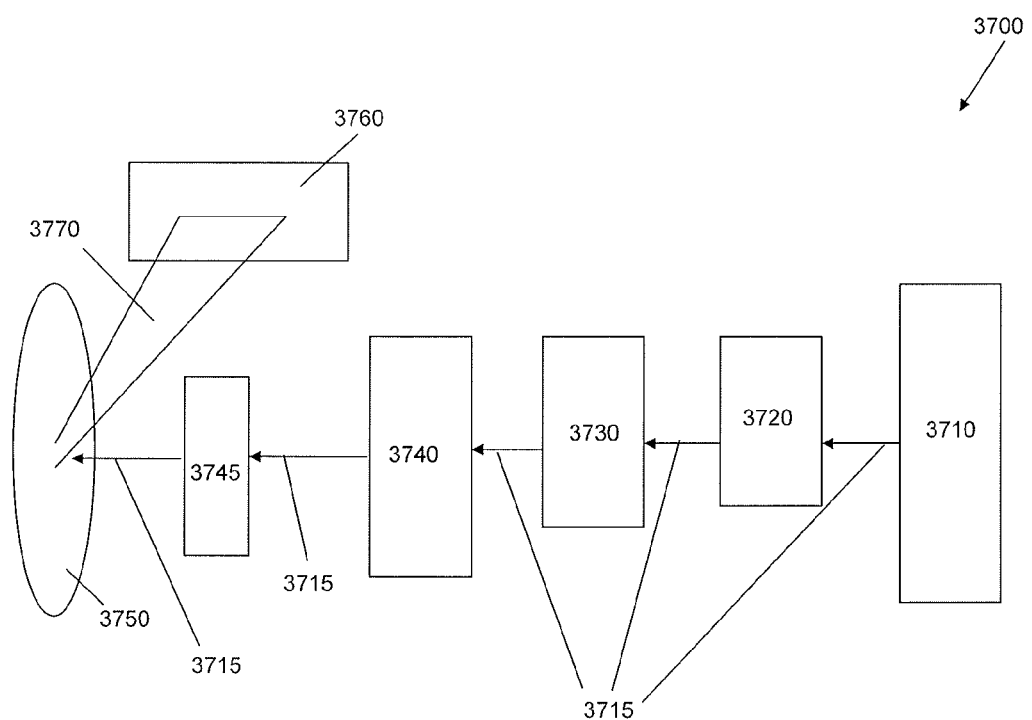
FIG. 37 is a schematic illustration of a laser-driven light source in a diode array detector, according to an illustrative embodiment of the invention.

In some embodiments, a LDLS can be used with a diode array detector. FIG. 37 is a schematic illustration of a diode array detector 3700, according to an illustrative embodiment of the invention. In some embodiments, the diode array detector contains a light source 3710. In some embodiments, the light source 3710 is a LDLS. In some embodiments the light 3715 from the light source 3710 passes through an achromatic lens system 3720 and then a shutter 3730. The light 3715 then enters a flow cell 3740 and then entrance aperture 3745. The light 3715 exits the entrance aperture 3745 and contacts a holographic grating 3750. The holographic grating 3750 directs the light 3770 into a photo diode array 3760.

Figure 38:
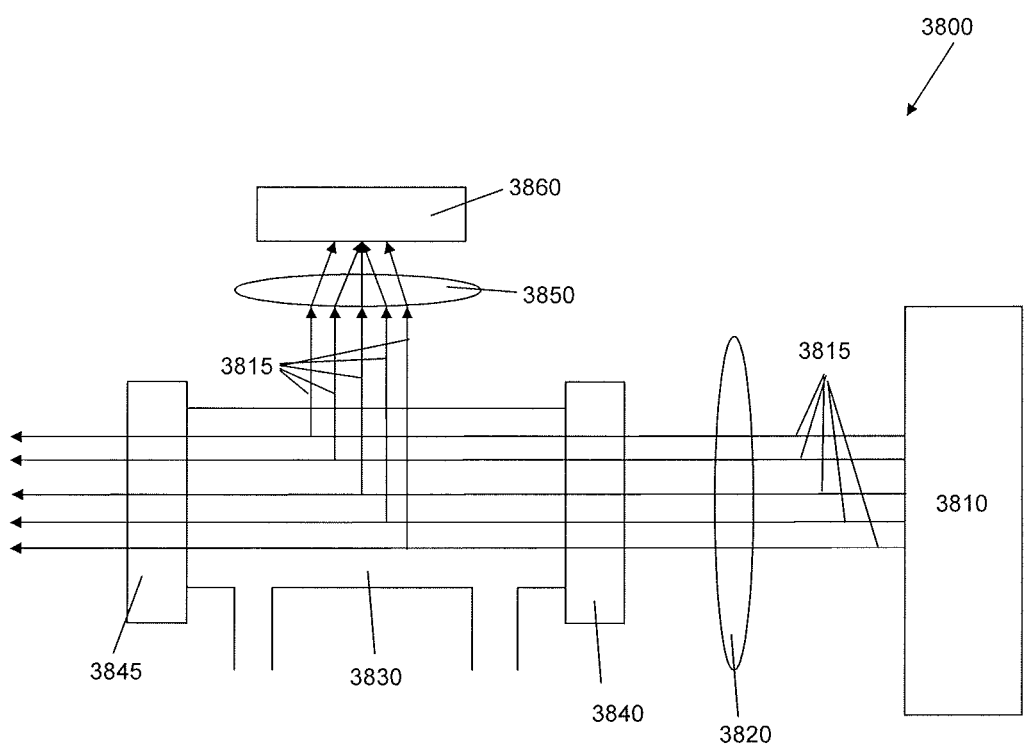
FIG. 38 is a schematic illustration of a laser-driven light source in a fluorescence detector, according to an illustrative embodiment of the invention.

In some embodiments, a LDLS can be used with a fluorescence detector. FIG. 38 is a schematic illustration of a fluorescence detector 3800, according to an illustrative embodiment of the invention. In some embodiments the fluorescence detector contains a light source 3810. In one embodiment the light source 3810 is a LDLS. The light 3815 from the light source 3810, passes through a first lens 3820. In some embodiments, the first lens 3820 is a quartz lens. The light 3815 then passes through a first window 3840 and enters chamber 3830. Some of the light 3815 exits the chamber 3830 through a second window 3845. In some embodiments the first and second windows 3840, 3845 are made of quartz. Some of the light 3815 exits through a transparent wall of the chamber 3830 and contacts a second lens 3850. The lens 3850 focuses the light 3815. The light 3815 then enters photo cell 3860.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A laser driven light source comprising:
a) a pressurized chamber comprising a region that is transparent to a portion of the electromagnetic spectrum and being configured to confine a gas during operation at a pressure greater than 10 atmospheres;
b) an ignition source for ionizing the gas within the pressurized chamber; and
c) a laser that generates substantially continuous electromagnetic radiation within a wavelength range of up to about 2000 nm and having an output that is aligned to the region that is transparent to the portion of the electromagnetic spectrum so that the electromagnetic radiation generated by the laser forms a plasma in the pressurized chamber from the gas ionized by the ignition source, the plasma generated by the electromagnetic radiation produces a plasma-generated light comprising wavelengths that are greater than 50 nm.

2. The laser driven light source of claim 1 wherein the pressurized chamber is configured to confine the gas during operation at a pressure that is greater than 30 atmospheres.

3. The laser driven light source of claim 1 wherein the pressurized chamber is configured to confine the gas during operation at a pressure that is greater than 50 atmospheres.

4. The laser driven light source of claim 1 wherein the ignition source for ionizing the gas during operation within the pressurized chamber comprises an electrode.

5. The laser driven light source of claim 1 wherein the portion of the electromagnetic spectrum where the region of the pressurized chamber is transparent comprises wavelengths greater than 50 nm so that at least a portion of the plasma-generated light exits the pressured chamber through the region.

6. The laser driven light source of claim 1 wherein the pressurized chamber comprises a window that is transparent to the plasma-generated light comprising wavelengths that are greater than 50 nm.

7. The laser driven light source of claim 1 wherein the pressurized chamber comprises a sealed pressurized chamber.

8. The laser driven light source of claim 1 further comprising a curved reflective surface disposed external to the pressurized chamber and aligned to receive at least a portion of the plasma-generated light comprising wavelengths that are greater than 50 nm, the curved reflective surface reflecting the plasma-generated light comprising wavelengths that are greater than 50 nm towards an output.

9. The laser driven light source of claim 1 wherein the pressurized chamber comprises a paraboloid-shaped or ellipsoid-shaped inner surface that is at least partially reflective.

10. The laser driven light source of claim 1 further comprising an optical element positioned between the output of the laser and the region that is transparent to the portion of the electromagnetic spectrum in the pressurized chamber, the optical element having a numerical aperture that is in a range of 0.1 to 0.8.

11. The laser driven light source of claim 1 further comprising an optical system positioned between the output of the laser and the region that is transparent to the portion of the electromagnetic spectrum in the pressurized chamber, the optical system being configured so as to maintain the plasma in the pressurized chamber that is elongated such that a length of the plasma is greater than that of a diameter of the plasma.

12. A method for producing light, the method comprising:
a) ionizing a gas within a chamber, the gas having a pressure during operation that is greater than 10 atmospheres;
b) generating substantially continuous electromagnetic radiation comprising a wavelength range of up to about 2000 nm; and
c) directing the substantially continuous electromagnetic radiation comprising the wavelength range of up to about 2000 nm to a region that is transparent to at least a portion of the electromagnetic spectrum in the pressurized chamber so that the generated electromagnetic radiation sustains a plasma in the chamber, thereby producing plasma-generated light comprising wavelengths that are greater than 50 nm.

13. The method for producing light of claim 12 further comprising producing the plasma-generated light having wavelengths that are greater than 50 nm.

14. The method for producing light of claim 12 further comprising forming a converging beam of the substantially continuous electromagnetic radiation comprising the wavelength range of up to about 2000 nm.

15. The method for producing light of claim 14 further comprising forming the converging beam of the substantially continuous electromagnetic radiation comprising the wavelength range of up to about 2000 nm with a numerical aperture that is in a range of 0.1 to 0.8.

16. The method for producing light of claim 12 wherein the gas has a pressure during operation that is greater than 30 atmospheres.

17. The method for producing light of claim 12 wherein the gas has a pressure during operation that is greater than 50 atmospheres.

18. The method for producing light of claim 12 wherein the ionizing the gas comprises ionizing the gas with an electrical discharge.

19. The method for producing light of claim 12 wherein the directing the substantially continuous electromagnetic radiation comprising the wavelength range of up to about 2000 nm to the region that is transparent to at least the portion of the electromagnetic spectrum comprises expanding and focusing the substantially continuous electromagnetic radiation comprising the wavelength range of up to about 2000 nm.

20. The method for producing light of claim 12 wherein the plasma-generated light comprising wavelengths that are greater than 50 nm emits from the region that is transparent to at least the portion of the electromagnetic spectrum.

21. The method for producing light of claim 12 further comprising reflecting the plasma-generated light comprising wavelengths that are greater than 50 nm off a curved reflective surface.

22. The method for producing light of claim 12 further comprising reflecting the plasma-generated light comprising wavelengths that are greater than 50 nm off a paraboloid-shaped or ellipsoid-shaped inner surface of the chamber that is at least partially reflective.

23. The method for producing light of claim 12 further comprising maintaining the plasma in the chamber that is elongated such that a length of the plasma is greater than that of a diameter of the plasma.

24. A laser driven light source comprising:
a) a chamber for confining a gas to a pressure that is greater than 10 atmospheres;
b) a means for ionizing the pressurized gas;
c) a means for generating substantially continuous electromagnetic radiation comprising a wavelength range from about 700 nm to about 2000 nm; and
d) a means for directing the substantially continuous electromagnetic radiation comprising the wavelength range from about 700 nm to about 2000 nm to a region that is transparent to at least a portion of the electromagnetic spectrum in the chamber so that the generated electromagnetic radiation forms a plasma in the chamber from the ionized gas, thereby producing plasma-generated light comprising wavelengths that are greater than 50 nm.

25. A light source comprising:
a) a means for confining a gas to a pressure that is greater than 10 atmospheres during operation;
b) a means for ionizing the pressurized gas; and
c) a means for providing at least substantially continuous electromagnetic energy having wavelengths up to about 2000 nm to the ionized gas to produce plasma-generated light having wavelengths that are greater than 50 nm.

* * * * *